United States Patent
Yuasa et al.

(10) Patent No.: US 8,315,020 B2
(45) Date of Patent: Nov. 20, 2012

(54) METHOD FOR MANUFACTURING A MAGNETO-RESISTANCE EFFECT ELEMENT AND MAGNETIC RECORDING AND REPRODUCING APPARATUS

(75) Inventors: Hiromi Yuasa, Kanagawa-ken (JP); Hideaki Fukuzawa, Kanagawa-ken (JP); Yoshihiko Fuji, Kanagawa-ken (JP); Shuichi Murakami, Tokyo (JP); Michiko Hara, Kanagawa-ken (JP); Kunliang Zhang, Fremont, CA (US); Min Li, Dublin, CA (US); Erhard Schreck, San Jose, CA (US)

(73) Assignees: Kabushiki Kaisha Toshiba, Tokyo (JP); TDK Corporation, Tokyo (JP)

(*) Notice: Subject to any disclaimer, the term of this patent is extended or adjusted under 35 U.S.C. 154(b) by 610 days.

(21) Appl. No.: 12/585,855

(22) Filed: Sep. 25, 2009

(65) Prior Publication Data
US 2010/0092803 A1    Apr. 15, 2010

(30) Foreign Application Priority Data
Sep. 26, 2008   (JP) .................. 2008-249226

(51) Int. Cl.
   *G11B 5/39*   (2006.01)
(52) U.S. Cl. ...................................... 360/324
(58) Field of Classification Search .......... 360/324, 360/244.1, 264.2, 244.3, 245.9, 245.8, 266.3, 360/246.6; 29/603.03, 603.01, 603.04
See application file for complete search history.

(56) References Cited

U.S. PATENT DOCUMENTS
3,775,328 A   11/1973   Denes
(Continued)

FOREIGN PATENT DOCUMENTS
CN   1431651   7/2003
(Continued)

OTHER PUBLICATIONS
S. Sanvito, et al. "Breakdown of the Resistor Model of CPP-GMR in Magnetic Multilayered Nanostructures", Physical Review B, vol. 61, No. 20, May 15, 2000, pp. 14225-14228. (Abstract).
(Continued)

*Primary Examiner* — Allen Cao
(74) *Attorney, Agent, or Firm* — Nixon & Vanderhye, P.C.

(57) ABSTRACT

A method for manufacturing a magneto-resistance effect element is provided. The magneto-resistance effect element includes a first magnetic layer including a ferromagnetic material, a second magnetic layer including a ferromagnetic material and a spacer layer provided between the first magnetic layer and the second magnetic layer, the spacer layer having an insulating layer and a conductive portion penetrating through the insulating layer. The method includes: forming a film to be a base material of the spacer layer; performing a first treatment using a gas including at least one of oxygen molecules, oxygen atoms, oxygen ions, oxygen plasma and oxygen radicals on the film; and performing a second treatment using a gas including at least one of hydrogen molecules, hydrogen atoms, hydrogen ions, hydrogen plasma, hydrogen radicals, deuterium molecules, deuterium atoms, deuterium ions, deuterium plasma and deuterium radicals on the film submitted to the first treatment.

20 Claims, 21 Drawing Sheets

U.S. PATENT DOCUMENTS

| | | | |
|---|---|---|---|
| 4,650,708 A | 3/1987 | Takahashi |
| 5,116,782 A | 5/1992 | Yamaguchi et al. |
| 5,139,376 A | 8/1992 | Pumphrey |
| 5,206,590 A | 4/1993 | Dieny et al. |
| 5,257,531 A | 11/1993 | Motosugi |
| 5,287,238 A | 2/1994 | Baumgart et al. |
| 5,304,975 A | 4/1994 | Saito et al. |
| 5,313,186 A | 5/1994 | Schuhl et al. |
| 5,448,515 A | 9/1995 | Fukami et al. |
| 5,459,687 A | 10/1995 | Sakakima et al. |
| 5,549,978 A | 8/1996 | Iwasaki et al. |
| 5,576,915 A | 11/1996 | Akiyama et al. |
| 5,599,742 A | 2/1997 | Kadomura |
| 5,653,841 A | 8/1997 | Krishnamurthy |
| 5,668,688 A | 9/1997 | Dykes et al. |
| 5,715,121 A | 2/1998 | Sakakima et al. |
| 5,768,181 A | 6/1998 | Zhu et al. |
| 5,768,183 A | 6/1998 | Zhu et al. |
| 5,777,542 A | 7/1998 | Ohsawa et al. |
| 5,885,750 A | 3/1999 | Hsiao |
| 5,900,324 A | 5/1999 | Moroishi et al. |
| 5,923,504 A | 7/1999 | Araki et al. |
| 5,936,402 A | 8/1999 | Schep et al. |
| 5,949,622 A | 9/1999 | Kamiguchi et al. |
| 5,962,080 A | 10/1999 | Tan et al. |
| 6,002,553 A | 12/1999 | Stearns et al. |
| 6,013,365 A | 1/2000 | Dieny et al. |
| 6,016,241 A | 1/2000 | Coffey et al. |
| 6,025,979 A | 2/2000 | Yamane et al. |
| 6,033,584 A | 3/2000 | Ngo et al. |
| 6,074,743 A | 6/2000 | Araki et al. |
| 6,088,195 A | 7/2000 | Kamiguchi et al. |
| 6,090,498 A | 7/2000 | Omata et al. |
| 6,096,434 A | 8/2000 | Yano et al. |
| 6,111,729 A | 8/2000 | Kamiguchi et al. |
| 6,114,056 A | 9/2000 | Inomata et al. |
| 6,117,569 A | 9/2000 | Lin et al. |
| 6,127,045 A | 10/2000 | Gill |
| 6,132,892 A | 10/2000 | Yoshikawa et al. |
| 6,159,593 A | 12/2000 | Iwasaki et al. |
| 6,205,008 B1 | 3/2001 | Gijs et al. |
| 6,219,275 B1 | 4/2001 | Nishimura |
| 6,221,518 B1 | 4/2001 | Araki et al. |
| 6,258,470 B1 | 7/2001 | Sakakima et al. |
| 6,275,363 B1 | 8/2001 | Gill |
| 6,303,218 B1 | 10/2001 | Kamiguchi et al. |
| 6,313,973 B1 | 11/2001 | Fuke et al. |
| 6,330,137 B1 | 12/2001 | Knapp et al. |
| 6,340,533 B1 | 1/2002 | Ueno et al. |
| 6,341,052 B2 | 1/2002 | Hayashi |
| 6,348,274 B1 | 2/2002 | Kamiguchi et al. |
| 6,353,318 B1 | 3/2002 | Sin et al. |
| 6,368,706 B1 | 4/2002 | Iwasaki et al. |
| 6,400,537 B2 | 6/2002 | Sakakima et al. |
| 6,452,763 B1 | 9/2002 | Gill |
| 6,469,926 B1 | 10/2002 | Chen |
| 6,473,275 B1 | 10/2002 | Gill |
| 6,495,275 B2 | 12/2002 | Kamiguchi et al. |
| 6,517,896 B1 | 2/2003 | Horng et al. |
| 6,519,123 B1 | 2/2003 | Sugawara et al. |
| 6,522,507 B1 | 2/2003 | Horng et al. |
| 6,538,921 B2 | 3/2003 | Daughton et al. |
| 6,556,390 B1 | 4/2003 | Mao et al. |
| 6,560,077 B2 | 5/2003 | Fujiwara et al. |
| 6,567,246 B1 | 5/2003 | Sakakima et al. |
| 6,603,642 B1 | 8/2003 | Arki et al. |
| 6,636,391 B2 | 10/2003 | Watanabe et al. |
| 6,674,615 B2 | 1/2004 | Hayashi |
| 6,686,068 B2 | 2/2004 | Carey et al. |
| 6,690,163 B1 | 2/2004 | Hoshiya et al. |
| 6,707,649 B2 | 3/2004 | Hasegawa et al. |
| 6,710,984 B1 | 3/2004 | Yuasa et al. |
| 6,720,036 B2 | 4/2004 | Tsunekawa et al. |
| 6,759,120 B2 | 7/2004 | Jangill et al. |
| 6,767,655 B2 | 7/2004 | Hiramoto et al. |
| 6,770,382 B1 | 8/2004 | Chang et al. |
| 6,828,039 B2 | 12/2004 | Sugawara |
| 6,853,520 B2 | 2/2005 | Fukuzawa et al. |
| 6,882,509 B2 | 4/2005 | Chang et al. |
| 6,903,907 B2 | 6/2005 | Hasegawa |
| 6,905,780 B2 | 6/2005 | Yuasa et al. |
| 6,929,957 B2 | 8/2005 | Min et al. |
| 6,937,446 B2 | 8/2005 | Kamiguchi et al. |
| 6,937,447 B2 | 8/2005 | Okuno et al. |
| 7,002,781 B2 | 2/2006 | Sugawara |
| 7,008,702 B2 | 3/2006 | Fukuzawa et al. |
| 7,038,893 B2 | 5/2006 | Koui et al. |
| 7,046,489 B2 | 5/2006 | Kamiguchi et al. |
| 7,072,153 B2 | 7/2006 | Koui et al. |
| 7,116,529 B2 | 10/2006 | Yoshikawa et al. |
| 7,163,755 B2 | 1/2007 | Hiramoto et al. |
| 7,177,121 B2 | 2/2007 | Kojima et al. |
| 7,196,877 B2 | 3/2007 | Yoshikawa et al. |
| 7,218,484 B2 | 5/2007 | Hashimoto et al. |
| 7,223,485 B2 | 5/2007 | Yuasa et al. |
| 7,240,419 B2 | 7/2007 | Okuno et al. |
| 7,265,950 B2 | 9/2007 | Okuno et al. |
| 7,280,323 B2 | 10/2007 | Sato et al. |
| 7,301,733 B1 | 11/2007 | Fukuzawa et al. |
| 7,304,825 B2 | 12/2007 | Funayama et al. |
| 7,331,100 B2 | 2/2008 | Li et al. |
| 7,355,883 B2 | 4/2008 | Okuno et al. |
| 7,372,672 B2 | 5/2008 | Nishiyama |
| 7,379,278 B2 | 5/2008 | Koui et al. |
| 7,390,529 B2 | 6/2008 | Li et al. |
| 7,405,906 B2 | 7/2008 | Funayama et al. |
| 7,453,672 B2 | 11/2008 | Dieny et al. |
| 7,476,414 B2 | 1/2009 | Fukuzawa et al. |
| 7,495,870 B2 | 2/2009 | Yuasa et al. |
| 7,514,117 B2 | 4/2009 | Fukuzawa et al. |
| 7,522,390 B2 | 4/2009 | Yuasa et al. |
| 7,525,776 B2 | 4/2009 | Fukuzawa et al. |
| 7,583,480 B2 | 9/2009 | Sbiaa et al. |
| 7,602,592 B2 | 10/2009 | Fukuzawa et al. |
| 7,610,674 B2 | 11/2009 | Zhang et al. |
| 7,776,387 B2 | 8/2010 | Fuji et al. |
| 7,782,575 B2 | 8/2010 | Tsuchiya et al. |
| 7,785,662 B2 | 8/2010 | Fuji et al. |
| 7,791,843 B2 | 9/2010 | Kamiguchi et al. |
| 7,808,747 B2 | 10/2010 | Fuji et al. |
| 7,810,228 B2 | 10/2010 | Yuasa et al. |
| 7,821,748 B2 | 10/2010 | Fukuzawa et al. |
| 7,842,334 B2 | 11/2010 | Wakui et al. |
| 7,897,201 B2 | 3/2011 | Yuasa et al. |
| 7,978,442 B2 | 7/2011 | Zhang et al. |
| 8,031,443 B2 | 10/2011 | Fuke et al. |
| 8,048,492 B2 | 11/2011 | Fukuzawa et al. |
| 8,049,999 B2 | 11/2011 | Fukuzawa et al. |
| 8,111,489 B2 | 2/2012 | Fuji et al. |
| 8,153,188 B2 | 4/2012 | Fukuzawa et al. |
| 2001/0005300 A1 | 6/2001 | Hayashi |
| 2001/0009063 A1 | 7/2001 | Saito et al. |
| 2001/0014000 A1 | 8/2001 | Tanaka et al. |
| 2001/0040781 A1 | 11/2001 | Tanaka et al. |
| 2002/0048127 A1 | 4/2002 | Fukuzawa et al. |
| 2002/0048128 A1 | 4/2002 | Kamiguchi et al. |
| 2002/0051380 A1 | 5/2002 | Kamiguchi et al. |
| 2002/0054461 A1 | 5/2002 | Fujiwara et al. |
| 2002/0058158 A1 | 5/2002 | Odagawa et al. |
| 2002/0073785 A1 | 6/2002 | Prakash et al. |
| 2002/0097536 A1 | 7/2002 | Komuro et al. |
| 2002/0114974 A1 | 8/2002 | Carey et al. |
| 2002/0126428 A1 | 9/2002 | Gill |
| 2002/0135935 A1 | 9/2002 | Covington |
| 2002/0145835 A1 | 10/2002 | Suzuki et al. |
| 2002/0150791 A1 | 10/2002 | Yuasa et al. |
| 2002/0159201 A1 | 10/2002 | Li et al. |
| 2002/0191355 A1 | 12/2002 | Hiramoto et al. |
| 2003/0011463 A1 | 1/2003 | Iwasaki et al. |
| 2003/0026049 A1 | 2/2003 | Gill |
| 2003/0035256 A1 | 2/2003 | Hayashi et al. |
| 2003/0049389 A1 | 3/2003 | Tsunekawa et al. |
| 2003/0053269 A1 | 3/2003 | Nishiyama |
| 2003/0053270 A1 | 3/2003 | Gill |
| 2003/0099868 A1 | 5/2003 | Tanahashi et al. |
| 2003/0104249 A1 | 6/2003 | Okuno et al. |
| 2003/0123200 A1 | 7/2003 | Nagasaka et al. |

| | | | | | | |
|---|---|---|---|---|---|---|
| 2003/0128481 A1 | 7/2003 | Seyama et al. | EP | 1 328 027 | 7/2003 | |
| 2003/0156360 A1 | 8/2003 | Kawawake et al. | EP | 1 400 957 | 3/2004 | |
| 2004/0017639 A1* | 1/2004 | Deak ............................ 360/290 | EP | 1 548 762 | 6/2005 | |
| 2004/0021990 A1 | 2/2004 | Koui et al. | EP | 1 607 941 | 12/2005 | |
| 2004/0042127 A1 | 3/2004 | Hoshiya et al. | EP | 1 626 393 | 2/2006 | |
| 2004/0121185 A1 | 6/2004 | Fukuzawa et al. | GB | 2 390 168 | 12/2003 | |
| 2004/0137645 A1 | 7/2004 | Hu et al. | JP | 60-098518 | 6/1985 | |
| 2004/0150922 A1 | 8/2004 | Kagami et al. | JP | 02-173278 | 7/1990 | |
| 2004/0169963 A1 | 9/2004 | Okuno et al. | JP | 05-160123 | 6/1993 | |
| 2004/0201929 A1 | 10/2004 | Hashimoto et al. | JP | 07-022399 | 1/1995 | |
| 2004/0206619 A1 | 10/2004 | Pinarbasi | JP | 08-049063 | 2/1996 | |
| 2004/0246631 A1 | 12/2004 | Dieny et al. | JP | 09-116212 | 5/1997 | |
| 2005/0042478 A1 | 2/2005 | Okuno et al. | JP | 09-306733 | 11/1997 | |
| 2005/0063104 A1 | 3/2005 | Takagishi et al. | JP | 10-173252 | 6/1998 | |
| 2005/0068855 A1 | 3/2005 | Morikawa et al. | JP | 10-324969 | 12/1998 | |
| 2005/0073778 A1 | 4/2005 | Hasegawa et al. | JP | 11-121832 | 4/1999 | |
| 2005/0094317 A1 | 5/2005 | Funayama | JP | 11-154609 | 6/1999 | |
| 2005/0094322 A1 | 5/2005 | Fukuzawa et al. | JP | 11-238923 | 8/1999 | |
| 2005/0094327 A1 | 5/2005 | Okuno et al. | JP | 11-510911 | 9/1999 | |
| 2005/0141148 A1 | 6/2005 | Aikawa et al. | JP | 11-293481 | 10/1999 | |
| 2005/0168887 A1 | 8/2005 | Yuasa et al. | JP | 11-296820 | 10/1999 | |
| 2005/0276998 A1 | 12/2005 | Sato | JP | 2000-137906 | 5/2000 | |
| 2006/0002184 A1 | 1/2006 | Hong et al. | JP | 2000-156530 | 6/2000 | |
| 2006/0018057 A1 | 1/2006 | Huai | JP | 2000-188435 | 7/2000 | |
| 2006/0034022 A1 | 2/2006 | Fukuzawa et al. | JP | 2000-215414 | 8/2000 | |
| 2006/0050444 A1 | 3/2006 | Fukuzawa et al. | JP | 2000-228004 | 8/2000 | |
| 2006/0077596 A1 | 4/2006 | Yuasa et al. | JP | 2000-293982 | 10/2000 | |
| 2006/0098353 A1 | 5/2006 | Fukuzawa et al. | JP | 2001-094173 | 4/2001 | |
| 2006/0114620 A1 | 6/2006 | Sbiaa et al. | JP | 2001-143227 | 5/2001 | |
| 2006/0164764 A1 | 7/2006 | Kamiguchi et al. | JP | 2001-176027 | 6/2001 | |
| 2006/0188750 A1 | 8/2006 | Ide et al. | JP | 2001-229511 | 8/2001 | |
| 2007/0070556 A1 | 3/2007 | Zhang et al. | JP | 2001-237471 | 8/2001 | |
| 2007/0081276 A1 | 4/2007 | Fukuzawa et al. | JP | 2001-358380 | 12/2001 | |
| 2007/0091511 A1 | 4/2007 | Hoshiya et al. | JP | 2002-076473 | 3/2002 | |
| 2007/0092639 A1 | 4/2007 | Fuji et al. | JP | 2002-124721 | 4/2002 | |
| 2007/0159733 A1 | 7/2007 | Hashimoto et al. | JP | 2002-150512 | 5/2002 | |
| 2007/0172690 A1 | 7/2007 | Kim et al. | JP | 2002-204010 | 7/2002 | |
| 2007/0188936 A1 | 8/2007 | Zhang et al. | JP | 2002-208744 | 7/2002 | |
| 2007/0188937 A1 | 8/2007 | Carey et al. | JP | 2003-086866 | 3/2003 | |
| 2007/0202249 A1 | 8/2007 | Yuasa et al. | JP | 2003-110168 | 4/2003 | |
| 2007/0223150 A1 | 9/2007 | Fukuzawa et al. | JP | 2003-152243 | 5/2003 | |
| 2007/0253122 A1 | 11/2007 | Fukuzawa et al. | JP | 2003-204095 | 7/2003 | |
| 2007/0259213 A1 | 11/2007 | Hashimoto et al. | JP | 2004-006589 | 1/2004 | |
| 2008/0005891 A1 | 1/2008 | Yuasa et al. | JP | 2004-153216 | 5/2004 | |
| 2008/0008909 A1 | 1/2008 | Fuji et al. | JP | 2004-214234 | 7/2004 | |
| 2008/0013218 A1 | 1/2008 | Fuke et al. | JP | 2005-097693 | 4/2005 | |
| 2008/0042779 A1* | 2/2008 | Carey et al. ................... 333/167 | JP | 2005-136309 | 5/2005 | |
| 2008/0062577 A1 | 3/2008 | Fukuzawa et al. | JP | 2005-166896 | 6/2005 | |
| 2008/0068764 A1 | 3/2008 | Fukuzawa et al. | JP | 2005-191101 | 7/2005 | |
| 2008/0080098 A1 | 4/2008 | Fuke et al. | JP | 2005-285936 | 10/2005 | |
| 2008/0102315 A1 | 5/2008 | Fukuzawa et al. | JP | 2005-339784 | 12/2005 | |
| 2008/0106826 A1 | 5/2008 | Funyama et al. | JP | 2005-353236 | 12/2005 | |
| 2008/0192388 A1 | 8/2008 | Zhang et al. | JP | 2006-019743 | 1/2006 | |
| 2008/0204944 A1 | 8/2008 | Aikawa et al. | JP | 2006-041266 | 2/2006 | |
| 2008/0239590 A1 | 10/2008 | Fuke et al. | JP | 2006-049426 | 2/2006 | |
| 2008/0278864 A1 | 11/2008 | Zhang et al. | JP | 2006-054257 | 2/2006 | |
| 2008/0311431 A1 | 12/2008 | Fuji et al. | JP | 2006-114610 | 4/2006 | |
| 2009/0059441 A1 | 3/2009 | Zhang et al. | JP | 2006-135253 | 5/2006 | |
| 2009/0061105 A1 | 3/2009 | Fukuzawa et al. | JP | 2006-319343 | 11/2006 | |
| 2009/0091864 A1 | 4/2009 | Carey et al. | JP | 2007-115960 | 5/2007 | |
| 2009/0091865 A1 | 4/2009 | Zhang et al. | JP | 2007-221135 | 8/2007 | |
| 2009/0104475 A1 | 4/2009 | Fuji et al. | JP | 2007-266122 | 10/2007 | |
| 2009/0109581 A1 | 4/2009 | Fukuzawa et al. | JP | 2008-016740 | 1/2008 | |
| 2009/0141408 A1 | 6/2009 | Fukuzawa et al. | JP | 2008-016741 | 1/2008 | |
| 2009/0162698 A1 | 6/2009 | Fukuzawa et al. | JP | 2008-199026 | 8/2008 | |
| 2009/0225477 A1 | 9/2009 | Fukuzawa et al. | KR | 10-0302029 | 6/2001 | |
| 2009/0314740 A1 | 12/2009 | Ikemoto et al. | KR | 2001-0081771 | 8/2001 | |
| 2010/0037453 A1 | 2/2010 | Zhang et al. | KR | 2002-0015295 | 2/2002 | |
| 2010/0091412 A1 | 4/2010 | Yuasa et al. | KR | 10-2005-0027159 | 3/2005 | |
| 2010/0091414 A1 | 4/2010 | Yuasa et al. | KR | 10-2005-0118649 | 12/2005 | |
| 2010/0091415 A1* | 4/2010 | Yuasa et al. ................... 360/324 | KR | 10-2006-0050327 | 5/2006 | |
| 2010/0092803 A1 | 4/2010 | Yuasa et al. | WO | 97-47982 | 12/1997 | |
| 2010/0323104 A1 | 12/2010 | Yuasa et al. | WO | 03/032338 | 4/2003 | |
| | | | WO | 2008/032745 | 3/2008 | |

FOREIGN PATENT DOCUMENTS

| | | |
|---|---|---|
| CN | 1183517 | 1/2005 |
| CN | 1746980 | 3/2006 |
| EP | 0 687 917 | 12/1995 |
| EP | 0 877 398 | 11/1998 |

OTHER PUBLICATIONS

Didier Bozec, et al., "Mean Free Path Effects on the Current Perpendicular to the Plane Magnetoresistance of Magnetic Multilayers", Physical Review Letters, vol. 85, No. 6, Aug. 7, 2000, pp. 1314-1317. (Abstract).

B. Dieny, et al., "Magnetotransport Properties of Magnetically Soft Spin-Valve Structures (Invited)", J. Appl. Phys., vol. 69 (8), Apr. 15, 1991, pp. 4774-4779.

B. Dieny et al., "Giant Magnetoresistance of Magentically Soft Sandwiches: Dependence on Temperature and on Layer Thicknesses", Physical Review B, vol. 45, No. 2, Jan. 1, 1992, pp. 806-813.

D Bozec, et al., "Comparative Study of the Magnetoresistance of MBE-Grown Multilayers: [Fe/Cu/Co/Cu]$_N$ and [Fe/Cu]$_N$[Co/Cu]$_N$" Physical Review B, vol. 60, No. 5, Aug. 1, 1999, pp. 3037-3039. (Abstract).

Hideaki Fukuzawa, et al., "MR Ratio Enhancement by NOL Current-Confined-Path Structures in CPP Spin Valves", IEEE Transactions on Magnetics, Jul. 2004, vol. 40, No. 4, pp. 2236-2238.

Takagishi, M. et al., "The Applicability of CPP-GMR Heads for Magnetic Recording", IEEE Transactions on Magnetics, vol. 38, No. 5, pp. 2277-2282, (Sep. 2002).

A. Losev et al., "Electron Beam Induced Reduction of CuO in the Presence of a Surface Carbonaceous Layer: An XPS/Hreels Study", Surface Science 213 (1989) pp. 554-579.

K.S. Kim et al., "X-Ray Photoelectron Spectroscopic Studies of Nickel-Oxygen Surfaces Using Oxygen and Argon Ion-Bombardment", Surface Science 43 (1974), pp. 625-643.

N. Garcia, et al. "Magnetoresistance in Excess of 200% in Ballistic Ni Nanocontacts at Room Temperature and 100 Oe," Physical Review Letters, vol. 82, No. 14, Apr. 5, 1999, pp. 2923-2926. (Abstract).

J.J. Versluijs, et al., "Magnetoresistance of Half-Metallic Oxide Nanocontracts," Physical Review Letters, vol. 87, No. 2, Jul. 9, 2001, pp. 026601-1 through 026601-4.

Office Action dated Feb. 23, 2012 in JP Application No. 2008-249226 with English-language translation.

Nagasaka et al., "Giant magnetoresistance properties of specular spin valve films in a current perpendicular to plane structure," J. Appl. Phys., vol. 89, No. 11, pp. 6943-4965.

Mazin, "How to Define and Calculate the Degree of Spin Polarization in Ferromagnets", Physical Review Letters, vol. 83, No. 7, Aug. 16, 1999, pp. 1427-1430.

W.F. Egelhoff, et al., "Oxygen as a Surfactant in the Growth of Giant Magnetoresistance Spin Valves", J Appl. Phys., vol. 82, No. 12, pp. 6142-6151, Dec. 15, 1997.

Y. Kamiguchi et al., "CoFe Specular Spin Valves With a Nano Oxide Layer", The 1999 IEEE International Magnetics Conference, May 18-21, 1999.

H.A. Ferrera et al. "Rapid DNA hybridization based on ac field focusing of magnetically labeled target DNA"; Applied Physics Letters, 87, 013901 (2005); pp. 013901-1 to 013901-3.

L. Lagae et al. "Magnetic biosensors for genetic screening of cystic fibrosis"; IEE Proc. Circuits Devices Syst. vol. 152, No. 4, Aug. 2005, pp. 393-400.

Meguro, K., Hoshiya, H., Watanabe, K., Hamakawa, Y., and Fuyama, M., "Spin-valve films using syntehtic ferrimagnets for pinned layer," (IEEE Trans. Mag., 35(5), 1999, 2925-2927. (Abstract).

C. Vouille et al, J.Appl.Phys. 81 4573 (1997); "Inverse CPP-GMR in (A/Cu/Co/Cu) multilayers . . . by impurities" (Abstract).

A.C. Reilly et al, J.Magn. Magn. Mater, 195 (1999) L269; "Perpendicular giant magnetoresistance of . . . unified picture." (Abstract).

J. Bass et al, J. Magn. Magn. Mater, 200 (1999) 274; "Current-perpendicular (CPP) magnetoresistance in magnetic metallic multilayers." (Abstract).

L. Villa, et al., Journal of Applied Physics, vol. 87, No. 12, pp. 8610-8614, Current Perpendicular Magnetoresistances of NiFeCo and NiFe "Permalloys", Jun. 15, 2000. (Abstract).

Yonsei University Master Thesis, "Voltage Difference Amplification Circuit for Improving the Sensing Characteristics of MRAM", Dec. 2005 and brief English-language translation thereof.

Ceramist vol. 4 No. 5, Special Edition, "Magnetic Sensor Technologies and Applications Using Giant Magnetoresistance effect", Oct. 2001.

Seoul University Doctoral Thesis, A Study on the Development of New Spin Wave Structures for Magnetoresistive RAM based on Giant Magnetoresistance and Tunneling, Aug. 2001 and brief English-language translation thereof.

Fukuzawa et al., U.S. Appl. No. 11/001,174, filed Dec. 2, 2004.
Fukuzawa et al., U.S. Appl. No. 11/199,448, filed Aug. 9, 2005.
Fuji et al., U.S. Appl. No. 11/583,968, filed Oct. 20, 2006.
Yuasa et al., U.S. Appl. No. 11/703,830, filed Feb. 8, 2007.
Fukuzawa et al., U.S. Appl. No. 11/783,011, filed Apr. 5, 2007.
Fuji et al., U.S. Appl. No. 11/802,474, filed May 23, 2007.
Fuke et al., U.S. Appl. No. 11/822,700, filed Jul. 9, 2007.
Fuke et al., U.S. Appl. No. 11/892,890, filed Aug. 28, 2007.
Zhang et al., U.S. Appl. No. 11/906,716, filed Oct. 3, 2007.
Fuke et al., U.S. Appl. No. 12/071,589, filed Feb. 22, 2008.
Fukuzawa et al., U.S. Appl. No. 12/086,761, filed Jun. 19, 2008.
Fukuzawa et al., U.S. Appl. No. 12/248,578, filed Oct. 9, 2008.
Fuji et al., U.S. Appl. No. 12/314,811, filed Dec. 17, 2008.
Fukuzawa et al., U.S. Appl. No. 12/347,543, filed Dec. 31, 2008.
Yuasa et al., U.S. Appl. No. 12/585,851, filed Sep. 25, 2009.
Yuasa et al., U.S. Appl. No. 12/585,852, filed Sep. 25, 2009.
Yuasa et al., U.S. Appl. No. 12/585,854, filed Sep. 25, 2009.

* cited by examiner

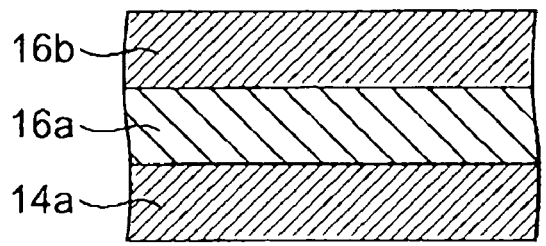
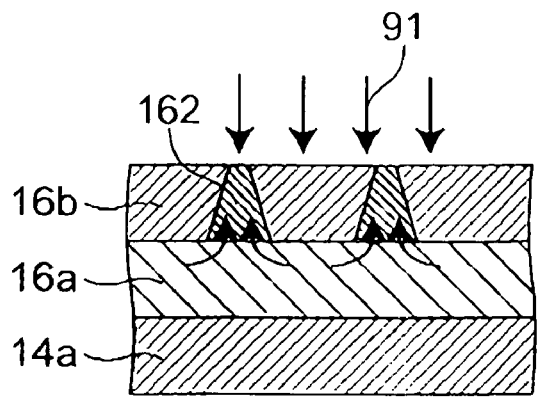
FIG. 4A             FIG. 4B
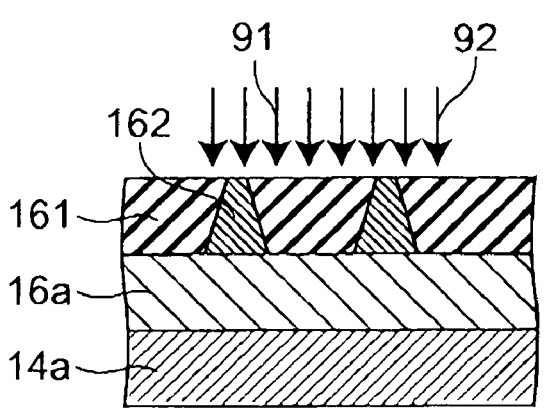
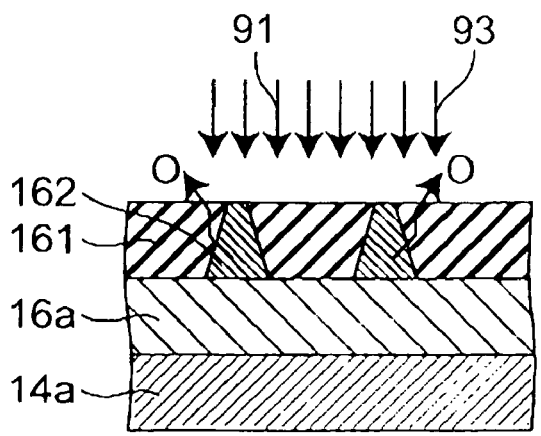
FIG. 4C             FIG. 4D

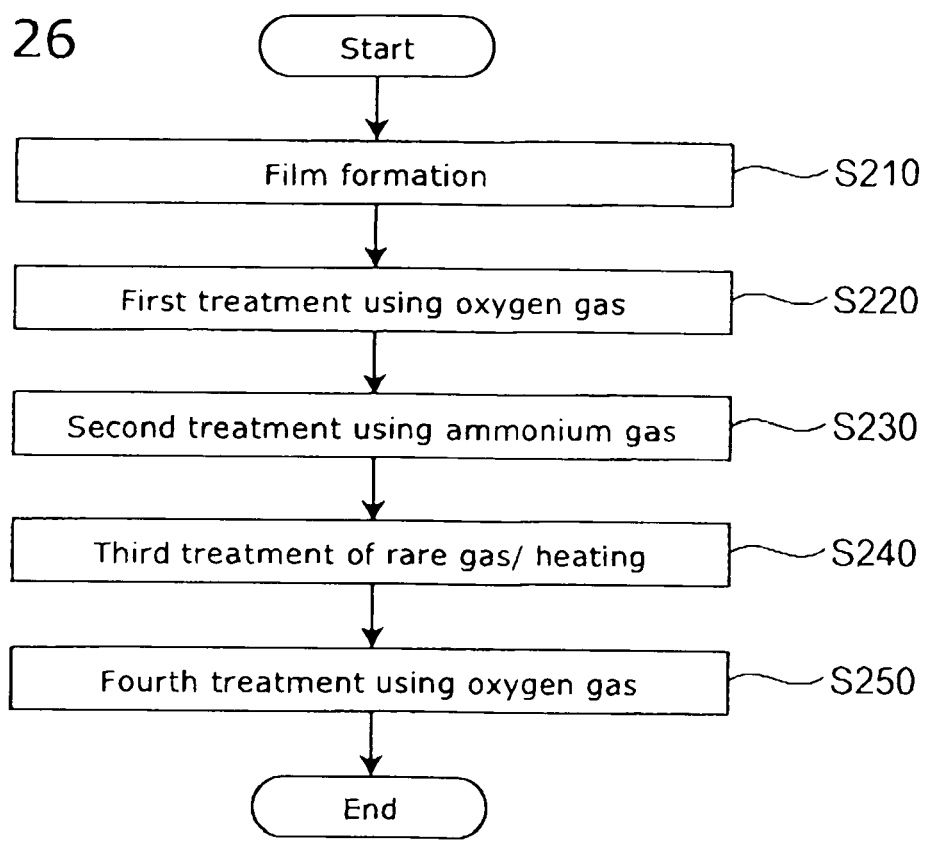
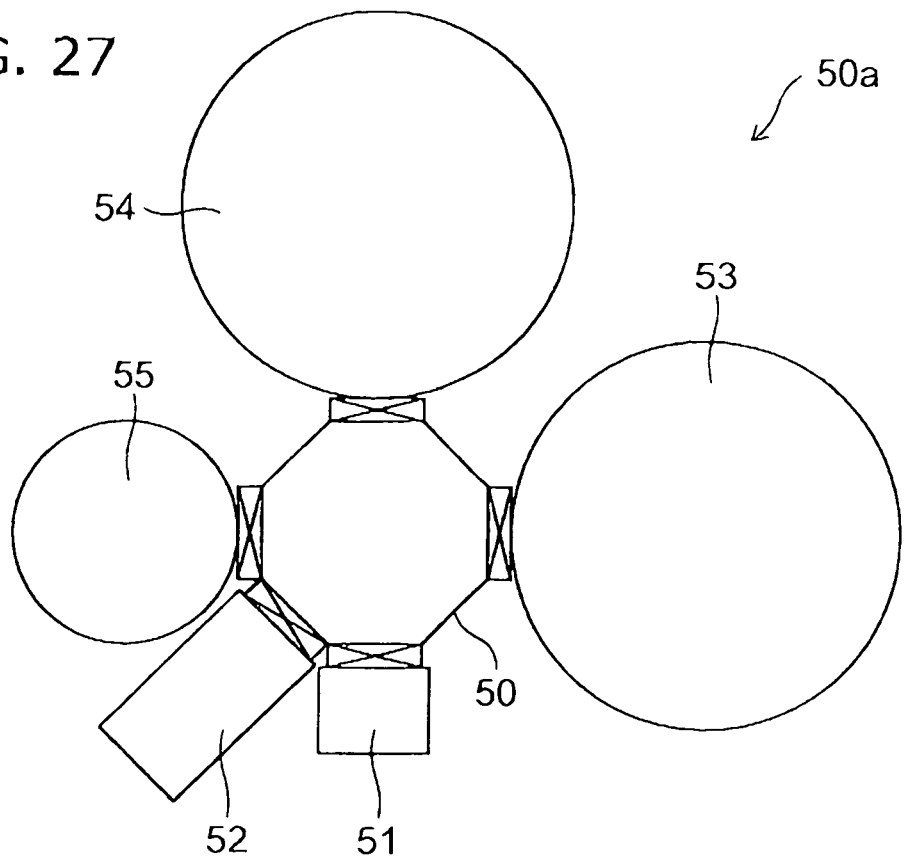

METHOD FOR MANUFACTURING A MAGNETO-RESISTANCE EFFECT ELEMENT AND MAGNETIC RECORDING AND REPRODUCING APPARATUS

CROSS-REFERENCE TO RELATED APPLICATIONS

This application is based upon and claims the benefit of priority from the prior Japanese Patent Application No. 2008-249226, filed on Sep. 26, 2008; the entire contents of which are incorporated herein by reference.

BACKGROUND OF THE INVENTION

1. Field of the Invention

This invention relates to a method for manufacturing a magneto-resistance effect element and a magnetic recording and reproducing apparatus.

2. Background Art

Performance of a magnetic device, particularly such as a magnetic head is extremely enhanced by using Giant Magneto-Resistive Effect (GMR). Particularly, since a spin valve film (SV film) can exhibit a larger GMR effect, the SV film has developed the magnetic device such as a magnetic head and MRAM (Magnetic Random Access Memory).

The "spin valve" film is laminated films having such a structure as sandwiching a non-magnetic metal spacer layer between two ferromagnetic layers and is called as spin depending scattering unit. In the spin valve film, the magnetization of one ferromagnetic layer (often called as a "pinning layer" or "fixed magnetization layer") is fixed by the magnetization of an anti-ferromagnetic layer and the magnetization of the other ferromagnetic layer (often called as a "free layer" or "free magnetization layer") can be rotated in accordance with an external magnetic field. In the spin valve film, an electric resistance changes by varying a relative angle between the magnetizations of the pinning layer and the free layer. The value of the change in the electric resistance is called as MR (Magneto Resistance) variation ratio, and corresponds to an output of the element.

As a magneto-resistance effect element using the spin valve film, a CIP (Current In plane)-GMR element, a TMR (Tunneling Magneto Resistance) element and a CPP (Current Perpendicular to Plane)-GMR element are proposed. Among these elements, the CIP element was put to first practical use. In the CIP-GMR element, a sense current is flowed to the SV film in the direction parallel to the film surface thereof and it was in practice use during a period with a large head size. However, when a head size becomes small with increasing of the recording density in a HDD, a heat or the like become problem and the TMR element, in which a sense current is flowed to the film in the direction perpendicular to the film surface thereof was put to practical use next. In the TMR element has a merit of a small sense current and large output. However, the resistance in the TMR element is usually high because it uses a tunneling current through an insulating barrier. It will become problem not to decrease the resistance of the element in future when the recording density is increased and the head size is downsized.

To solve this problem, the CPP-GMR element has been proposed. The resistance of the element in the CPP-GMR element is low by nature, because it uses a magneto-resistance effect by a metal conduction. This is the merit of the CPP-GMR element comparing with the TMR element.

In a metallic CPP-GMR element in which the SV film is made of metallic films, the variation degree in resistance by the magnetization of the SV film becomes small so that to convert a weak magnetic field (for example, from a magnetic disk of high recording density) to an electric signal becomes difficult.

In contrast, such a CPP element using an oxide layer with a conductive portion along with the direction of film thickness (NOL: Nano-oxide layer) is proposed in JP-A 2002-208744 (KOKAI) (Patent document 1). In the CPP element, the element resistance and the MR variation degree of the element can be developed by means of CCP (Current-confined-path) effect. Hereinafter, this element is often called as a "CCP-CPP element".

However, it is anticipated that from now, applications of magnetic recording devices will be further enlarged and higher-density recording will be achieved, and in this case, it becomes necessary to provide a magneto-resistance effect element having further higher output.

In the case of CCP-CPP element, because current is confined in a spacer, contribution of electric conduction in the conductive portion to GMR effect is very large. Specifically, it has been reported that a MR variation ratio becomes higher as decreasing the electric resistance of the conductive portion in IEEE Trans. Magn. 40 p. 2236, (2004) (Non-patent document 1).

As a means for realizing the CCP-CPP element, a method for manufacturing a spacer has been proposed in JP-A 2006-54257 (Kokai) (Patent document 2).

However, for achieving the MR variation ratio anticipated to be required in the future, further ingenuity is required.

As a means for decreasing the electric resistance of the conductive portion, there is a method to decreasing an amount of impurities included in non-magnetic metal forming the conductive portion. Among impurities, by decreasing oxygen impurities, the electric resistance can be decreased. For decreasing the amount of the oxygen impurities, it is effective to reduce the conductive portion. For a reduction effect by a gas in the vacuum chamber, for example, in copper wiring used in a semiconductor device or the like, a technique of removing copper oxide by treatment with hydrogen plasma is known in U.S. Pat. No. 6,033,584 (Patent document 3).

SUMMARY OF THE INVENTION

According to an aspect of the invention, there is provided a method for manufacturing a magneto-resistance effect element having a first magnetic layer including a ferromagnetic material, a second magnetic layer including a ferromagnetic material and a spacer layer provided between the first magnetic layer and the second magnetic layer, the spacer layer having an insulating layer and a conductive portion penetrating through the insulating layer, the method including: forming a film to be a base material of the spacer layer; performing a first treatment using a gas including at least one of oxygen molecules, oxygen atoms, oxygen ions, oxygen plasma and oxygen radicals on the film; and performing a second treatment using a gas including at least one of hydrogen molecules, hydrogen atoms, hydrogen ions, hydrogen plasma, hydrogen radicals, deuterium molecules, deuterium atoms, deuterium ions, deuterium plasma and deuterium radicals on the film submitted to the first treatment.

According to another aspect of the invention, there is provided a method for manufacturing a magneto-resistance effect device having a first magnetic layer including a ferromagnetic material, a second magnetic layer including a ferromagnetic material and a spacer layer provided between the first magnetic layer and the second magnetic layer, the spacer layer having an insulating layer and a conductive portion penetrating through the insulating layer, the method including: forming a film to be a base material of the spacer layer; performing a first treatment using a gas including at least one of oxygen molecules, oxygen atoms, oxygen ions, oxygen plasma and oxygen radicals to the film; and performing a second treatment using a gas including at least one of ammonia molecules, ammonia ions, ammonia plasma and ammonia radicals to the film submitted to the first treatment.

According to another aspect of the invention, there is provided a magnetic recording and reproducing apparatus including: a magnetic head assembly including a suspension, a the magneto-resistance effect element being mounted on one end of the suspension, and an actuator arm connected to other end of the suspension; and a magnetic recording medium, information being recorded in the magnetic recording medium by using the magneto-resistance effect element, the magneto-resistance effect element having a first magnetic layer including a ferromagnetic material, a second magnetic layer including a ferromagnetic material and a spacer layer provided between the first magnetic layer and the second magnetic layer, the spacer layer having an insulating layer and a conductive portion penetrating through the insulating layer, the magneto-resistance effect device being manufactured by a method including: forming a film to be a base material of the spacer layer; performing a first treatment using a gas including at least one of oxygen molecules, oxygen atoms, oxygen ions, oxygen plasma and oxygen radicals on the film; and performing a second treatment using a gas including at least one of hydrogen molecules, hydrogen atoms, hydrogen ions, hydrogen plasma, hydrogen radicals, deuterium molecules, deuterium atoms, deuterium ions, deuterium plasma and deuterium radicals on the film submitted to the first treatment.

BRIEF DESCRIPTION OF THE DRAWINGS

FIGS. 4A to 4D are schematic sectional views illustrating the method for manufacturing according to a first embodiment of this invention;

FIG. 26 is a flow chart view illustrating another method for manufacturing according to the third embodiment of this invention;

FIG. 27 is a schematic view illustrating a configuration of a manufacturing apparatus used for the method for manufacturing according to the embodiments of this invention;

DETAILED DESCRIPTION OF THE INVENTION

Hereinafter, each of embodiments of this invention will now be described with reference to drawings.

The drawings are schematic or conceptual. And, the relationships between the thickness and width of each of components, specific coefficient of scales among members, and so forth are not necessarily the same as the actual ones. Moreover, even when the same portions are shown, the scales or specific coefficients are occasionally shown to be different from each other among the drawings.

Moreover, in the specification and each of the drawings, the same signs will be appended to the same components as described with respect to a previously presented drawing, and the detailed description thereof will be appropriately omitted.

First Embodiment

Figure 1:
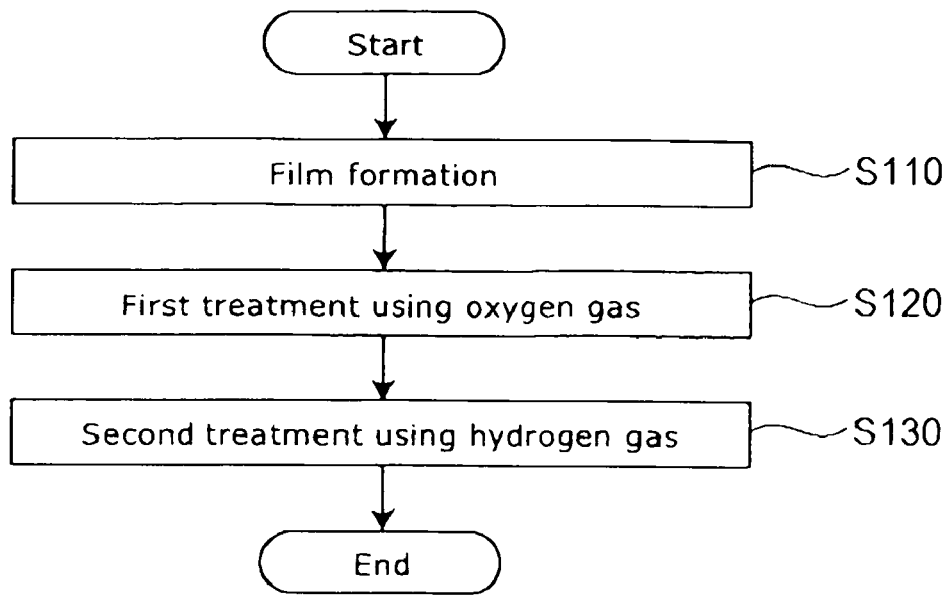
FIG. 1 is a flow chart illustrating a method for manufacturing a magneto-resistance effect element according to a first embodiment of this invention.

FIG. 1 is a flow chart illustrating a method for manufacturing a magneto-resistance effect element according to a first embodiment of this invention.

Figure 2:
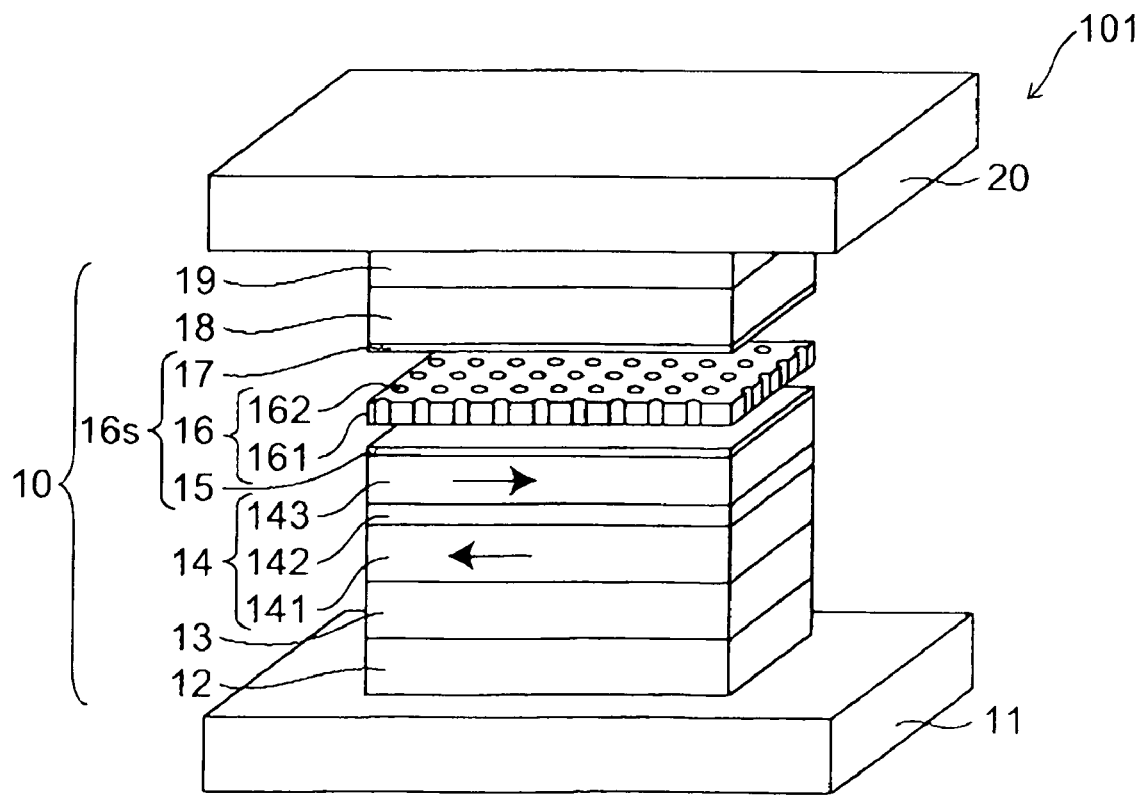
FIG. 2 is a schematic perspective view illustrating a configuration of a magneto-resistance effect element to which the method for manufacturing according to a first embodiment is applied.

FIG. 2 is a schematic perspective view illustrating a configuration of a magneto-resistance effect element to which the method for manufacturing a magneto-resistance effect element according to a first embodiment of this invention is applied.

Figure 3:
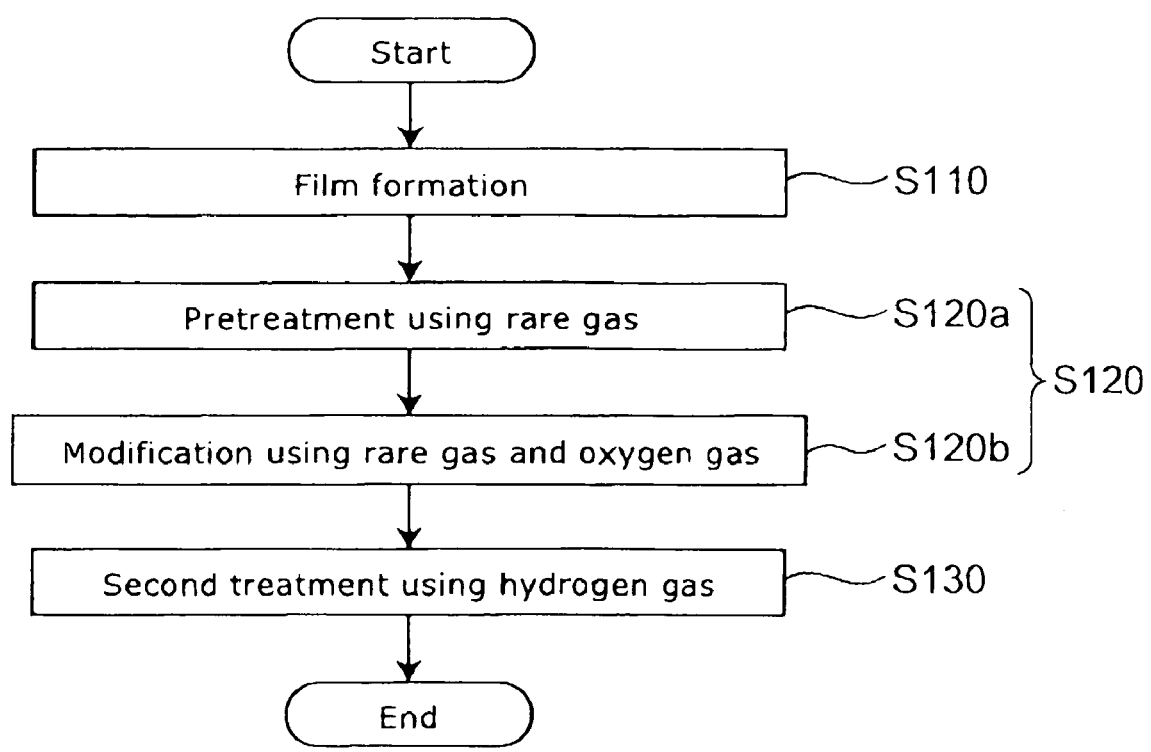
FIG. 3 is a flow chart illustrating a specific example of the method for manufacturing according to a first embodiment of this invention.

FIG. 3 is a flow chart illustrating a specific example of the method for manufacturing a magneto-resistance effect element according to a first embodiment of this invention.

FIGS. 4A to 4D are schematic sectional views following step sequence illustrating the method for manufacturing a magneto-resistance effect element according to a first embodiment of this invention.

That is, FIG. 4A represents the first step, and FIG. 4B represents the step following the step of FIG. 4A, and FIG. 4C represents the step following the step of FIG. 4B, and FIG. 4D represents the step following the step of FIG. 4C.

At first, a magneto-resistance effect element 101 to which the method for manufacturing a magneto-resistance effect element according to this embodiment is applied is described.

As shown in FIG. 2, a magneto-resistance effect element 101 to which the method for manufacturing a magneto-resistance effect element according to this embodiment is applied is a CCP-CPP element whose spacer layer 16 has an insulating layer 161 and conductive portion 162 forming current pathways in the thickness direction of the insulating layer 161.

The magneto-resistance effective element 101 has a bottom electrode 11, a top electrode 20, and a magneto-resistance effective film 10 provided between the bottom electrode 11 and the top electrode 20. The magneto-resistance effective element 101 is formed on a substrate which is not shown.

The magneto-resistance effective film 10 includes an underlayer 12, a pining layer (antiferromagnetic layer) 13, a pinned layer 14, a bottom metallic layer 15, a spacer layer (CCP-NOL) 16 (an insulating layer 161 and a conductive portion 162), a top metallic layer 17, a free layer 18, and a cap layer (protective layer) 19 which are sequentially stacked and formed. The magneto-resistance effective element 101 is an example of a bottom-type CCP-CPP element in which the pinned layer 14 is located below the free layer 18. The pinned layer 14 has a bottom pinned layer 141, an antiparallel magnetic coupling layer (magnetic coupling layer) 142 and a top pinned layer 143.

Among them, the pinned layer 14, the bottom metallic layer 15, the spacer layer 16, and the top metallic layer 17, and the free layer 18 correspond to a spin valve film sandwiching the non-magnetic spacer layer between the two ferromagnetic layers. The entirety of the bottom metallic layer 15, the spacer layer (CCP-NOL) 16 and the top metallic layer 17 is defined as an extended spacer layer 16s. For clarifying the structural feature of the magneto-resistance effect element, the spacer layer 16 is shown under the condition that the spacer layer 16 is separated from the top and bottom layers (the bottom metallic layer 15 and the top metallic layer 17).

The spacer layer (CCP-NOL) 16 has the insulating layer 161 and the conductive portion 162 (metallic film) penetrating through the insulating layer 161.

As described above, The magneto-resistance effective element 101 has the pinned layer 14 to be a first magnetic layer, the free layer 18 to be a second magnetic layer, and a spacer layer 16 provided between the first magnetic layer and the second magnetic layer and including the insulating layer 161 and the conductive portion 162 (metallic layer) penetrating through the insulating layer 161.

For the pinned layer 14 and the free layer 18, various magnetic materials can be used. The pinned layer 14 and the free layer 18 will be described later.

In the spacer layer 16, the insulating layer 161 is mainly composed of metal oxide. On the other hand, the conductive portion 162 is mainly composed of metallic film.

For example, for the insulating layer 161, for example, $Al_2O_3$ is used.

The conductive portion 162 is a pathway flowing current vertically to the film surface of the spacer layer 16 and is for confining the current. The conductive portion 162 functions as a conductor passing through current in the vertical direction to the film surface of the insulating layer 161. That is, the spacer layer 16 has a current-confined-path structure (CCP structure) of the insulating layer 161 and the conductive portion 162, and the MR variation ratio is increased by the current-confined-path effect. For the conductive portion 162, metal such as Cu and forth is used.

This invention is not limited thereto and for the insulating layer 161 and the conductive portion 162, various materials to be described later can be used. Hereinafter, as an example, the case that the insulating layer 161 is made of $Al_2O_3$ and the conductive portion 162 is made of Cu will be described.

The bottom metallic layer 15 and the top metallic layer 17 are, for example, layers for enhancing crystallinity or the like of the various layers included in the magneto-resistance effect element 101 and are provided as necessary. Hereinafter, for simplifying the explanation, a case when the bottom metallic layer 15 and the top metallic layer 17 are not used will be described.

The conductive portion 162 is a region having drastically less content of oxygen than that in the insulating layer 161. For example, the content of oxygen in the insulating layer 161 is at least twice or lager than that in the conductive portion 162. The content of oxygen in the conductive portion 162 is not 0%, and, for example, the conductive portion 162 includes larger amount of oxygen than the case in which the insulating layer does not exist circumferentially.

The conductive portion 162 has generally crystal phase but its orientation is worse than that of continuous film or metal of bulk. In the case of CCP-CPP element, as the amount of oxygen of the conductive portion 162 decreases, the specific resistance of the conductive portion 162 is decreased and higher MR variation ratio is obtained.

The method for manufacturing a magneto-resistance effect element according to this embodiment is a method for decreasing the content of impurities of oxygen in the conductive portion 162. Thereby, high MR variation ratio is obtained. As described later, also by improving crystallinity of the conductive portion 162, higher MR variation ratio can be obtained. According to the method for manufacturing a magneto-resistance effect element according to this embodiment, crystallinity can be improved, and the high MR variation ratio is also realized from this aspect.

As shown in FIG. 1, in the method for manufacturing a magnetic-resistive effect element according to this embodiment, the following steps are performed between the step of forming the first magnetic layer including ferromagnetic material and the step of forming the second magnetic layer including the ferromagnetic material.

That is, first of all, a film to be a base material of the spacer layer 16 is formed (Step S110).

As shown in FIG. 4A, for example, on a layer 14a including the first magnetic layer, a first metallic film 16a to be the conductive portion 162 and a second metallic layer 16b to be the insulating layer 161 are film-formed and stacked. The first metallic film 16a is, for example, made of Cu. The second metallic film 16b is made of Al. The second metallic film 16b may be made of AlCu.

And, the films (the first metallic film 16a and the second metallic film 16b) are submitted to a first treatment using an oxygen gas (Step 120).

For example, as shown in FIG. 4B, first PIT (Pre Ion Treatment) by an Ar ion beam 91 is performed (Step 120a illustrated in FIG. 3). Then, as shown in FIG. 4C, IAO (Ion Assisted Oxidation) by an oxygen ion beam 92 is performed (Step S120b illustrated in FIG. 3). As described above, the second step (Step S120) performing the first treatment by using an oxygen gas may include the PIT step (Pretreatment step by using a rare gas: Step S120a) and the IAO step (Modification step by using a rare gas and an oxygen gas: Step S120b).

By PIT, portions of the first metallic film 16a in the lower side are sucked up to the side of second metallic film 16b. And, the portions of the first metallic film 16a penetrate through the second metallic film 16b to form the conductive portion 162. And, by the IAO by using the oxygen gas (oxygen ion beam 92 in this case), the first metallic film 16a and the second metallic film 16b are submitted to oxidizing treatment.

In this case, by selecting materials used in the first metallic film 16a and the second metallic film 16b, selective oxidation is performed. For the first metallic film 16a to be the conductive portion 162, a material having high oxidation generation energy is used, and for the second metallic film 16b to be the insulating layer 161, a material having low oxidation generation energy is used. That is, in the conductive portion 162, a material that is hard to be oxidized and easy to be reduced more than that of the insulating layer 161 is used.

In this specific example, the second metallic film 16b made of Al is oxidized to be $Al_2O_3$ and the insulating layer 161 is formed. And, the first metallic film 16a made of Cu is relatively hard to be oxidized, and a large amount thereof remains as the metal. However, a part thereof is oxidized and CuO is generated. It is desirable to decrease the amount of CuO as less as possible.

As the method for decreasing the amount of CuO, reduction of oxide is effective. The reduction of CuO is performed by a hydrogen gas and converted into Cu metal by the following reaction formula.

$$CuO + H_2 \rightarrow Cu + H_2O \qquad (1)$$

The reduction by hydrogen gas has been utilized for the purpose of improving adhesive force by reducing CuO generated by oxidation of a surface of Cu that is a wire of an electronic circuit using semiconductor (for example, U.S. Pat. No. 6,033,584). However, in the case of reducing the surface of Cu of a wire, generally, it is necessary to raise the temperature to be 150° C. or more, and there is no report that the reduction can be performed in room temperature. One reason thereof is that reactivity of $H_2$ molecules is low. In this embodiment, for solving this problem, it is effective that hydrogen molecule is dissociated and then reacted with CuO, and this effectiveness is utilized and applied.

$$H_2 \rightarrow 2H \qquad (2)$$

$$CuO + 2H \rightarrow Cu + H_2O \qquad (3)$$

The reaction energy in the formula 3 is lower than the reaction energy in the formula 1 and CuO is more easily reduced. For realizing dissociation of hydrogen molecule $H_2$ shown in formula 2, it is effective to ionize, plasma-activate, and radical-activate the hydrogen molecules. Here, in this embodiment, a hydrogen gas and a gas based on hydrogen has been used. Even in the cases of molecule and plasma, their forms are gases.

It has been known that by using the above-described method, the conductive portion 162 of the CCP-CPP type magneto-resistance effect film can be reduced. For one reason thereof, a thickness of several 100 nm of CuO is required to be reduced in wiring of Cu, and by contrast, it is sufficient only to reduce several nanometers of the conductive portion 162 in this embodiment. It can be thought that because the object is thin, the reduction is easily realized.

Moreover, as the specific problem for the CCP-CPP type magneto-resistance effect film, there is suppression of adverse effect due to reduction of the surrounding oxide caused by the structure in which the circumference thereof is surrounded by oxide (such as $Al_2O_3$). In the case of reducing the surface of the Cu wiring, because there is no oxide in the circumference thereof, it is not necessary to be careful of reduction of the surroundings. By contrast, in the CCP-CPP type magneto-resistance effect film, for example, the oxide $Al_2O_3$ is also partially reduced by a hydrogen gas.

$$Al_2O_3 + 3H_2 \rightarrow 2Al + 3H_2O \qquad (4)$$

Oxide $Al_2O_3$ is harder to be reduced than CuO and therefore the reduced amount thereof is further smaller. However, it is necessary to use the condition that oxide $Al_2O_3$ is not reduced as much as possible. If the reduction reaction of the formula 4 is promoted, the following problems will be caused. One of the problems is that a leak current flows in the insulating layer 161. If the leak current flows, the current-confined-path effect becomes weak and the MR variation ratio is decreased. The other problem thereof is that the amount of water ($H_2O$) generated in the reduction reaction increases. As described above, the residual $H_2O$ in the film causes reoxidization of the metal, and it becomes impossible to decrease amount of the oxygen impurities from the conductive portion 162. From such two reasons, it is necessary to suppress the reduction of the insulating layer 161 of the oxide.

From the above-described reasons, the above-described films (the first metallic film 16a, the second metallic film 16b, and mixture of the insulating layer 161 and conductive portion 162) submitted to the above-described first treatment is submitted to a second treatment by using a hydrogen gas (Step S130).

As shown in FIG. 4D, the above-described films are irradiated with a hydrogen ion beam 93, and thereby, CuO generated by oxidation of the first metallic film 16a is reduced and changed to Cu. The reducing treatment is also submitted to $Al_2O_3$ to be the insulating layer 161, but the reduced amount of $Al_2O_3$ is smaller than that of CuO.

As described above, according to the method for manufacturing a magneto-resistance effect element according to this embodiment, the oxide in the conductive portion 162 generated in forming the insulating layer 161 and the conductive portion 162 is reduced to decrease the amount of the oxygen impurities in the conductive portion 162. Thereby the resistance of the conductive portion 162 can be decreased and the current-confined-path effect can be effectively exerted. Thereby, the CCP-CPP type magneto-resistance effect element having high MR variation ratio can be obtained.

By the way, in the above-described formula 3, some of the generated water ($H_2O$) remain in Cu and come to reoxidize the surrounding Cu, and as a result, it may be occasionally hard to decrease the amount of the oxygen impurities of the conductive portion 162. $H_2O$ easily evaporates at a high temperature, but $H_2O$ easily remains in room temperature. Accordingly, it has been found that in performing the second treatment in this embodiment, the substrate is heated or the same energy as heating is provided by irradiation with ion beam or plasma and these methods are effective for removing this water.

As described above, as the method for converting the second metallic film 16b into the insulating layer 161, an example of performing IAO by the oxygen ion beam 92 has been described. However, this invention is not limited thereto, and the method for converting the second metallic film 16b into the insulating layer 161 is discretional as long as an oxygen gas is used.

For example, a method of exposing the first metallic film 16a and the second metallic film 16b to an oxygen gas is also possible. In the case that the first metallic film 16a is Cu and the second metallic film 16b is Al, the oxygen exposure amount is appropriately, for example, from 10000 Langmuires to 50000 Langmuires. If smaller than 10000 Langmuires, oxidation of the second metallic film 16b is insufficient. If larger than 50000 Langmuires, oxidation of the first metallic film 16a begins.

In the first treatment, after IAO, treatment of irradiating rare gas ion or rare gas plasma or treatment of heating the substrate may be added. Thereby, separation between the insulating layer 161 and the conductive portion 162 can be more promoted. As the rare gas, at least any one of He, Ne, Ar, Xe, and Kr may be used, and in the case of irradiating the rare gas as ion beam, it is preferable that the beam voltage applied to the grid is 50 V or less and the irradiation time is 1 minute or less. In the case of irradiating the rare gas as RF plasma, it is preferable that the bias power is 10 W or less and the irradiation time is 1 minute or less. In the case of heating, the upper limit of the substrate temperature may be 80° C. The reason why such an upper limit is set is to prevent CCP-NOL from being broken.

First Comparative Example

In a method for manufacturing a magneto-resistance effect element of a first comparative example, the third step (Step S130) illustrated in FIG. 1 is not performed. In the magneto-resistance effect element manufactured by the method of the first comparative example, the second metallic film 16b is oxidized by the first treatment of oxidizing in the second step (Step S120), and specifically, CuO is generated from Cu, and as a result, a large amount of oxygen impurities exists in the conductive portion 162.

Figure 5A:
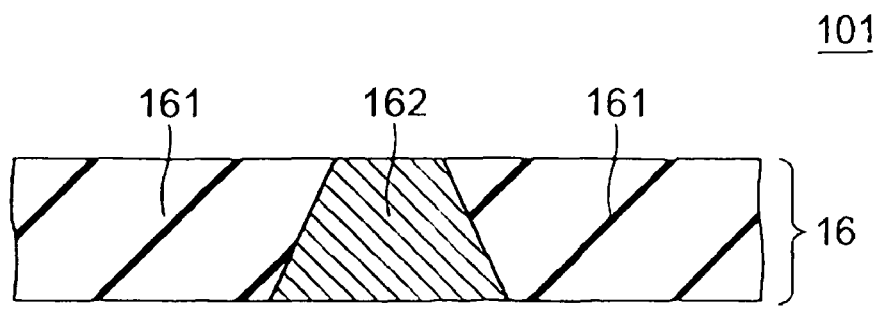
FIGS. 5A and 5B are schematic sectional views illustrating the states of the relevant parts of the magneto-resistance effect element according to the first embodiment and the first comparative example.
Figure 5B:
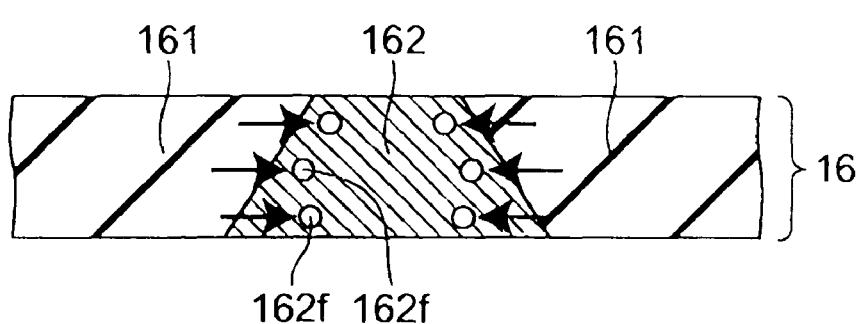

FIGS. 5A and 5B are schematic sectional views illustrating the states of the relevant parts of the magneto-resistance effect element according to the first embodiment of this invention and the magneto-resistance effect element according to the first comparative example.

That is, FIG. 5A illustrates the state of the spacer layer 16 of the magneto-resistance effect element 101 according to this embodiment, and FIG. 5B illustrates the state of the spacer layer 16 of the magneto-resistance effect element 101 of the first comparative example.

As shown in FIG. 5B, in the case of the magneto-resistance effect element 101 of the first comparative example, Cu to be the conductive portion 162 is oxidized by the first treatment and CuO is generated. And, oxygen atoms 162f diffuse into the conductive portion 162 from $Al_2O_3$ to be the insulating layer 161, and as a result, the purity of the conductive portion 162 is low and much oxygen is included. And, its crystallinity may be low.

By contrast, as shown in FIG. 5A, in the magneto-resistance effect element 101 manufactured by the method for manufacturing a magneto-resistance effect element according to this embodiment, if Cu to be the conductive portion 162 is oxidized by the first treatment and CuO is generated, CuO is reduced by the subsequent second treatment by using a hydrogen gas, and CuO does not substantially remain. And, if oxygen atoms 162f diffuse into the conductive portion 162 from $Al_2O_3$ to be the insulating layer 161, the oxygen atoms are also reduced by the second treatment by using a hydrogen gas. Thereby, the purity of the conductive portion 162 is high and less oxygen is included. And the crystallinity can be improved.

First Example

Figure 6:
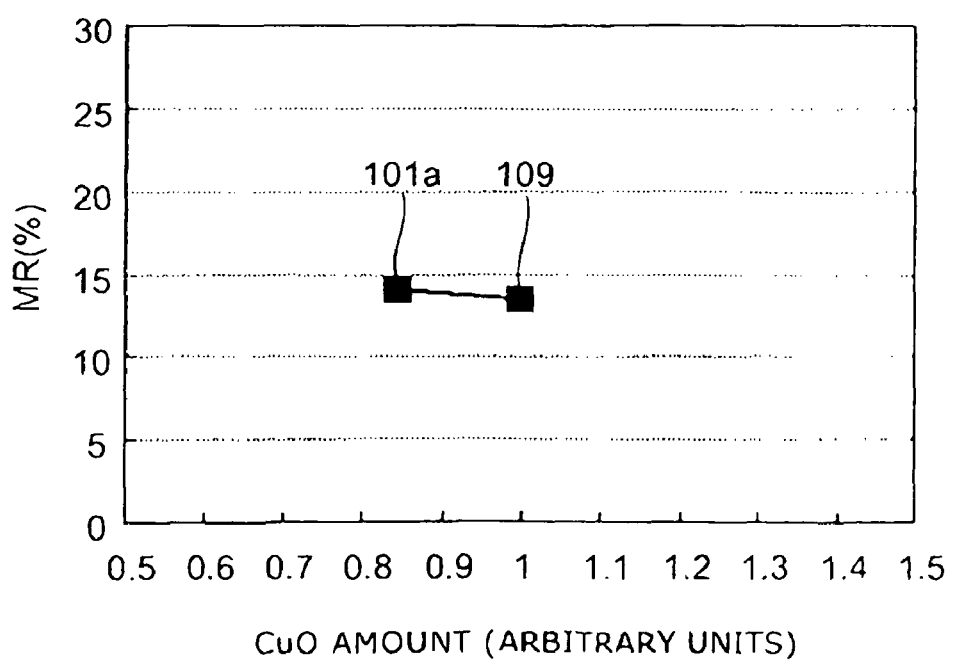
FIG. 6 is a graph illustrating a characteristic of the magneto-resistance effect element by the method for manufacturing according to the first example of this invention.

FIG. 6 is a graph illustrating a characteristic of the magneto-resistance effect element by the method for manufacturing a magneto-resistance effect element according to the first example of this invention.

That is, FIG. 6 illustrates the CuO amount and the MR variation ratio (MR) in the spacer layer 16 in the magneto-resistance effect element 101a produced by the manufacturing method of a first example according to this embodiment and those of the magneto-resistance effect element 109 of the first comparative example. The horizontal axis of this figure represents CuO amount and the vertical axis represents MR variation ratio (MR).

Here, for the CuO amount, the CuO count number in the spacer layer 16 is evaluated by a 3-dimension atom probe microscope, and standardized so that the CuO count number of the first comparative example is 1.

The structure and manufacturing condition of the magneto-resistance effect films 10 of the magneto-resistance effect element 101a according to this embodiment and magneto-resistance effect element 109 according to the first comparative example are as follows. And, the MR variation ratios of these magneto-resistance effect elements were measured.

As shown in FIG. 2, sequentially from below in this figure, Ta with a thickness of 1 nm (nanometers) to be a buffer layer of the underlayer 12, Ru with a thickness of 2 nm to be a seed layer of the underlayer 12, IrMn with a thickness of 7 nm to be an antiferromagnetic layer (pining layer) 13, $Co_{75}Fe_{25}$ with a thickness of 3.4 nm to be the bottom pinned layer 141, Ru with a thickness of 0.9 nm to be a magnetic coupling layer 142, and $Fe_{50}Co_{50}$ with a thickness of 1.8 nm and Cu with a thickness of 0.25 nm and $Fe_{50}Co_{50}$ with a thickness of 1.8 nm to be laminated films of the top pinned layer 143 are film-formed.

And, as a film formation step (Step S110), Cu with a thickness of 0.6 nm and Al with a thickness of 0.9 nm to be the bottom metallic layer 15 and the spacer layer 16 are film-formed.

And, in the case of the magneto-resistance effect element 101a, PIT and IAO are performed in the second step of performing the first treatment (Step S120), and reduction treatment by hydrogen plasma and Ar ion beam are performed in the third step of performing the second treatment (Step S130).

On the other hand, in the case of magneto-resistance effect element 109, PIT and IAO are performed in the second step, and the third step (the second treatment) is not performed.

Then, in both of the magneto-resistance effect element 101a and the magneto-resistance effect element 109, Cu with a thickness of 0.4 to be the top metallic layer 17, $Co_{60}Fe_{40}$ with a thickness of 2 nm and NiFe with a thickness of 3.5 nm to be laminated films of the free layer 18, and Cu with a thickness of 1 nm, Ta with a thickness of 2 nm and Ru with a thickness of 15 nm to be laminated films of the protective layer 19 are stacked.

The above-described film structure is adopted on the basis of the result of considering the suitable conditions to be described later, but modification and adjustment are possible. If modification is made, the value of the MR variation ratio changes according to the modification, but the magnitude relationship between the MR variation ratios of the first comparative example and that of this example does not change.

As shown in FIG. 6, CuO amount in the magneto-resistance effect element 101a manufactured by the manufacturing method according to this example is 0.8 times of that in the magneto-resistance effect element 109 of the first comparative example, and decreases by 20%.

And the MR variation ratio in the magneto-resistance effect element 101a is 14% and is high by 13% than that in the magneto-resistance effect element 109 of the first comparative example.

As described above, according to the method for manufacturing a magneto-resistance effect element according to this example, the amount of oxygen impurities in the conductive portion 162 is decreased, and the CCP-CPP type magneto-resistance effect element having high MR variation ratio can be obtained.

By the way, in U.S. Pat. No. 6,033,584, a technique in which copper oxide is treated with hydrogen plasma and removed is disclosed, but in this technique, only the treatment with hydrogen plasma is performed, and this is not the combination of the first treatment (oxidation treatment) using an oxygen gas and the second treatment (reduction treatment) using a hydrogen gas like the method for manufacturing a magneto-resistance effect element according to this embodiment, and therefore, this technique is essentially different from this embodiment. That is, only by reduction treatment, from the first metallic film 16a and the second metallic film 16b, the insulating layer 161 and the conductive portion 162 cannot be formed, but only by the combination of the first treatment (oxidation treatment) using an oxygen gas and the second treatment (reduction treatment) using a hydrogen gas, the insulating layer 161 and the conductive portion 162 of high purity can be formed.

As described above, the method for manufacturing a magneto-resistance effect element according to this embodiment includes the first step of forming a film to be a base material of the spacer layer 16, a second step of performing the first treatment using gas including oxygen on the film, and a third step of performing the second treatment using a gas including hydrogen on the film submitted to the first treatment. In the above description, the gas including oxygen is a gas including at least any one of oxygen molecules, oxygen atoms, oxygen ions, oxygen plasma, and oxygen radicals, and, for example, this treatment is by the oxygen ion beam 92 but the treatment by oxygen plasma is also possible. The gas including hydrogen can include at least any one of hydrogen molecules, hydrogen atoms, hydrogen ions, hydrogen plasma, and hydrogen radicals based on hydrogen. Moreover, instead of hydrogen (H) gas, deuterium (D) gas may be used. In the case of deuterium, the effect of reduction is higher than that of hydrogen gas. The deuterium gas used in this embodiment represents a gas including at least one of deuterium molecules, deuterium atoms, deuterium ions, deuterium plasma, and deuterium radicals. Hereinafter, the example using hydrogen gas will be described in the following explanation, but hydrogen may be replaced by deuterium.

As another example according to this embodiment, the film submitted to the first treatment was exposed to hydrogen as the third step of performing the second treatment (Step S130). Also in this case, a reduction treatment was performed and the MR variation ratio was increased to 14%, which is the same value as the value for the treatment by using hydrogen plasma and Ar ion beam. Further, the film submitted to the first treatment may be exposed to deuterium gas and the MR variation ratio can be improved in the same way.

An example of the configuration of a magneto-resistance effect element to which the method for manufacturing a magneto-resistance effect element according to the embodiment of this invention is applied will be described by referring FIG. 2.

The bottom electrode 11 functions as an electrode for flowing a current in the direction perpendicular to the spin valve film. The current can be flowed through the spin valve film in the direction perpendicular to the film surface thereof by applying a voltage between the bottom electrode 11 and the top electrode 20. The change in resistance of the spin valve film originated from the magneto-resistance effect can be detected by utilizing the current. In other words, the magnetization detection can be realized by the current flow. The bottom electrode 11 is made of a metallic layer with a relatively small electric resistance for flowing the current to the magneto-resistance effect element sufficiently. For example NiFe, Cu or the like are used for the bottom electrode.

The underlayer 12 may be composed of a buffer layer 12a (not shown) and a seed layer 12b (not shown). The buffer layer 12a can be employed for the compensation of the surface roughness of the bottom electrode 11. The seed layer 12b can be employed for controlling the crystalline orientation and the crystal grain size of the spin valve film to be formed on the underlayer 12.

The buffer layer 12a may be made of Ta, Ti, W, Zr, Hf, Cr or an alloy thereof. The thickness of the buffer layer 12a is preferably set within 2 to 10 nm, more preferably set within 3 to 5 nm. If the buffer layer 12a is formed too thin, the buffer layer 12a can exhibit the inherent buffering effect. If the buffer layer 12a is formed too thick, the DC resistance not contributing to the MR variation may be increased. If the seed layer 12b can exhibit the buffering effect, the buffer layer 12a may be omitted. In a preferable example, the buffer layer 12a is made of a Ta layer with a thickness of 3 nm.

The seed layer 12b may be made of any material controllable for the crystalline orientation of (a) layer(s) to be formed thereon. For example, the seed layer 12b may be made preferably of a metallic layer with an fcc-structure (face-centered cubic structure), an hcp-structure (hexagonal close-packed structure) or a bcc-structure (body-centered cubic structure). Concretely, the seed layer 12b may be made of Ru with hcp-structure or NiFe with fcc-structure so that the crystalline orientation of the spin valve film to be formed thereon can be rendered an fcc (111) faced orientation. In this case, the crystalline orientation of the pinning layer 13 (e.g., made of PtMn) can be rendered an fct-structure (face-centered tetragonal structure)-regulated orientation or a bcc (110) faced orientation. Moreover, Cr, Zr, Ti, Mo, Nb, W or an alloy layer thereof can be used.

In order to exhibit the inherent seeding function of the seed layer 12b of enhancing the crystalline orientation sufficiently, the thickness of the seed layer 12b is set preferably within 1 to 5 nm, more preferably within 1.5 to 3 nm. In a preferable example, the seed layer 12b may be made of a Ru layer with a thickness of 2 nm.

The crystalline orientation for the spin valve film and the pinning layer 13 can be measured by means of X-ray diffraction. For example, the FWHMs (full width at half maximum) in X-ray rocking curve of the fcc (111) peak of the spin valve film, the fct (111) peak or the bcc (110) peak of the pinning layer 13 (PtMn) can be set within a range of 3.5 to 6 degrees, respectively under good crystallinity. The dispersion of the orientation relating to the spin valve film and the pinning layer can be recognized by means of diffraction spot using cross section TEM.

The seed layer 12b may be made of a NiFe-based alloy (e.g., $Ni_XFe_{100-X}$: X=90 to 50%, preferably 75 to 85%) layer of a NiFe-based non-magnetic (($Ni_XFe_{100-X})_{100-Y}X_Y$: X=Cr, V, Nb, Hf, Zr, Mo)) layer. In the latter case, the addition of the third element "X" renders the seed layer 12b non-magnetic. The crystalline orientation of the seed layer 12b of the NiFe-based alloy can be enhanced easily so that the FWHM in X-ray rocking curve can be rendered within a range of 3-5 degrees.

The seed layer 12b functions not only as the enhancement of the crystalline orientation, but also as the control of the crystal grain size of the spin valve film. Concretely, the crystal grain size of the spin valve film can be controlled within a range of 5 to 40 nm so that the fluctuation in performance of the magneto-resistance effect element can be prevented, and thus, the higher MR variation ratio can be realized even though the magneto-resistance effect element is downsized.

The crystal grain size of the spin valve film can be determined on the crystal grain size of the layer formed on the seed layer 12b by means of cross section TEM. In the case of a bottom type spin valve film where the pinning layer 14 is located below the spacer layer 16, the crystal grain size of the spin valve film can be determined on the crystal grain size of the pinning layer 13 (antiferromagnetic layer) or the pinned layer 14 (fixed magnetization layer) to be formed on the seed layer 12b.

With a reproducing head in view of high recording density, the element size is set to 100 nm or below, for example. Therefore, if the crystal grain size is set larger for the element size, the element characteristics may be fluctuated. In this point of view, it is not desired that the crystal grain size of the spin valve film is set larger than 40 nm. Concretely, the crystal grain size of the spin valve film is set preferably within 5 to 40 nm, more preferably within 5 to 20 nm.

Too large crystal grain size may cause the decrease of the number of crystal grain per element surface so as to cause fluctuation in characteristics of the reproducing head. With the CCP-CPP element forming a current confining path, it is not desired to increase the crystal grain size than a prescribed grain size. In contrast, too small crystal grain size may deteriorate the crystalline orientation. In this point of view, it is required that the crystal grain size is determined in view of the upper limited value and the lower limited value, e.g., within a range of 5 to 20 nm.

With the use of MRAM, however, the element size may be increased to 100 nm or over so that the crystal grain size can be increased to about 40 nm without the above-mentioned problem. Namely, if the seed layer 12b is employed, the crystal grain size may be increased than the prescribed grain size.

In order to set the crystal grain size within 5 to 20 nm, the seed layer 12b may be made of a Ru layer with a thickness of 2 nm or a NiFe-based non-magnetic (($Ni_XFe_{100-X})_{100-Y}X_Y$: X=Cr, V, Nb, Hf, Zr, Mo, preferably y=0 to 30%)) layer.

In contrast, in the case that the crystal grain size is increased more than 40 nm and thus, is rendered coarse, the content of the third additive element is preferably increased more than the value described above. For example, with NiFeCr alloy, the content of Cr is preferably set within 35 to 45% so as to set the composition of the NiFeCr alloy to the composition exhibiting intermediate phase structure between the fcc-structure and the bcc-structure. In this case, the resultant NiFeCr layer can have the bcc-structure.

As described above, the thickness of the seed layer 12b is set preferably within 1 to 5 nm, more preferably within 1.5 to 3 nm. Too thin seed layer 12b may deteriorate the crystalline orientation controllability. In contrast, too thick seed layer 12b may increase the DC resistance of the element and rough the interface for the spin valve film.

The pinning layer 13 functions as applying the unidirectional anisotropy to the ferromagnetic layer to be the pinned layer 14 on the pinning layer 13 and fixing the magnetization of the pinned layer 14. The pinning layer 13 may be made of an antiferromagnetic material such as PtMn, PdPtMn, IrMn, RuRhMn, FeMn and NiMn. In view of the use of the element as a high density recording head, the pinning layer 13 is preferably made of IrMn because the IrMn layer can apply the unidirectional anisotropy to the pinned layer 14 in comparison with the PtMn layer even though the thickness of the IrMn layer is smaller than the thickness of the PtMn layer. In this point of view, the use of the IrMn layer can reduce the gap width of the intended element for high density recording.

In order to apply the unidirectional anisotropy with sufficient intensity, the thickness of the pining layer 13 is appropriately controlled. In the case that the pinning layer 13 is made of PtMn or PdPtMn, the thickness of the pinning layer 13 is set preferably within 8 to 20 nm, more preferably within 10 to 15 nm. In the case that the pinning layer 13 is made of IrMn, the unidirectional anisotropy can be applied even though the thickness of the pinning layer 13 of IrMn is set smaller than the thickness of the pinning layer 13 of PtMn. In this point of view, the thickness of the pinning layer 13 of IrMn is set preferably within 3 to 12 nm, more preferably within 4 to 10 nm. In a preferred embodiment, the thickness of the IrMn pinning layer 13 is set to 7 nm.

The pinning layer 13 may be made of a hard magnetic layer instead of the antiferromagnetic layer. For example, the pinning layer 13 may be made of CoPt (Co=50 to 85%), ($CO_XPt_{100-X})_{100-Y}Cr_Y$: X=50 to 85%, Y=0 to 40%) or FePt (Pt=40 to 60%). Since the hard magnetic layer has a smaller specific resistance, the DC resistance and the surface resistance RA of the element can be reduced.

In a preferred embodiment, the pinned layer 14 is formed as a synthetic pinned layer composed of the bottom pinned layer 141 (e.g., $CO_{90}Fe_{10}$ 3.5 nm), the magnetic coupling layer 142 (e.g., Ru) and the top pinned layer 143 (e.g., $(Fe_{50}CO_{50}$ 1 nm/Cu 0.25 nm)×2/$Fe_{50}CO_{50}$ 1 nm). The pinning layer 13 (e.g., IrMn layer) is coupled via magnetic exchange with the bottom pinned layer 141 formed on the pinning layer 13 so as to apply the unidirectional anisotropy to the bottom pinned layer 141. The bottom pinned layer 141 and the top pinned layer 143 which are located under and above the magnetic coupling layer 142, respectively, are strongly magnetically coupled with one another so that the direction of magnetization in the bottom pinned layer 141 becomes anti-paralleled to the direction of magnetization in the top pinned layer 143.

The bottom pinned layer 141 may be made of $Co_xFe_{100-x}$ alloy (x=0 to 100), $Ni_xFe_{100-x}$ (X=0 to 100) or an alloy thereof containing a non magnetic element. The bottom pinned layer 141 may be also made of a single element such as Co, Fe, Ni or an alloy thereof.

It is desired that the magnetic thickness (saturated magnetization Bs×thickness t (Bs·t) of the bottom pinned layer 141 is set almost equal to the one of the top pinned layer 143. Namely, it is desired that the magnetic thickness of the top pinned layer 143 corresponds to the magnetic thickness of the bottom pinned layer 141. For example, when the top pinned layer 143 of ($Fe_{50}CO_{50}$ 1 nm/Cu 0.25 nm)×2/$Fe_{50}CO_{50}$ 1 nm is employed, the magnetic thickness of the top pinned layer 143 is set to 2.2 T×3 nm=6.6 Tnm because the saturated magnetization of the top pinned layer 143 is about 2.2 T. When the bottom pinned layer 141 of $CO_{90}Fe_{10}$ is employed, the thickness of the bottom pinned layer 141 is set to 6.6 Tnm/1.8 T=3.66 nm for the magnetic thickness of 6.6 Tnm because the saturated magnetization of $CO_{90}Fe_{10}$ is about 1.8 T. In this point of view, it is desired that the thickness of the bottom pinned layer 141 made of $Co_{90Fe10}$ is set to about 3.6 nm. When the pinned layer 13 IrMn, it is preferable to increase the Fe concentration in the bottom pinned layer 141 from $CO_{90}Fe_{10}$.

The thickness of the bottom pinned layer 141 is preferably set within 1.5 to 4 nm in view of the magnetic strength of the unidirectional anisotropy relating to the pinning layer 13 (e.g., IrMn layer) and the magnetic strength of the antiferromagnetic coupling between the bottom pinned layer 141 and the top pinned layer 143 via the magnetic coupling layer 142 (e.g., Ru layer). Too thin bottom pinned layer 141 causes the decrease of the MR variation ratio. In contrast, too thick bottom pinned layer 141 causes the difficulty of obtaining the unidirectional anisotropy magnetic field requiring for the operation of the element. In a preferred embodiment, the bottom pinned layer 141 may be made of a $Co_{75}Fe_{25}$ layer with a thickness of 3.6 nm.

The magnetic coupling layer 142 (e.g., Ru layer) causes the antiferromatic coupling between the bottom pinned layer 141 and the top pinned layer 143 which are located under and above the magnetic coupling layer 142. In the case that the magnetic coupling layer 142 is made of the Ru layer, the thickness of the Ru layer is preferably set within 0.8 to 1 nm. Only if the antiferromagnetic coupling between the pinned layers located under and above the magnetic coupling layer 142 can be generated, the magnetic coupling layer 142 may be made of another material except Ru or the thickness of the magnetic coupling layer 142 may be varied within 0.3 to 0.6 nm instead of the thickness range of 0.8 to 1 nm. The former thickness range of 0.3 to 0.6 nm corresponds to the first peak of RKKY (Runderman-Kittel-Kasuya-Yoshida), and the latter thickness range of 0.8 to 1 nm corresponds to the second peak of RKKY. In a preferred embodiment, the magnetic coupling layer 142 may be made of the Ru layer with a thickness of 0.9 nm so as to realize the antiferromagnetic coupling for the pinned layers stably.

The top pinned layer 143 may be made of ($Fe_{50}CO_{50}$ 1 nm/Cu 0.25 nm)×2/$Fe_{50}CO_{50}$ 1 nm. The top pinned layer 143 composes the spin dependent scattering unit. The top pinned layer 143 can contribute directly to the MR effect, and thus, the material and thickness of the top pinned layer 143 are important so as to realize a high MR variation ratio. The magnetic material of the top pinned layer 143 to be positioned at the interface for the CCP-NOL layer 16 is important in view of the contribution of the spin dependent interface scattering.

Then, the effect/function of the top pinned layer 143 of the $Fe_{50}CO_{50}$ layer with bcc-structure will be described. In this case, since the spin dependent interface scattering is enhanced, the MR variation ratio can be enhanced. As the FeCo-based alloy with bcc-structure, a $CO_xFe_{100-X}$ alloy (X=30 to 100) or a similar CoFe-based alloy containing an additive element can be exemplified. Among them, a $Fe_{40}CO_{60}$ alloy through a $Fe_{60}CO_{40}$ alloy may be employed in view of the above-described requirements.

In the case that the top pinned layer 143 is made of the magnetic layer with bcc-structure easily exhibiting the high MR variation ratio, the thickness of the top pinned layer 143 is preferably set to 1.5 nm or over so as to maintain the bcc-structure thereof stably. Since the spin valve film is made mainly of a metallic material with fcc-structure or fct-structure, only the top pinned layer 143 may have the bcc-structure. In this point of view, too thin top pinned layer 143 cannot maintain the bcc-structure thereof stably so as not to obtain the high MR variation ratio.

Herein, the top pinned layer 143 is made of the $Fe_{50}CO_{50}$ layers and the extremely thin Cu layers. The total thickness of the $Fe_{50Co50}$ layers is 3 nm and each Cu layer is formed on the corresponding $Fe_{50Co50}$ layer with a thickness of 1 nm. The thickness of the Cu layer is 0.25 nm and the total thickness of the top pinned layer 143 is 3.5 nm.

It is desired that the thickness of the top pinned layer 143 is set to 5 nm or below so as to generate a large pinning (fixing) magnetic field. In view of the large pinning (fixing) magnetic field and the stability of the bcc-structure in the top pinned layer 143, the thickness of the top pinned layer 143 is preferably set within 2 to 4 nm.

The top pinned layer 143 may be made of a $CO_{90}Fe_{10}$ alloy with fcc-structure or a Co alloy with hcp-structure which used to be widely employed for a conventional magneto-resistance effect element, instead of the magnetic material with the bcc-structure. The top pinned layer 143 can be made of a single element such as Co, Fe, Ni or an alloy containing at least one of Co, Fe, Ni. In view of the high MR variation ratio of the top pinned layer 143, the FeCo alloy with the bcc-structure, the Co alloy containing Co element of 50% or over and the Ni alloy containing Ni element of 50% or over are in turn preferable.

In this embodiment, the top pinned layer 143 is made of the magnetic layers (FeCo layers) and the non magnetic layers (extremely thin Cu layers). In this case, the top pinned layer 143 can enhance the spin dependent scattering effect which is also called as a "spin dependent bulk scattering effect", originated from the extremely thin Cu layers.

The spin dependent bulk scattering effect is utilized in pairs for the spin dependent interface scattering effect. The spin dependent bulk scattering effect means the occurrence of an MR effect in a magnetic layer and the spin dependent interface scattering effect means the occurrence of an MR effect at an interface between a spacer layer and a magnetic layer.

Hereinafter, the enhancement of the bulk scattering effect of the stacking structure of the magnetic layer and the non magnetic layer will be described. With the CCP-CPP element, since a current is confined in the vicinity of the spacer layer 16, the resistance in the vicinity of the spacer layer 16 contributes the total resistance of the magneto-resistance effect element. Namely, the resistance at the interface between the spacer layer 16 and the magnetic layers (pinned layer 14 and the free layer 18) contributes largely to the magneto-resistance effect element. That means the contribution of the spin dependent interface scattering effect becomes large and important in the CCP-CPP element. The selection of magnetic material located at the interface for the CCP-NOL layer 16 is important in comparison with a conventional CPP element. In this point of view, the pinned layer 143 is made of the FeCo alloy with the bcc-structure exhibiting the large spin dependent interface scattering effect as described above.

However, it may be that the spin dependent bulk scattering effect should be considered so as to develop the MR variation ratio. In view of the development of the spin dependent bulk scattering effect, the thickness of the thin Cu layer is set preferably within 0.1 to 1 nm, more preferably within 0.2 to 0.5 nm. Too thin Cu layer cannot develop the spin dependent bulk scattering effect sufficiently. Too thick Cu layer may reduce the spin dependent bulk scattering effect and weaken the magnetic coupling between the magnetic layers via the non magnetic Cu layer, which the magnetic layers sandwiches the non magnetic Cu layer, thereby deteriorating the property of the pinned layer 14. In a preferred embodiment, in this point of view, the thickness of the non-magnetic Cu layer is set to 0.25 nm.

The non-magnetic layer sandwiched by the magnetic layers may be made of Hf, Zr, Ti instead of Cu. In the case that the pinned layer 14 contains the non-magnetic layer(s), the thickness of the one magnetic layer such as a FeCo layer which is separated by the non-magnetic layer is set preferably within 0.5 to 2 nm, more preferably within 1 to 1.5 nm.

In the above embodiment, the top pinned layer 143 is constituted of the alternately stacking structure of FeCo layer and Cu layer, but may be made of an alloyed layer of FeCo and Cu. The composition of the resultant FeCoCu alloy may be set to $((Fe_XCo_{100-X})_{100-Y}Cu_Y, X=30$ to $100\%, Y=3$ to $15\%)$, but set to another composition range. The third element to be added to the main composition of FeCo may be selected from Hf, Zr, Ti, Al instead of Cu.

The top pinned layer 143 may be also made of a single element such as Co, Fe, Ni or an alloy thereof. In a simplified embodiment, the top pinned layer 143 may be made of an $Fe_{90}CO_{10}$ layer with a thickness of 2 to 4 nm, as occasion demands, containing a third additive element.

Then, the film structure in the extended spacer layer will be described. The bottom metallic layer 15 is a remained layer used as supplier for the formation of the conductive portion 162 in the process described later. It is not required that the bottom metallic layer 15 remains after the process.

The spacer layer (CCP-NOL) 16 includes the insulating layer 161 and the conductive portion 162. As already mentioned, the spacer layer 16, the bottom metallic layer 15 and the top metallic layer 17 are treated as the extended spacer layer 16s.

The insulating layer 161 is made of oxide, oxynitride or the like. For example, the insulating layer 161 may be made of an $Al_2O_3$ amorphous structure or an MgO crystalline structure. In order to exhibit the inherent function of the spacer layer, the thickness of the insulating layer 161 is set preferably within 1 to 5 nm, more preferably within 1.5 to 4.5 nm.

The insulating layer 161 may be made of a typical insulating material such as $Al_2O_3$-based material, as occasion demands, containing a third additive element such as Ti, Hf, Mg, Zr, V, Mo, Si, Cr, Nb, Ta, W, B, C, V. The content of the additive element may be appropriately controlled within 0 to 50%. In a preferred embodiment, the insulating layer 161 is made of an $Al_2O_3$ layer with a thickness of about 2 nm.

The insulating layer 161 may be made of Ti oxide, Hf oxide, Mg oxide, Zr oxide, Cr oxide, Ta oxide, Nb oxide, Mo oxide, Si oxide or V oxide instead of the Al oxide such as the $Al_2O_3$. In the use of another oxide except the Al oxide, a third additive element such as Ti, Hf, Mg, Zr, V, Mo, Si, Cr, Nb, Ta, W, B, C, V may be added to the oxide as occasion demands. The content of the additive element may be appropriately controlled within 0 to 50%.

The insulating layer 161 may be also made of an oxynitride containing, as a base material, Al, Si, Hf, Ti, Mg, Zr, V, Mo, Nb, Ta, W, B, C only if the insulating layer 161 can exhibit the inherent insulating function.

The conductive portion 162 functions as a path to flow a current in the direction perpendicular to the film surface of the spacer layer 16 and then, confining the current. The conductive portion 162 (CCP) may be made of Au, Ag, Ni, Co, Fe or an alloy containing at least one from the listed elements instead of Cu. In a preferred embodiment, the conductive portion 162 is made of a Cu alloy. The conductive portion 162 may be made of an alloy layer of CuNi, CuCo or CuFe. Herein, the content of Cu in the alloy is set preferably to 50% or over in view of the enhancement of the MR variation ratio and the reduction of the interlayer coupling field, Hin between the pinned layer 14 and the free layer 18.

The top metallic layer 17 is a portion of the extended spacer layer 16s. It functions as a barrier layer protecting the oxidization of the free layer 18 to be formed thereon through the contact with the oxide of the CCP-NOL layer 16 so that the crystal quality of the free layer 18 cannot be deteriorated. For example, when the insulating layer 161 is made of an amorphous material (e.g., $Al_2O_3$), the crystal quality of a metallic layer to be formed on the layer 161 may be deteriorated, but when a layer (e.g., Cu layer) to develop the crystal quality of fcc-structure is provided (under the condition that the thickness of the metallic layer is set to 1 nm or below), the crystal quality of the free layer 18 can be remarkably improved.

It is not always required to provide the top metallic layer 17 dependent on the kind of material in the extreme thin oxide layer 16 and/or the free layer 18. Moreover, if the annealing condition is optimized and the appropriate selection of the materials of the insulating layer 161 of the thin oxide layer 16 and the free layer 18 is performed, the deterioration of the crystal quality of the free layer 18 can be prevented, thereby omitting the metallic layer 17 of the spacer layer 16.

In view of the manufacturing yield of the magneto-resistance effect element, it is desired to form the top metallic layer 17 on the spacer layer 16. In a preferred embodiment, the top metallic layer 17 can be made of a Cu layer with a thickness of 0.5 nm.

The top metallic layer 17 may be made of Au, Ag, Ru or the like instead of Cu. Moreover, it is desired that the top metallic layer 17 is made of the same material as the material of the conductive portion 162 of the spacer layer 16. If the top metallic layer 17 is made of a material different from the material of the conductive portion 162, the interface resistance between the layer 17 and the path 162 is increased, but if the top metallic layer 17 is made of the same material as the material of the conductive portion 162, the interface resistance between the layer 17 and the path 162 is not increased.

The thickness of the top metallic layer 17 is set preferably within 0 to 1 nm, more preferably within 0.1 to 0.5 nm. Too thick top metallic layer 17 may extend the current confined through the spacer layer 16 thereat, resulting in the decrease of the MR variation ratio due to the insufficient current confinement.

The free layer 18 is a ferromagnetic layer of which the direction of magnetization is varied commensurate with the external magnetic field. For example, the free layer 18 is made of a double-layered structure of $Co_{90}Fe_{10}$ 1 nm/$Ni_{83}Fe_{17}$ 3.5 nm. In this case, in order to realize the high MR variation ratio, the selection of magnetic material of the free layer 18 in the vicinity of the spacer 16, that is, at the interface therebetween is important. In this case, it is desired that the $CO_{90}Fe_{10}$ layer is formed at the interface between the free layer 18 and the spacer layer 16. The free layer 18 may be made of a single $CO_{90}Fe_{10}$ layer with a thickness of 4 nm without a NiFe layer or a triple-layered structure of CoFe/NiFe/CoFe.

Then, the free layer 18 is made of an alternately stacking structure of CoFe layers or Fe layers with a thickness of 1 to 2 nm and extremely thin Cu layers with a thickness of 0.1 to 0.8 nm.

In the case that the spacer layer 16 is made of the Cu layer, it is desired that the FeCo layer with bcc-structure is employed as the interface material thereof for the spacer layer 16 so as to enhance the MR variation ratio in the same manner as the pinned layer 14. Moreover, in order to improve the stability in the bcc structure, a thickness not smaller than 1 nm is preferable and a thickness not smaller than 1.5 nm is more preferable. The increase of the thickness in bcc structure brings about an increase of coercivity and magnetostriction. Therefore, the thick bcc structure is difficult to be used for the free layer. To solve this problem, it is available to adjust the composition and film thickness of laminating NiFe alloy. In a preferred embodiment, a $CO_{60}Fe_{40}$ 2 nm/$Ni_{95}Fe_5$ 3.5 nm may be employed.

The cap layer 19 functions as protecting the spin valve film. The cap layer 19 may be made of a plurality of metallic layers, e.g., a double-layered structure of Cu 1 nm/Ru 10 nm. The layered turn of the Cu layer and the Ru layer may be switched so that the Ru layer is located in the side of the free layer 18. In this case, the thickness of the Ru layer is set within 0.5 to 2 nm. The exemplified structure is particularly desired for the free layer 19 of NiFe because the magnetostriction of the interface mixing layer formed between the free layer 18 and the cap layer 19 can be lowered due to the non-solution between Ru and Ni.

When the cap layer 19 is made of the Cu/Ru structure or the Ru/Cu structure, the thickness of the Cu layer is set within 0.5 to 10 nm and the thickness of the Ru layer is set smaller, e.g., within 0.5 to 5 nm due to the large specific resistance.

The cap layer 19 may be made of another metallic layer instead of the Cu layer and/or the Ru layer. The structure of the cap layer 19 is not limited only if the cap layer 19 can protect the spin valve film. If the protective function of the cap layer 19 can be exhibited, the cap layer 19 may be made of still another metal. Attention should be paid to the cap layer because the kind of material of the cap layer may change the MR variation ratio and the long reliability. In view of the stable MR variation ratio and long reliability, the Cu layer and/or the Ru layer is preferable for the cap layer.

The top electrode 20 functions as flowing a current through the spin valve film in the direction perpendicular to the film surface of the spin valve film. The intended current can be flowed through the spin valve film in the direction perpendicular to the film surface by applying a voltage between the top electrode 20 and the bottom electrode 11. The top electrode 20 may be made of a material with smaller resistance (e.g., Cu, Au, NiFe or the like).

The method for manufacturing a magneto-resistance effect element according to this embodiment can be applied to any one of the magneto-resistance effect elements having such a configuration.

Next, the third step (Step S130) in the method for manufacturing a magneto-resistance effect element according to this embodiment, namely, the specific example of the second treatment using hydrogen gas will be described.

The second treatment includes exposure to hydrogen gas. That is, by IAO illustrated in FIG. 4C, after forming CCP-NOL, exposure to hydrogen gas is performed. By the exposure to hydrogen gas, the oxide in the second metallic film 16b is reduced. It is desirable that the flow rate of hydrogen gas is from 100 sccm to 1000 sccm inclusive. If lower than 100 sccm, reduction of the oxide in the first metallic film 16a is insufficient, and if higher than 1000 sccm, the reduction of the oxide of the second metallic film 16b to be the insulating layer 161 begins.

Moreover, as the second treatment, the following various methods can be used.

Figure 7A:
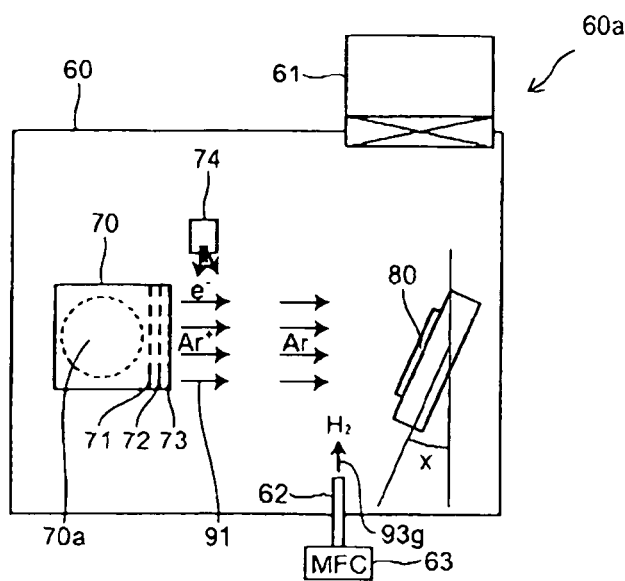
FIGS. 7A, 7B and 7C are schematic views illustrating configurations of parts in the method for manufacturing according to the first embodiment of this invention.
Figure 7B:
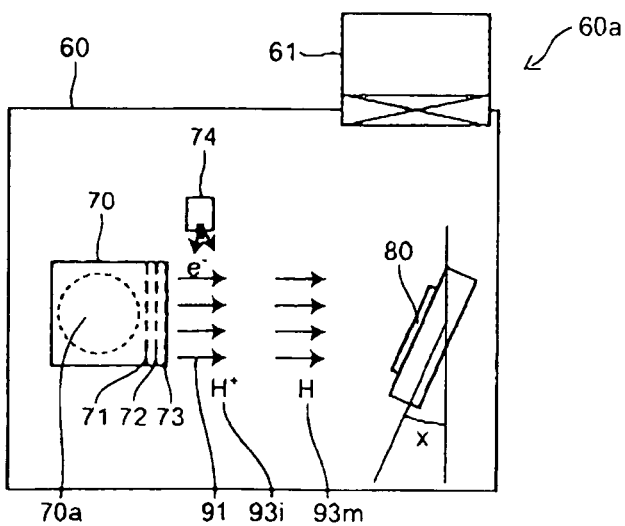
Figure 7C:
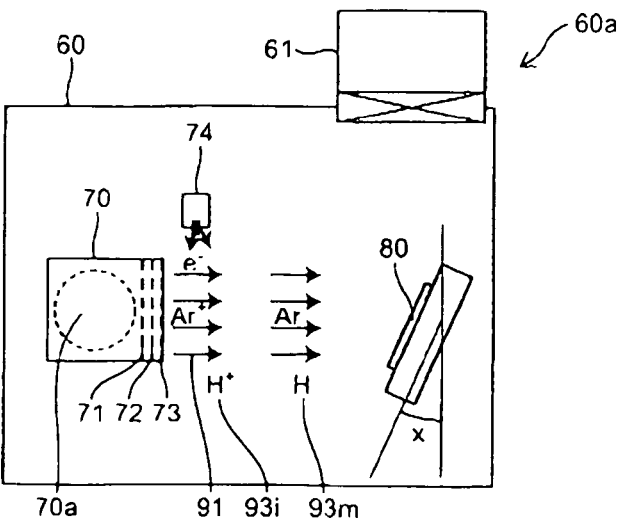

FIGS. 7A to 7C are schematic views illustrating configurations of parts in the method for manufacturing the magneto-resistance effect element according to the first embodiment of this invention.

That is, these figures illustrate three configurations of treatment apparatuses that can be used for the second treatment in the method for manufacturing a magneto-resistance effect element according to this embodiment.

FIG. 7A is a configuration in which rare gas ion beam or plasma is irradiated in exposing hydrogen gas as the second treatment.

As shown in FIG. 7A, the treatment apparatus 60a has a vacuum chamber 60 connected to a vacuum pump 61, and inside of the vacuum chamber 60 is made to be high vacuum. In the vacuum chamber 60, the object to be treated 80p (in this case, the laminated structure of the layer 14a including the film to be pinned layer 14 and the first metallic film 16a and the second metallic film 16b that are submitted to the first treatment) is placed. And, in the vacuum chamber 60, a plasma 70a generated from an ion source 70 is accelerated by grids 71, 72 and 73. In this example, Ar ion is used, and thereby Ar ion beam 91 is generated. In this case, neutralization is performed by a neutralizer 74. On the other hand, a hydrogen gas 93g controlled by mass flow controller (MFC) 63 is introduced through a supply pipe 62 into the vacuum chamber 60. And, in an atmosphere of the hydrogen gas 93g, the Ar ion beam 91 is irradiated to the object to be treated 80. In the above case, Ar plasma may be irradiated to the object to be treated 80 instead of the Ar ion beam 91.

As described above, in the exposure to hydrogen gas, the object to be treated 80 is provided with energy by irradiating rare gas ion beam or plasma, and reduction can be promoted by cutting oxygen bonds.

Moreover, the hydrogen gas 93g is ionized and the ion can be irradiated to the object to be treated 80.

As shown in FIG. 7B, the hydrogen gas 93g is introduced into the ion source 70 and plasma-activated, and thereby, monomer hydrogen 93m can be obtained. Here, the monomer hydrogen 93m represents a form of hydrogen existing as atom by comparison to the gas molecule. The monomer hydrogen 93m may be ion having charge or electrically neutral atom. To this hydrogen plasma, voltage is applied and accelerated by the grids 71, 72, 73, and thereby, ion beam of hydrogen ion 93i is taken out. The hydrogen ion beam 93 having charge is electrically neutralized by the neutralizer 74 and reaches the object to be treated 80. Thereby, efficiency of reduction is improved. This is because the reduction of the oxide is hard to be promoted by hydrogen molecule ($H_2$) but comes to be easily promoted by the monomer hydrogen (H) 93m.

In this case, it is preferable that the flow rate of the hydrogen gas introduced into the ion source is from 1 sccm to 100 sccm inclusive. If lower than 1 sccm, the reduction of the oxide in the conductive portion 162 is insufficient, and if higher than 100 sccm, the reduction of the oxide of the second metallic film 16b to be the insulating layer 161 begins.

In this method, because the reduction efficiency is high, the appropriate flow rate is lower than that of the case of the exposure to the hydrogen molecule gas. It is desirable that the voltage applied to the grids 71, 72 and 73 is from 0 V to 50 V inclusive. The case of 0 V is the state in which hydrogen Ion 93i getting out from the grids is utilized. In the case of RF plasma, the power is from 10 W to 1000 W inclusive. The reason why weak voltage or RF power is used as described above is to prevent CCP-NOL from being broken by reducing $Al_2O_3$ to be the insulating layer 161.

Furthermore, the hydrogen ion 93i and the rare gas ion can be irradiated to the object to be treated 80 at the same time.

As shown in FIG. 7C, the hydrogen ion 93i or the monomer hydrogen 93m and the rare gas ion (Ar ion beam 91) are irradiated to the object to be treated 80 at the same time, and thereby, the efficiency of reduction can be further improved.

In this case, it is preferable that the flow rate of the hydrogen gas introduced into the ion is from 1 sccm to 100 sccm inclusive. If lower than 1 sccm, the reduction of the oxide in the conductive portion 162 is insufficient, and if higher than 100 sccm, the reduction of the oxide of the second metallic film 16b to be the insulating layer 161 begins.

Also, in this method, because the reduction efficiency is high, the appropriate flow amount is smaller than that of the case of the exposure to the hydrogen molecule gas. It is desirable that the voltage applied to the grids 71, 72 and 73 is from 0 V to 50 V inclusive. The case of 0 V is the state in which hydrogen ion 93i getting out from the grids is utilized. In the case of RF plasma, the power is from 10 W to 1000 W inclusive. The reason why weak voltage or RF power as described above is used is to prevent CCP-NOL from being broken by reducing $Al_2O_3$.

In the above-described second treatment using hydrogen gas, the treatment may be performed with heating the insulating layer 161 and the conductive portion 162. During heating the insulating layer 161 and the conductive portion 162, the exposure to the hydrogen gas 93g or treatment of various types of hydrogen ion 93i or hydrogen plasma, which has been explained with respect to the FIGS. 7A to 7C. Thereby, the reduction efficiency is enhanced and the treatment can be more efficiently performed.

As described previously, by the second treatment is performed with heating the first metallic film 16a and the second metallic film 16b, $H_2O$ generated in the first treatment using oxygen gas and the second treatment using hydrogen gas can also be removed. Furthermore, its crystallinity is improved.

The same effect as heating can also be obtained by irradiating the ion beam or the plasma of rare gas. In this case, the configuration is similar to the configuration shown in the FIG. 7C, but because the purposes are different, the flow rates of Ar gas are different. In the case of FIG. 7C performing only reduction, it is desirable that the Ar amount is 10 sccm or less. This is because the ratio of the hydrogen gas is maintained to be higher with respect to Ar so that the effect of hydrogen gas is not eliminated by Ar. By contrast, in the case of obtaining removal of $H_2O$ and the improvement of crystallinity with the reduction, the Ar amount is positively increased to be 10 sccm or more. In this case, hydrogen becomes diluted, and therefore, the adjustment is performed by changing the condition of the beam to be stronger or prolonging the time of irradiation.

After performing Step S110 to Step S130, further the Step S120 (the first treatment of the second time) may be performed. Thereby, oxidation by the first treatment and reduction by the second treatment can be adjusted. Furthermore, after the first treatment of the second time, the second treatment of the second time may be performed. As described above, after the step S110 of film formation, the combination of Step S120 and Step S130 can be repeatedly performed. Thereby, the structure of the insulating layer 161 and the conductive portion 162 can be precisely controlled.

Figure 8:
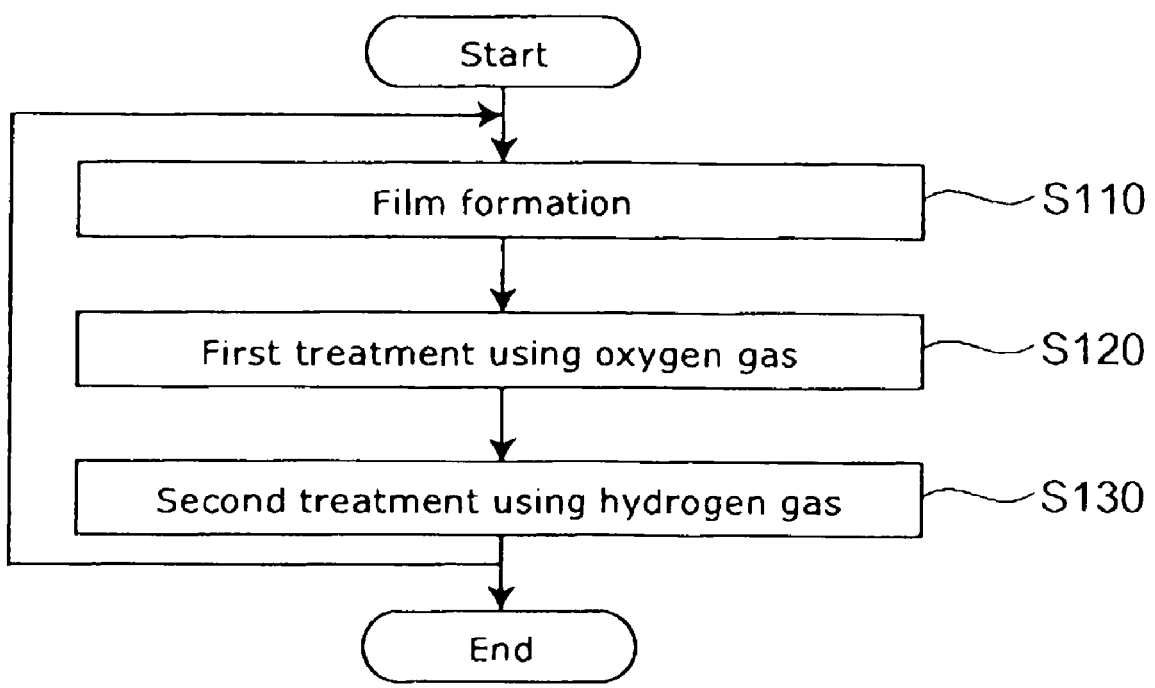
FIG. 8 is a flow chart illustrating another method for manufacturing according to the first embodiment of this invention.

FIG. 8 is a flow chart illustrating another method for manufacturing a magneto-resistance effect element according to the first embodiment of this invention.

As shown in FIG. 8, in another method for manufacturing a magneto-resistance effect element according to the first embodiment of this invention, the first step (Step S110), the second step (Step S120), and the third step (Step S130), which have been explained with respect to FIG. 1, are repeated plural times and performed.

Hereinafter, the example of the case of two repeating times will be described.

Also in this case, the second step (Step S120) may include the PIT step (Step S120a illustrated in FIG. 3) and the IAO step (Step S120b illustrated in FIG. 3).

FIGS. 9A to 9H are schematic sectional views following step sequence illustrating another method for manufacturing a magneto-resistance effect element according to a first embodiment of this invention.

Figure 9A:
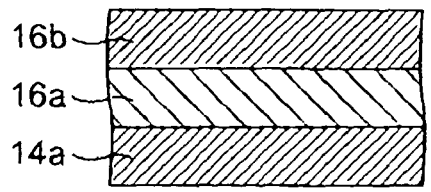
FIGS. 9A to 9H are schematic sectional views following step sequence illustrating another method for manufacturing according to a first embodiment of this invention.
Figure 9B:
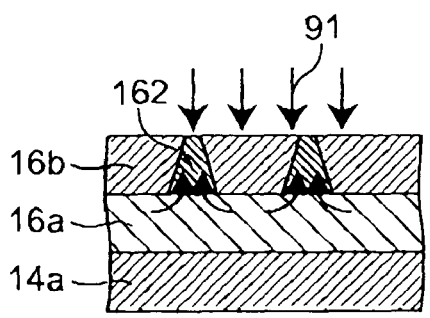
Figure 9C:
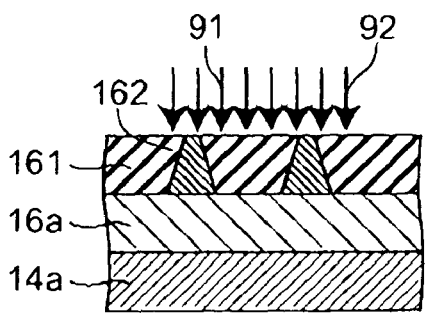
Figure 9D:
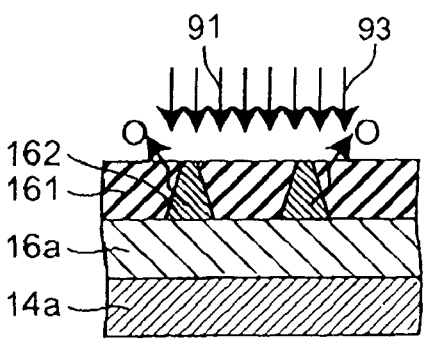

That is, FIG. 9A is a figure showing the first step, and Each of FIGS. 9B to 9H is a view showing the step following its previous step.

FIGS. 9A to 9D are the same as FIGS. 4A to 4D, and therefore, the explanation thereof will be omitted.

Figure 9E:
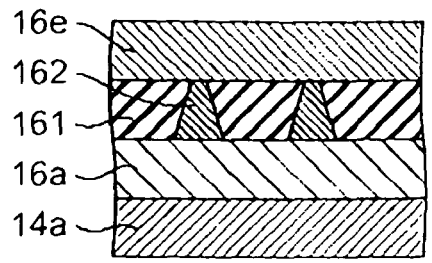

As shown in FIG. 9E, Step S110 of the second time is performed. That is, after Step S110 to Step S130 of the first time (formation of the film to be base material of the spacer layer 16, the first treatment using oxygen gas, the second treatment using hydrogen gas), the second metallic film 16e of the second layer is formed. The second metallic film 16e of the second layer is also, for example, Al. The second metallic film 16e of the second layer may be AlCu.

Then, Step S120 of the second time is performed.

Figure 9F:
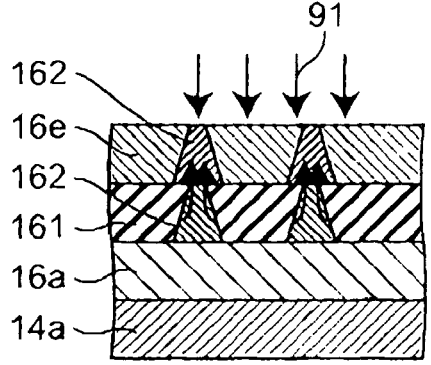

That is, as shown in FIG. 9F, PIT by the Ar ion beam 91 is performed. Thereby, the conductive portion 162 formed by the Step S110 to Step S130 of the first time are further sucked up into the second metallic film 16e of the second layer and penetrates through the second metallic film 16e of the second layer.

Figure 9G:
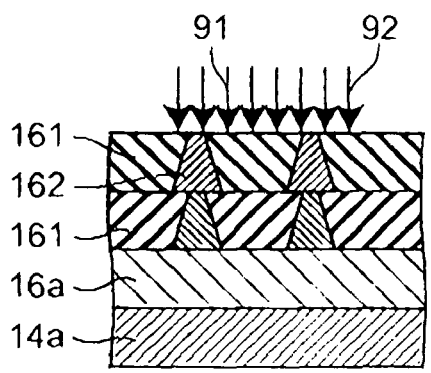

And, as shown in FIG. 9G, the second metallic film 16e of the second layer is submitted to the oxidizing treatment by IAO that is the first treatment using oxygen gas (in this case, oxygen ion beam 92). Thereby, the second metallic film 16e of the second layer that is Al is oxidized to be $Al_2O_3$ to form the insulating layer 161.

Subsequently, Step S130 of the second time is performed.

Figure 9H:
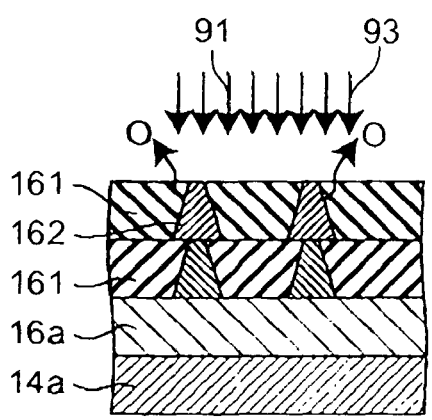

That is, as shown in FIG. 9H, the above-described film is irradiated with the hydrogen ion beam 93, and CuO generated by oxidation of the first metallic film 16a is reduced to be Cu. Also in this case, a condition in which $Al_2O_3$ to be the insulating layer 161 is not substantially reduced and CuO is reduced is appropriately selected, and thereby, the resistance of the conductive portion 162 can be decreased with substantially no adverse effect to the insulating characteristics of the insulating layer 161.

As described above, according to the method for manufacturing a magneto-resistance effect element according to this embodiment, the oxide in the conductive portion 162 generated during forming the insulating layer 161 and the conductive portion 162 is reduced, and the amount of oxygen impurities in the conductive portion 162 is decreased. And, by performing plural times of formation of the film to be the spacer layer 16, the film thickness of each of the formed films becomes thin, and thereby, the stress in the film can be relaxed. Moreover, for each of the thin films, for example, PIT and IAO (the first treatment), and the second treatment are performed, and therefore, because each of the thin films is submitted to these treatments, the structure of the film is stabilized and the film becomes dense. Furthermore, these treatments are for activating the surface and the adhesive force of the film is improved and the reliability of the magneto-resistance effect element is improved.

Also, when a thick film as the spacer layer 16 is required, the formation of the film is performed plural times, and each of the films is submitted to the above-described treatment, and thereby, with maintaining the performance, the film thickness of the spacer layer 16 can be increased.

Thereby, the CCP-CPP type magneto-resistance effect element with high reliability having high MR variation ratio can be obtained.

Second Embodiment

Figure 10:
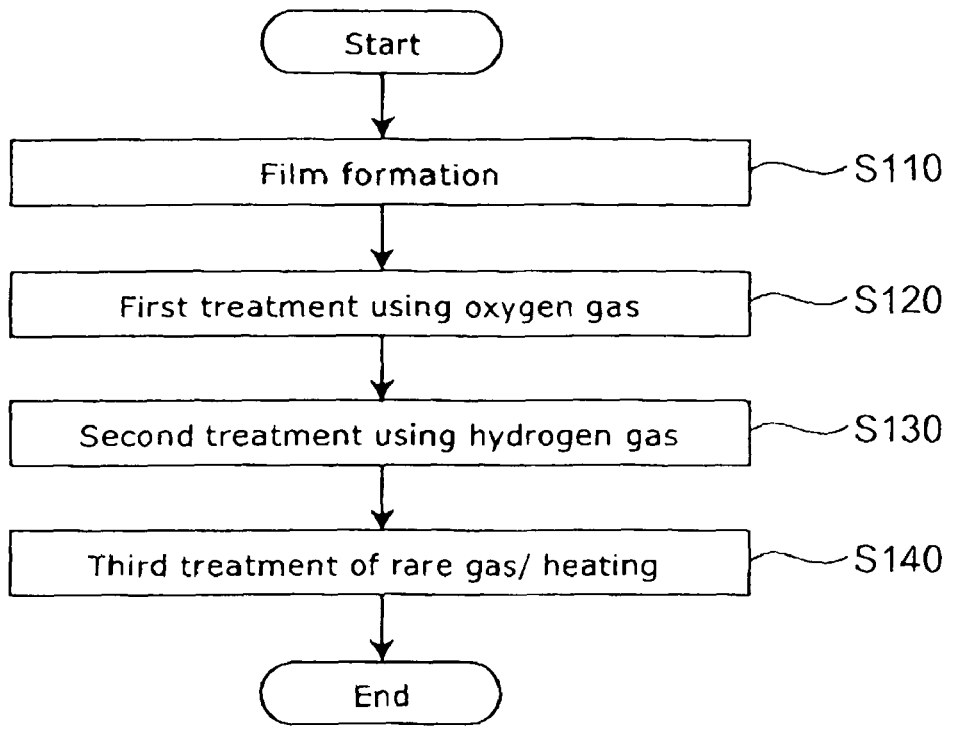
FIG. 10 is a flow chart illustrating a method for manufacturing according to a second embodiment of this invention.

FIG. 10 is a flow chart illustrating a method for manufacturing a magneto-resistance effect element according to a second embodiment of this invention.

As shown in FIG. 10, in the method for manufacturing a magneto-resistance effect element according to a second embodiment of this invention, after the first step (Step S110), the second step (Step S120) and the third step (Step S130), which are explained with respect to FIG. 1, further a fourth step (Step S140) is carried out.

Also in this step, the second step (Step S120) may include the PIT step (Step S120a illustrated in FIG. 3) and the IAO step (Step S120b illustrated in FIG. 3).

In the fourth step, the film submitted to the second treatment is submitted to the third treatment of at least any one of irradiation of rare gas ion, irradiation of rare gas plasma, and heating.

As the third treatment, the insulating layer 161 and the conductive portion 162 are submitted to, for example, irradiation of Ar ion beam or irradiation of Ar plasma. Or, as the third treatment, the insulating layer 161 and the conductive portion 162 are heated. Or, as the third treatment, during heating the insulating layer 161 and the conductive portion 162, for example, irradiation of Ar ion beam or irradiation of Ar plasma is performed.

Thereby, $H_2O$ generated by the first treatment using oxygen gas and the second treatment using hydrogen gas can be removed.

Figure 11A:
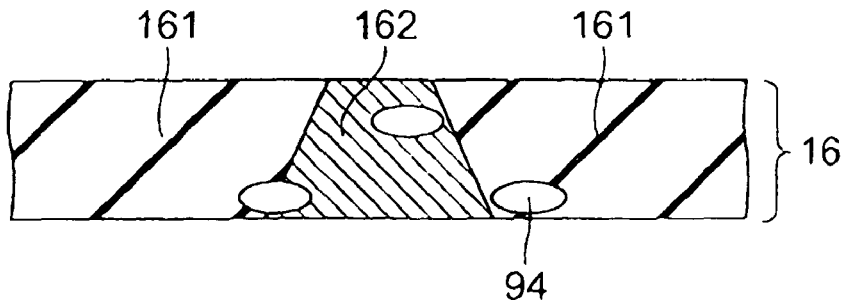
FIGS. 11A and 11B are schematic sectional views illustrating the effect of the method for manufacturing according to the second embodiment of this invention.
Figure 11B:
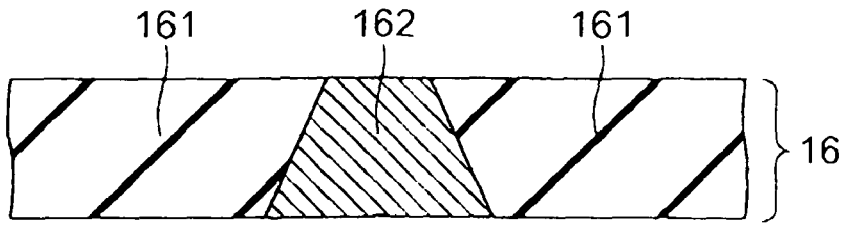

FIGS. 11A and 11B are schematic sectional views illustrating the effect of the method for manufacturing a magneto-resistance effect element according to the second embodiment of this invention.

That is, FIG. 11A illustrates the state after the second treatment, and FIG. 11B illustrates the state after the third treatment.

As shown in FIG. 11A, after the second treatment, in the insulating layer 161 and the conductive portion 162, $H_2O$ 94 generated by the first treatment using oxygen gas and the second treatment using the hydrogen gas occasionally remains. In this case, the residual $H_2O$ diffuses in the anneal step after finishing stacking all of the films and can oxidize the surrounding metallic films. The conductive portion 162 reduced in the second treatment may be reoxidized by the residual $H_2O$ in the anneal step. For preventing this, the following third treatment is performed to remove $H_2O$.

That is, as shown in FIG. 11B, by performing the third treatment of at least any one of irradiation of rare gas ion and irradiation of rare gas plasma and heating, the residual $H_2O$ can be removed. The removed $H_2O$ from the insulating layer 161 and the conductive portion 162 is exhausted through the space of the treatment chamber to the outside of the treatment chamber by the vacuum exhausting system.

Thus, by removing the residual $H_2O$ from the insulating layer 161 and the conductive portion 162, the amount of the oxygen impurities in the conductive portion 162 is decreased and the electric resistance characteristic is stabilized. Moreover, this prevents oxidization the surrounding pinned layer 14 or the free layer 18 or the bottom metallic layer 15 and the top metallic layer 17 in the extended spacer layer 16s. The oxidation of these layers not only makes increase of the specific resistance and decrease of the MR variation ratio but also decreases the adhesive force with the spacer layer 16 (CCP-NOL layer). Therefore, by removing $H_2O$ 94, the effect of lowering the surrounding resistance and improving the adhesive force can also be expected.

Moreover, by the third treatment of at least any one of irradiation of rare gas, ion and irradiation of rare gas plasma and heating, for example, crystallinity of the conductive portion 162 is improved and the resistance thereof is further decreased. Thereby, the MR variation ratio can be further improved.

As described above, for example, by heating the insulating layer 161 and the conductive portion 162 in the second treatment, the third treatment can be omitted. Also, for example, even when the insulating layer 161 and the conductive portion 162 are heated in the second treatment, if the removal of $H_2O$ 94 is insufficient, the third treatment may be performed to promote the removal of $H_2O$ 94.

Second Example

Figure 12:
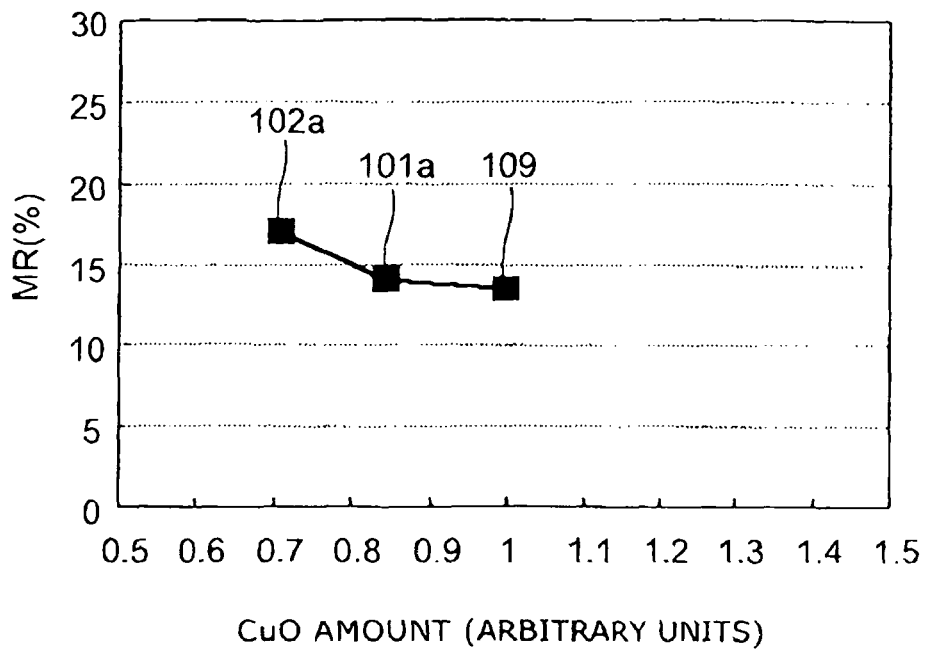
FIG. 12 is a graph illustrating characteristics of the magneto-resistance effect element by the method for manufacturing according to a second example of this invention.

FIG. 12 is a graph illustrating characteristics of the magneto-resistance effect element by the method for manufacturing a magneto-resistance effect element according to a second example of this invention.

That is, FIG. 12 shows a characteristic of the magneto-resistance effect element 102a produced by the method of the manufacturing method of the second example according to this embodiment and those of the magneto-resistance effect element 101a of the first example and the magneto-resistance effect element 109 of the first comparative example, which have been explained previously. The horizontal axis of this figure represents the CuO amount, and the vertical axis represents MR variation ratio (MR). In the same manner as the values shown in FIG. 6, the CuO amount is evaluated by a 3-dimension atom probe microscope. The configuration and manufacturing condition of the magneto-resistance effect film 10 of the magneto-resistance effect element 102a according to this embodiment are as follows. And, the MR variation ratio of the magneto-resistance effect element 102a was measured.

As shown in FIG. 2, sequentially from below in this figure, Ta with a thickness of 1 nm to be a buffer layer of the underlayer 12, Ru with a thickness of 2 nm to be a seed layer of the underlayer 12, IrMn with a thickness of 7 nm to be an antiferromagnetic layer (pining layer) 13, $CO_{75}Fe_{25}$ with a thickness of 3.4 nm to be the bottom pinned layer 141, Ru with a thickness of 0.9 nm to be a magnetic coupling layer 142, and $Fe_{50}CO_{50}$ with a thickness of 1.8 nm and Cu with a thickness of 0.25 nm and $Fe_{50}CO_{50}$ with a thickness of 1.8 nm to be laminated films of the top pinned layer 143 are film-formed.

And, as step S110 (film formation), Cu with a thickness of 0.6 nm and Al with a thickness of 0.9 nm to be the bottom metallic layer 15 and the spacer layer 16 are film-formed.

And, in the magneto-resistance effect element 102a according to the second example, PIT and IAO are performed in the second step of performing the first treatment (Step S120), and reduction treatment by hydrogen plasma and Ar ion beam are performed in the third step of performing the second treatment (Step S130), and further Ar plasma irradiation is performed in the fourth step of performing the third treatment (Step S140).

Then, successively, Cu with a thickness of 0.4 to be the top metallic layer 17, $CO_{60}Fe_{40}$ with a thickness of 2 nm and NiFe with a thickness of 3.5 nm to be laminated films of the free layer 18, and Cu with a thickness of 1 nm and Ta with a thickness of 2 nm and Ru with a thickness of 15 nm to be laminated films of the protective layer 19 are stacked.

That is, the magneto-resistance effect element 102a according to this example was produced by the similar steps to the magneto-resistance effect element 101a, but this case is different in the point that the Ar plasma is irradiated as the third treatment after the second treatment.

As shown in FIG. 12, the CuO amount in the magneto-resistance effect element 102a produced by the manufacturing method according to this embodiment is further decreased than that of the magneto-resistance effect element 101a in which the third treatment is not performed and is 0.7 times of that in the magneto-resistance effect element 109 of the first comparative example.

And, the MR variation ratio (MR) of the magneto-resistance effect element 102a is 17% and improved more than that of the magneto-resistance effect element 101a, which is 14%.

As described above, by performing the third treatment, $H_2O$ is removed and reduction of CuO is further promoted, and the oxygen concentration in the conductive portion 162 can be further decreased.

The MR variation ratio (MR) is improved by a higher degree than that of the decrease of the CuO amount. It can be assumed that this is because $H_2O$ is removed with decreasing of the amount of CuO by the third treatment and also the crystallinity of the conductive portion 162 is improved.

As described above, according to the method for manufacturing a magneto-resistance effect element according to this embodiment, the amount of oxygen in the conductive portion 162 can be decreased and the MR variation ratio can be improved.

Figure 13:
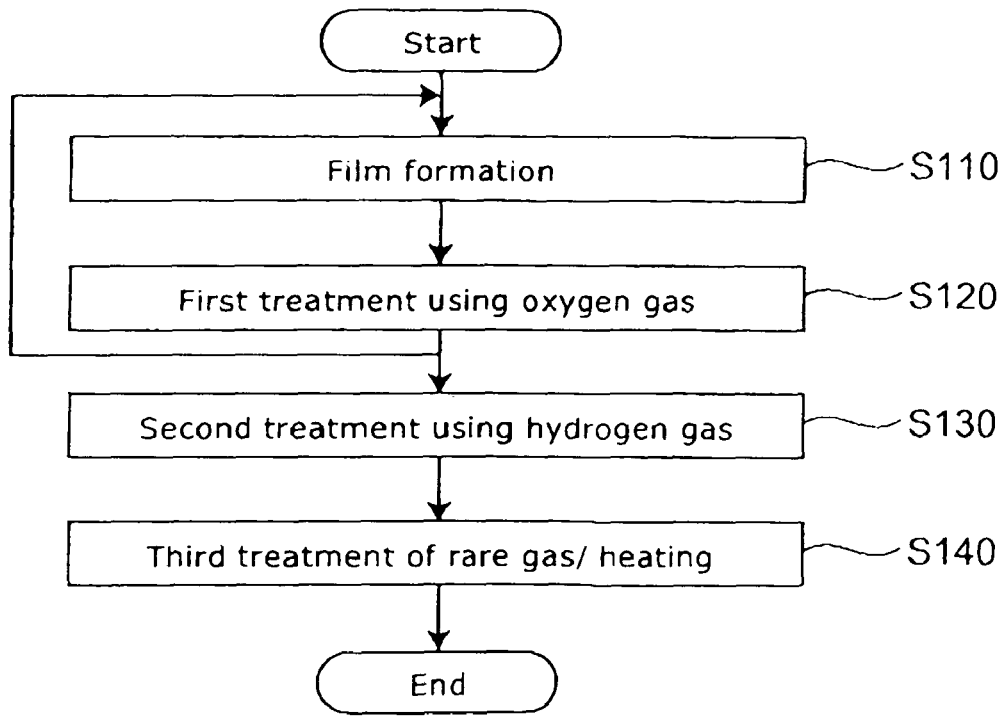
FIG. 13 is a flow chart illustrating another method for manufacturing according to the second embodiment of this invention.

FIG. 13 is a flow chart illustrating another method for manufacturing a magneto-resistance effect element according to the second embodiment of this invention.

As shown in FIG. 13, in another method for manufacturing a magneto-resistance effect element according to a third example of this invention, Step S110 to Step S120 are repeated. That is a spacer layer 16 having a plurality of laminated structures is formed and then the second treatment and third treatment is performed. As described above, in the method for manufacturing a magneto-resistance effect element according to this embodiment, Step S110 to Step S120 may be repeated plural times and performed.

Also in this case, the second step (Step S120) may include the PIT step (Step S120a illustrated in FIG. 3) and the IAO step (Step S120b illustrated in FIG. 3).

Third Example

Hereinafter, as a third example, the characteristic of the magneto-resistance effect element 103a produced by repeating twice Step S110 to Step S120 in the manufacturing method illustrated in FIG. 13, will be described.

As a second comparative example, the characteristic of the magneto-resistance effect element 109a produced by repeating twice Step S110 to Step S120 and not performing Step S130 (the second treatment using hydrogen gas) and Step S140 (the third treatment of irradiation of rare gas ion or irradiation of rare gas plasma or heating) will be described also.

The configuration and manufacturing condition of the magneto-resistance effect element 103a of the third example and the magneto-resistance effect element 109a of the second comparative example are as follows.

As shown in FIG. 2, sequentially from below in this figure, Ta with a thickness of 1 nm to be a buffer layer of the underlayer 12, Ru with a thickness of 2 nm to be a seed layer of the underlayer 12, IrMn with a thickness of 7 nm to be an antiferromagnetic layer (pining layer) 13, $CO_{75}Fe_{25}$ with a thickness of 3.4 nm to be the bottom pinned layer 141, Ru with a thickness of 0.9 nm to be a magnetic coupling layer 142, and $Fe_{50}CO_{50}$ with a thickness of 1.8 nm and Cu with a thickness of 0.25 nm and $Fe_{50}CO_{50}$ with a thickness of 1.8 nm to be laminated films of the top pinned layer 143 are film-formed.

And, in the case of the magneto-resistance effect element 103a, as the Step S110 (film formation) of the first time, Cu with a thickness of 0.6 nm and Al with a thickness of 0.9 nm to be the bottom metallic layer 15 and a part of the spacer layer 16 are film-formed, and then, PIT and IAO are performed as the Step S120 (first treatment) of the first time, and Al with a thickness of 0.5 nm is film-formed as Step S110 (film formation) of the second time, and subsequently, PIT and IAO are performed as Step S120 (the first treatment) of the second time.

And, reduction treatment by hydrogen plasma and Ar ion beam is performed as Step S130 (the second treatment), and then, Ar plasma is irradiated as Step 140 (the third treatment).

In this example, between IAO of the first time and the film formation of the second time, extremely weak Ar plasma is irradiated for a short time. This plasma irradiation is much weaker than that of the condition of the third treatment. The purpose of the plasma irradiation is to clean the contaminated surface during conveying the film between the different treatment chambers. This step is not required as arrangement of the film-formation apparatus.

On the other hand, in the case of the magneto-resistance effect element 109a of the second comparative example, as the Step S110 (film formation) of the first time, Cu with a thickness of 0.6 nm and Al with a thickness of 0.9 nm to be the bottom metallic layer 15 and a part of the spacer layer 16 are film-formed, and then, PIT and IAO are performed as the Step S120 (the first treatment) of the first time, and Al with a thickness of 0.5 nm is film-formed as Step S110 (film formation) of the second time, and then, PIT and IAO are performed as Step S120 (the first treatment) of the second time. Step S130 (the second treatment) and Step S140 (the third treatment) are not performed in this case.

Then, in both of the magneto-resistance effect element 103a and the magneto-resistance effect element 109a, Cu with a thickness of 0.4 nm to be the top metallic layer 17, $Co_{60}Fe_{40}$ with a thickness of 2 nm and NiFe with a thickness of 3.5 nm to be laminated films of the free layer 18, and Cu with a thickness of 1 nm and Ta with a thickness of 2 nm and Ru with a thickness of 15 nm to be laminated films of the protective layer 19 are stacked.

Figure 14:
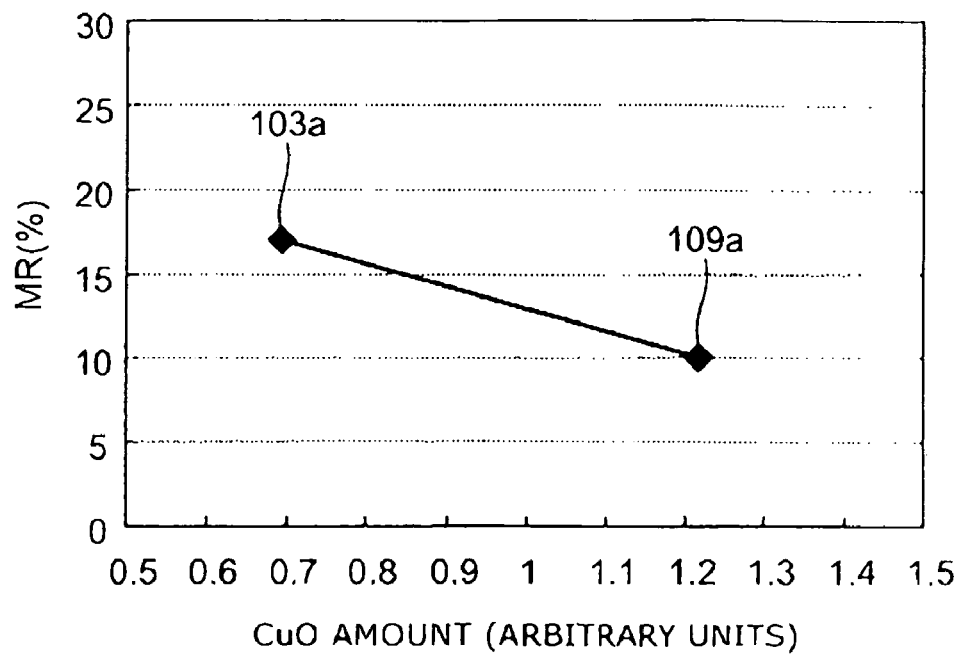
FIG. 14 is a graph illustrating a characteristic of the method for manufacturing according to a third example of this invention.

FIG. 14 is a graph illustrating a characteristic of the method for manufacturing a magneto-resistance effect element according to a third example of this invention.

In this figure, a characteristic of the magneto-resistance effect element 109a of the second comparative example is also shown.

As shown in FIG. 14, in the magneto-resistance effect element 109a of the second comparative example, the CuO amount is 1.2, which is further larger than the value of the magneto-resistance effect element 109 of the first comparative example. This is because the first treatment using oxygen gas is performed twice because of two-layer structure and thereby oxidation of the conductive portion 162 is more promoted. And, the MR variation ratio of the magneto-resistance effect element 109a is 10%, which is further lower than the magneto-resistance effect element 109. And, by optimizing oxygen exposure amount and film thickness that are the production conditions, its MR variation ratio can be improved to the MR variation ratio that is the same degree as the magneto-resistance effect element 109 of the first comparative example. However, here, the third example in which the third step (Step S130) and the fourth step (Step S140) are added to the spacer layer 16 produced in this condition is compared.

By contrast, in the magneto-resistance effect element 103a according to the third example, the CuO amount is 0.7, which is much lower than that of the second comparative example which is 1.2. And, corresponding to this, the MR variation ratio (MR) is 17%, which is high.

Fourth Example

Furthermore, as a fourth example according to the second embodiment, the magneto-resistance effect element 103b (not shown) by repeating Step S110 to Step S120 three times in the manufacturing method illustrated in FIG. 13, was manufactured. Other than this, the magneto-resistance effect element 103b is the same as the magneto-resistance effect element 103a.

In the magneto-resistance effect element 103b according to the fourth example, the underlayer 12, the antiferromagnetic layer (pining layer) 13, the bottom pinned layer 141, the magnetic coupling layer 142, and the top pinned layer 143 are formed, and then, as Step S110 (film formation) of the first time, Cu with a thickness of 0.6 nm and Al with a thickness of 0.9 nm to be the bottom metallic layer 15 and a part of the spacer layer 16 are film-formed.

And, PIT and IAO are performed as the Step S120 (the first treatment) of the first time, and Al is film-formed as Step S110 (film formation) of the second time, and PIT and IAO are performed as Step S120 (the first treatment) of the second time, and Al is film-formed as Step S110 (film formation) of the third time, and PIT and IAO are performed as Step S120 (the first treatment) of the third time.

Then, reduction treatment by hydrogen plasma and Ar ion beam is performed as Step S130 (the second treatment), and then, Ar plasma is irradiated as Step 140 (the third treatment).

In this example, between IAO of the first time and the film formation of the second time and between IAO of the second time and the film formation of the third time, extremely weak Ar plasma is irradiated for a short time. This plasma irradiation is much weaker than that of the condition of the third treatment. The purpose of the plasma irradiation is to clean the contaminated surface during conveying the film between the different treatment chambers. This step is not required as arrangement of the film-formation apparatus.

In the magneto-resistance effect element 103b produced as described above, MR variation ratio (MR) became 19%. As described above, as Step S110 to Step S120 are more repeated, the MR variation ratio becomes higher. The cause thereof can be thought to be as follows.

In the reduction step in the second treatment, it is more preferable that only the conductive portion 162 is reduced and the insulating layer 161 is not reduced. It can be thought that by repeating Step S110 to Step S120, the insulating layer 161 becomes dense and resistivity with respect to the reduction effect in the second treatment is improved and the state in which only the conductive portion 162 are reduced can be made.

Furthermore, in the third treatment, as the Ar ion beam is stronger and as the irradiation time is longer, the effect of removing $H_2O$ can be more obtained. However, if the Ar ion beam is strengthened or the irradiation time is prolonged, the spacer layer 16 is broken because of being thin. Accordingly, it is necessary to form the spacer layer 16 (CCP-NOL layer) having a resistivity with respect to the Ar ion beam as much as possible. Under such a circumstance, it can be thought that it exerts the effects to improve the resistivity to form the spacer layer 16 (CCP-NOL layer) to be thick by superposing a plurality of layers such as two layers or three layers. From such a consideration, it is thought that it is also effective to form the spacer layer 16 (CCP-NOL layer) in which four layers or more are stacked.

Figure 15:
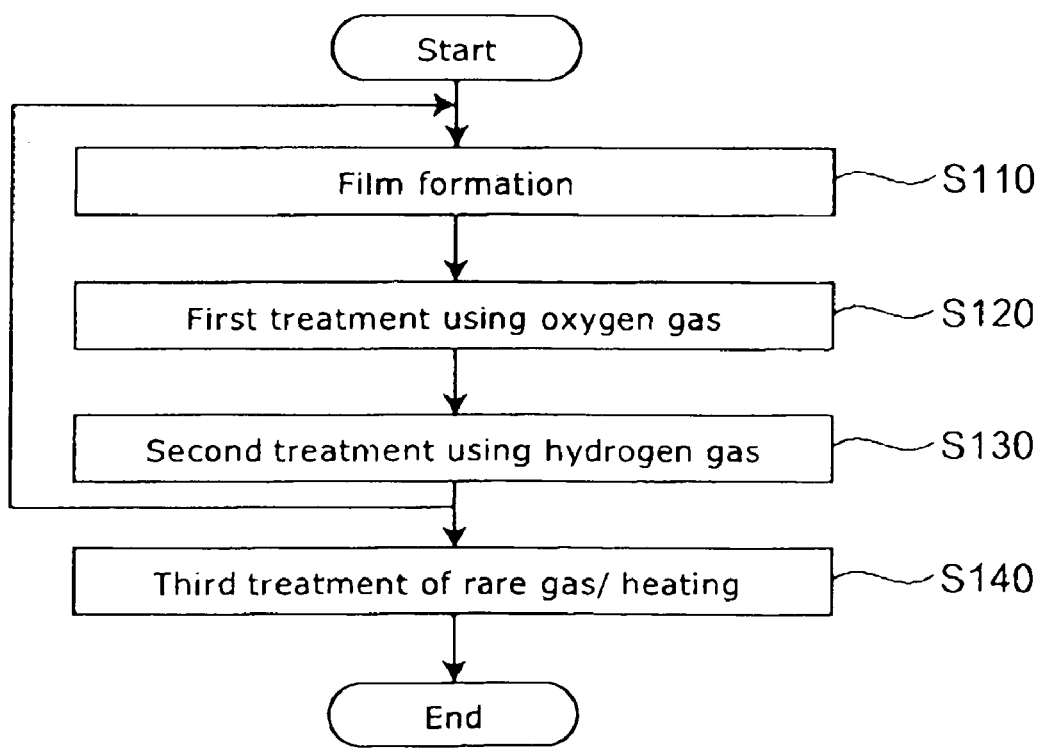
FIG. 15 is a flow chart illustrating another method for manufacturing according to the second embodiment of this invention.

FIG. 15 is a flow chart illustrating another method for manufacturing a magneto-resistance effect element according to the second embodiment of this invention.

As shown in FIG. 15, in the method for manufacturing another magneto-resistance effect element according to the second embodiment of this invention, the spacer layer 16 having two-layer structure by repeating Step S110 to Step S130, which has been described by using FIGS. 8 and 9, is submitted to the third treatment. By repeating the oxidation treatment and the reduction treatment, the second metallic film 16b, which is easy to be oxidized, is more oxidized, and the first metallic film 16a and the conductive portion 162, which are easy to be reduced, are more reduced. That is, the difference of oxidation energies between the materials can be emphasized and utilized. Thereby, without degradation of the insulating characteristics of the insulating layer 161, the conductive portion 162 is reduced to decrease the amount of the oxygen impurities and the specific resistance of the conductive portion 162 is decreased, and thereby, the magneto-resistance effect element having the high MR variation ratio can be obtained.

Also in this case, the second step (Step S120) may include the PIT step (Step S120a illustrated FIG. 3) and the IAO step (Step S120b Illustrated FIG. 3).

Figure 16:
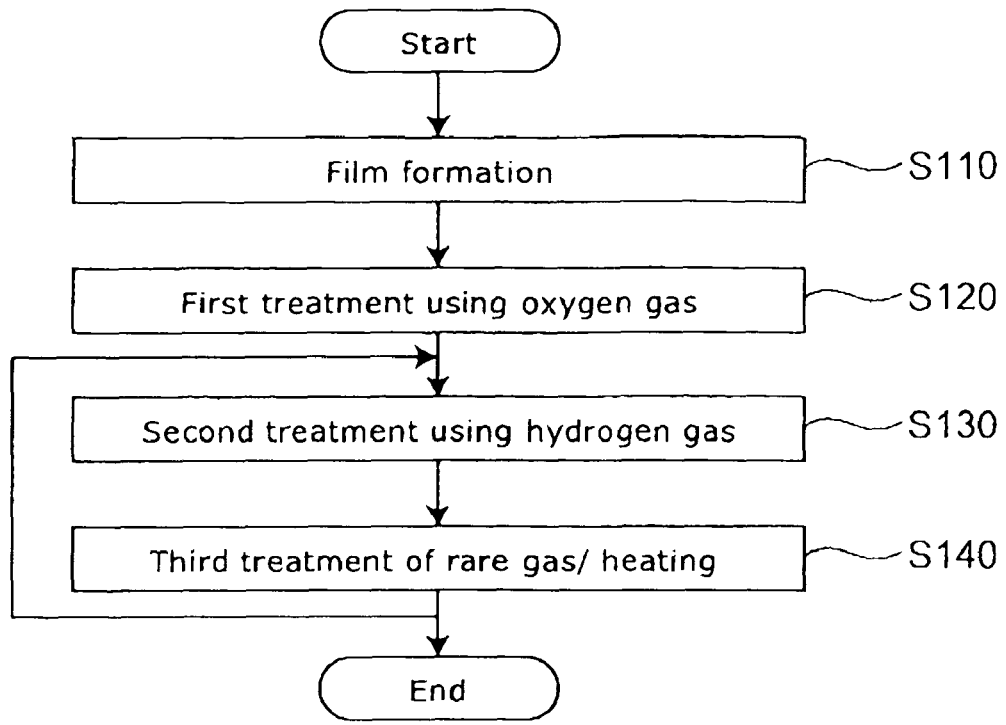
FIG. 16 is a flow chart illustrating another method for manufacturing according to the second embodiment of this invention.

FIG. 16 is a flow chart illustrating another method for manufacturing a magneto-resistance effect element according to the second embodiment of this invention.

As shown in FIG. 16, in another method for manufacturing the magneto-resistance effect element according to the second embodiment of this invention, Step S130 to Step S140 are repeated. This is for removing extra $H_2O$ before a large amount of the $H_2O$ is accumulated, by repeating the second step (reduction treatment) and the third treatment (subsequent $H_2O$ removal). By performing the third treatment before the large amount is accumulated, the third treatment can have a weak condition. Specifically, when the third treatment is Ar plasma irradiation, if irradiation is repeated twice, RF power is sufficient to be half of that of the case of one-time irradiation. Or, the time may be about half. Anyway, the damage provided to the insulating layer 161 and the conductive portion 162 in the third treatment is suppressed, and the insulating layer 161 with a higher dense and the conductive portion 162 with a higher purity are formed and the MR variation ratio is improved.

Also in this case, the second step (Step S120) may include the PIT step (Step S120a illustrated FIG. 3) and the IAO step (Step S120b illustrated FIG. 3).

Figure 17:
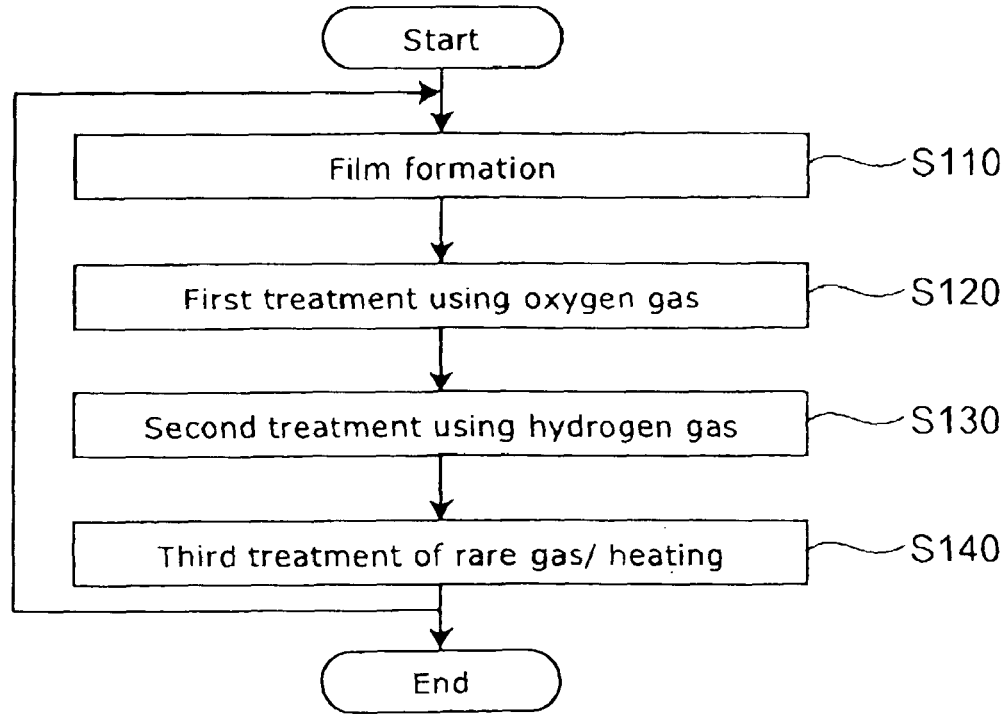
FIG. 17 is a flow chart illustrating another method for manufacturing according to the second embodiment of this invention.

FIG. 17 is a flow chart illustrating another method for manufacturing a magneto-resistance effect element according to the second embodiment of this invention.

As shown in FIG. 17, in another method for manufacturing a magneto-resistance effect element according to the second embodiment of this invention, Step S110 to Step S140 are repeated. That is, the spacer layer 16 having a plurality of structures is formed, and the third treatment is performed in each of the treatments.

Also in this case, the second step (Step S120) may include the PIT step (Step S120a illustrated FIG. 3) and the IAO step (Step S120b illustrated FIG. 3).

The effects of the second treatment and the third treatment become weaker as the position is deeper in the direction of the film thickness. That is, in such a spacer layer 16 as the magneto-resistance effect element 103b according to the fourth example formed by repeating Step S110 to Step S120 three times, CuO reduction and $H_2O$ removal and crystallinity improvement of the conductive portion 162 that are expected can be realized in the upper portion of the spacer layer 16, but in the bottom portion of the spacer layer 16, occasionally, the degree of CuO reduction is relatively low and the residual amount of $H_2O$ is relatively large and the crystallinity is also relatively degraded. Accordingly, by repeating Step S110 to Step S140, the characteristics are improved. The rather thin insulating layer 161 and conductive portion 162 are submitted to the second treatment (Step S130) and the third treatment (Step S140), and thereby, CuO is sufficiently reduced and $H_2O$ is removed, and the crystallinity of the conductive portion 162 is improved. Then, moreover, the rather thin insulating layer 161 and conductive portion 162 are formed and submitted to the second treatment (Step S130) and the third treatment (Step S140), and thereby, CuO is sufficiently reduced and $H_2O$ is removed and the crystallinity of the conductive portion 162 is improved.

As described above, according to the method for manufacturing a magneto-resistance effect element of this specific example, the spacer layer 16 is formed plural times to ensure high reliability, and the residue of oxygen generated in this process in the conductive portion 162 is effectively suppressed, and furthermore, the residual $H_2O$ is removed and the crystallinity is also improved, and the magneto-resistance effect element having high MR variation ratio can be obtained.

Figure 18:
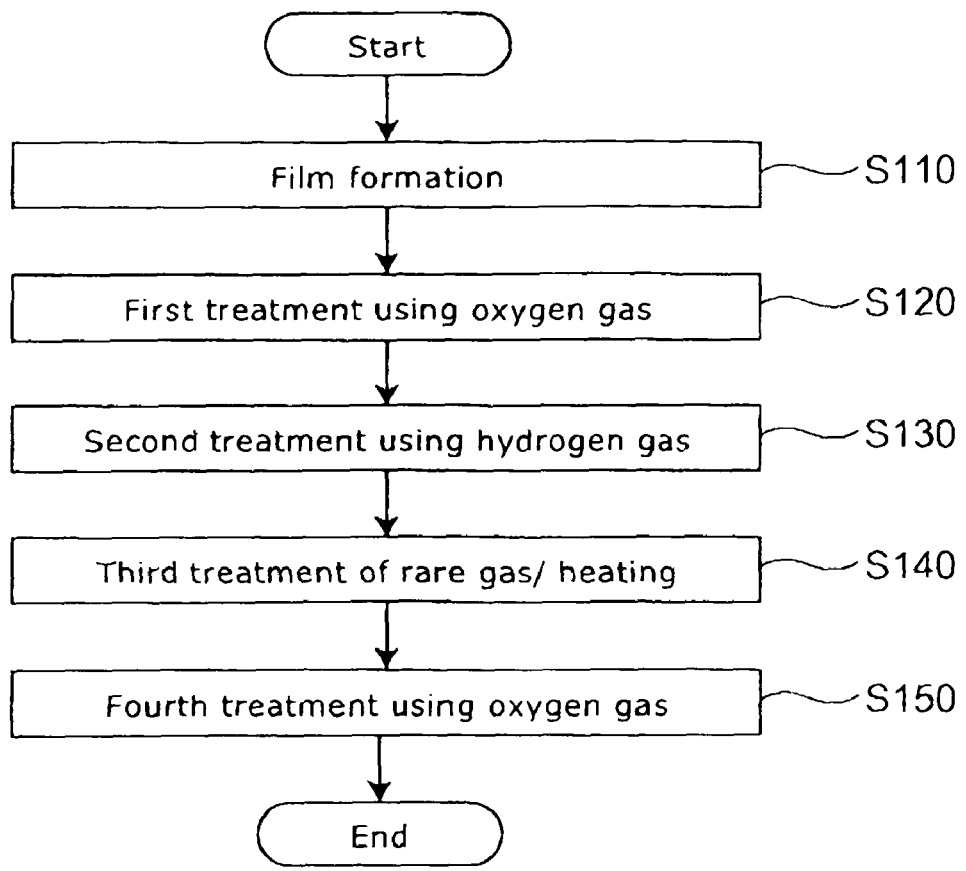
FIG. 18 is a flow chart illustrating another method for manufacturing according to the second embodiment of this invention.

FIG. 18 is a flow chart illustrating another method for manufacturing a magneto-resistance effect element according to the second embodiment of this invention.

As shown in FIG. 18, another method for manufacturing a magneto-resistance effect element according to the second embodiment of this invention, after the first step (Step S110), the second step (Step S120), the third step (Step S130) and fourth step (Step S140), which are explained with respect to FIG. 10, further a fifth step (Step S150) is carried out.

In some cases, after the fourth step, the insulator part of the spacer layer 16 (CCP-NOL layer) may be slightly reduced and the voltage-robustness may be decreased. By performing the fifth step (Step S150), an amount of oxygen in the insulator part of the spacer layer 16 is increased again and the voltage-robustness can be recovered. The oxidation condition of the fifth step (Step S150) may be selected substantially not to oxidize the metal which forms mainly the spacer layer 16.

In the fifth step, the film submitted to the third treatment is submitted to the fourth treatment of at least using a gas including at least one of oxygen molecules, oxygen gas, oxygen atoms, oxygen ions, oxygen plasma and oxygen radicals to the film, the film submitted to the third treatment. In the fourth treatment, the film is oxidized.

Thus, the method further includes performing a fourth treatment using a gas including at least one of oxygen molecules, oxygen atoms, oxygen ions, oxygen plasma and oxygen radicals to the film, the film submitted to the third treatment.

Third Embodiment

Figure 19:
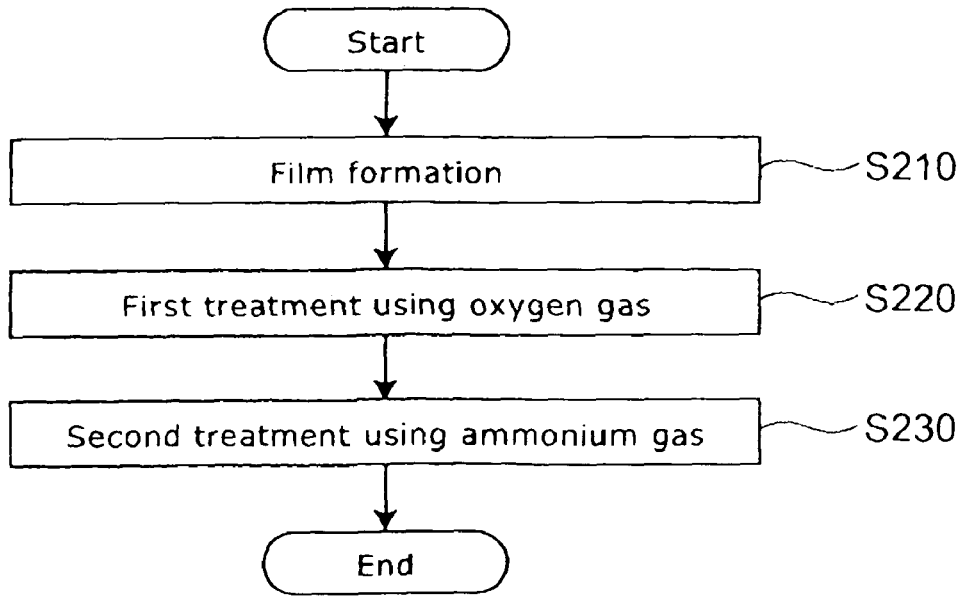
FIG. 19 is a flow chart illustrating a method for manufacturing according to a third embodiment of this invention.

FIG. 19 is a flow chart illustrating a method for manufacturing a magneto-resistance effect element according to a third embodiment of this invention.

As shown in FIG. 18, in the method for manufacturing a magneto-resistance effect element according to this embodiment, between formation of the first magnetic layer and formation of the second magnetic layer, the following steps are performed.

That is, first of all, a film to be a base material of the spacer layer 16 is formed (a first step: Step S210).

In this case, as explained with respect to FIG. 4A, on the layer 14a containing the first magnetic layer, the first metallic film 16a and the second metallic film 16b are stacked and film-formed. The first metallic film 16a is Cu, for example. The second metallic film 16b is Al. Or, the second metallic film 16b may be AlCu.

And, the above-described film (the first metallic film 16a and the second metallic film 16b) is submitted to the first treatment using oxygen gas (a second step: Step S220).

As explained with respect to FIGS. 4A and 4B, first, PIT by the Ar ion beam 91 is performed, and then, IAO by the oxygen ion beam 92 is performed. By PIT, portions of the first metallic film 16a of the bottom side are sucked up to the side of second metallic film 16b and penetrates through the second metallic film 16b to form the conductive portion 162. And, by the IAO using the oxygen gas (oxygen ion beam 92 in this case), the first metallic film 16a and the second metallic film 16b are submitted to oxidizing treatment, and the second metallic film 16b is oxidized to be $Al_2O_3$ to form an insulating layer 161. And, the first metallic film 16a is relatively hard to be oxidized and the large amount thereof remains metal. However, some thereof is oxidized to generate CuO.

As described above, the second step (Step S220) may include the PIT step (Step S120a illustrated FIG. 3) and the IAO step (Step S120b illustrated FIG. 3).

And, the above-described film (the metallic film 16a, the metallic film 16b, and mixture of the insulating layer 161 and the conductive portion 162) is submitted to a second treatment using ammonium gas (a third step: Step S230).

That is, in the same manner as explained with respect to FIG. 4B, the above-described film is irradiated, for example, with an ammonium ion beam and the CuO generated by oxidation of the first metallic film 16a is reduced to be changed to Cu. The ammonium gas has stronger reduction effect than that of a hydrogen gas, and reduction of CuO can be performed more effectively than the case in which a hydrogen gas is used.

At this time, also $A_2O_3$ to be the insulating layer 161 is submitted to the reducing treatment, but by appropriately selecting the condition such that $A_2O_3$ is not substantially reduced and CuO is reduced, the resistance of the conductive portion 162 can be decreased with substantially no adverse effect to the insulating characteristics of the insulating layer 161.

As described above, according to the method for manufacturing a magneto-resistance effect element according to this embodiment, the oxide of the conductive portion 162 generated in forming the insulating layer 161 and conductive portion 162 is reduced, and the amount of oxygen impurities in the conductive portion is decreased. Thereby, the resistance of the conductive portion 162 is decreased and the current-confined-path effect is effectively exerted. Thereby, the CCP-CPP type magneto-resistance effect element having high MR variation ratio can be obtained.

As described above, the method for manufacturing a magneto-resistance effect element according to this embodiment includes the first step of forming a film to be a base material of the spacer layer 16, the second step of performing the first treatment using gas including oxygen on the film, and the third step of performing the second treatment using a gas including ammonium on the film submitted to the first treatment. In the above description, the gas including oxygen is a gas including at least any one of oxygen molecules, oxygen atoms, oxygen ions, oxygen plasma, and oxygen radicals, and, for example, this treatment is by the oxygen ion beam 92 but the treatment by oxygen plasma is also possible. The gas including ammonium includes at least any one of ammonium molecules, ammonium ions, ammonium plasmas, and ammonium radicals, based on ammonium.

Various modifications of the method for manufacturing a magneto-resistance effect element according to this embodiment are possible.

Figure 20:
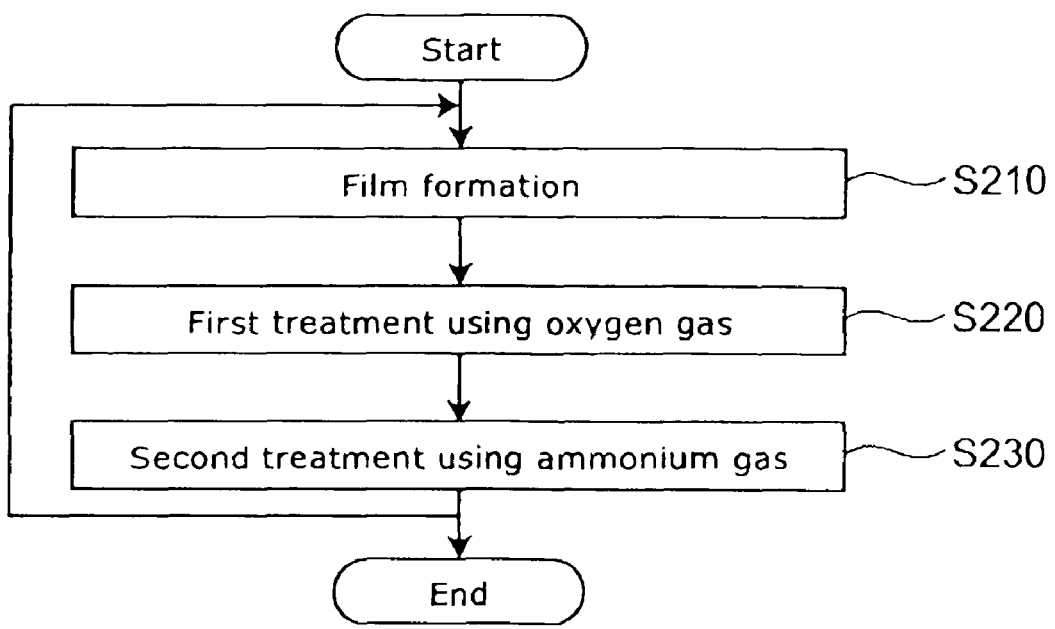
FIG. 20 is a flow chart illustrating another method for manufacturing according to the third embodiment of this invention.

FIG. 20 is a flow chart illustrating another method for manufacturing a magneto-resistance effect element according to the third embodiment of this invention.

As shown in FIG. 20, in another method for manufacturing a magneto-resistance effect element according to the third embodiment of this invention, the first step (Step S210), the second step (Step S220), and the third step (Step S230), which have been explained with respect to FIG. 18, are repeated plural times and performed.

Also in this case, the second step (Step S220) may include the PIT step (Step S120*a* illustrated in FIG. 3) and the IAO step (Step S120*b* illustrated in FIG. 3).

By performing plural times of formation of the film to be the spacer layer 16 as described above, the film thickness of each of the formed films becomes thin, and thereby, the stress in the film can be relaxed, and the structure of the film is stabilized, and the film becomes dense, and the adhesive force of the film is improved, and the reliability of the magneto-resistance effect element is improved.

Thereby, the CCP-CPP type magneto-resistance effect element having high MR variation ratio with high reliability can be obtained.

Figure 21:
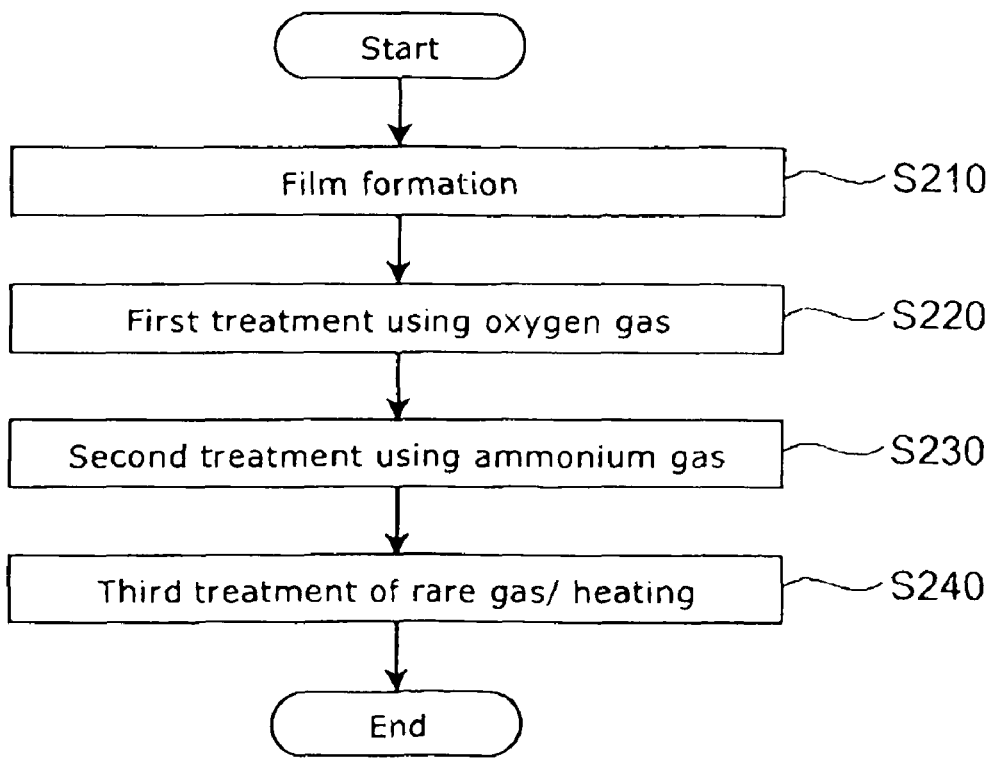
FIG. 21 is a flow chart view illustrating another method for manufacturing according to the third embodiment of this invention.

FIG. 21 is a flow chart view illustrating another method for manufacturing a magneto-resistance effect element according to the third embodiment of this invention.

As shown in FIG. 21, in another method for manufacturing a magneto-resistance effect element according to the third embodiment of this invention, after the first step (Step S210) and the second step (Step S220) and the third step (Step S230), which are illustrated in FIG. 18, a fourth step (Step S240) is further performed.

Also in this case, the second step (Step S220) may include the PIT step (Step S120*a* illustrated in FIG. 3) and the IAO step (Step S120*b* illustrated in FIG. 3).

In the fourth step, the film submitted to the second treatment is submitted to the third treatment of at least any one of irradiation of rare gas ion, irradiation of rare gas plasma, and heating.

As the third treatment, the insulating layer 161 and the conductive portion 162 are submitted to, for example, irradiation of Ar ion beam or irradiation of Ar plasma. Or, as the third treatment, the insulating layer 161 and the conductive portion 162 are heated. Or, as the third treatment, during heating the insulating layer 161 and the conductive portion 162, for example, irradiation of Ar ion beam or irradiation of Ar plasma is performed.

Thereby, $H_2O$ generated by the first treatment using oxygen gas and the second treatment using ammonium gas can be removed.

After the second treatment, in the insulating layer 161 and the conductive portion 162, $H_2O$ 94 generated by the first treatment using oxygen gas and the second treatment using the ammonium gas occasionally remains. In this case, the residual $H_2O$ diffuses in the anneal step after finishing stacking all of the films and can oxidize the surrounding metallic films. That is, the conductive portion 162 reduced in the second treatment may be reoxidized by the residual $H_2O$ in the anneal step. For preventing this, the third treatment is performed to remove $H_2O$.

Thereby, by removing $H_2O$ 94 from the insulating layer 161 and the conductive portion 162, the characteristics of the insulating layer 161 and the conductive portion 162 are stabilized. And, film formation such as the second magnetic layer which is subsequently performed can be stably performed, and the adhesive forces of the stacked films to one another can be improved.

Moreover, by the third treatment of at least any one of irradiation of rare gas ion and irradiation of rare gas plasma and heating, for example, crystallinity of the conductive portion 162 is improved and the resistance thereof is further decreased. Thereby, the MR variation ratio can be further improved.

As described above, for example, by heating the insulating layer 161 and the conductive portion 162 in the second treatment, the third treatment can be omitted. Also, for example, even when the insulating layer 161 and the conductive portion 162 are heated in the second treatment, if the removal of $H_2O$ 94 is insufficient, the third treatment may be performed to promote the removal of $H_2O$ 94.

Figure 22:
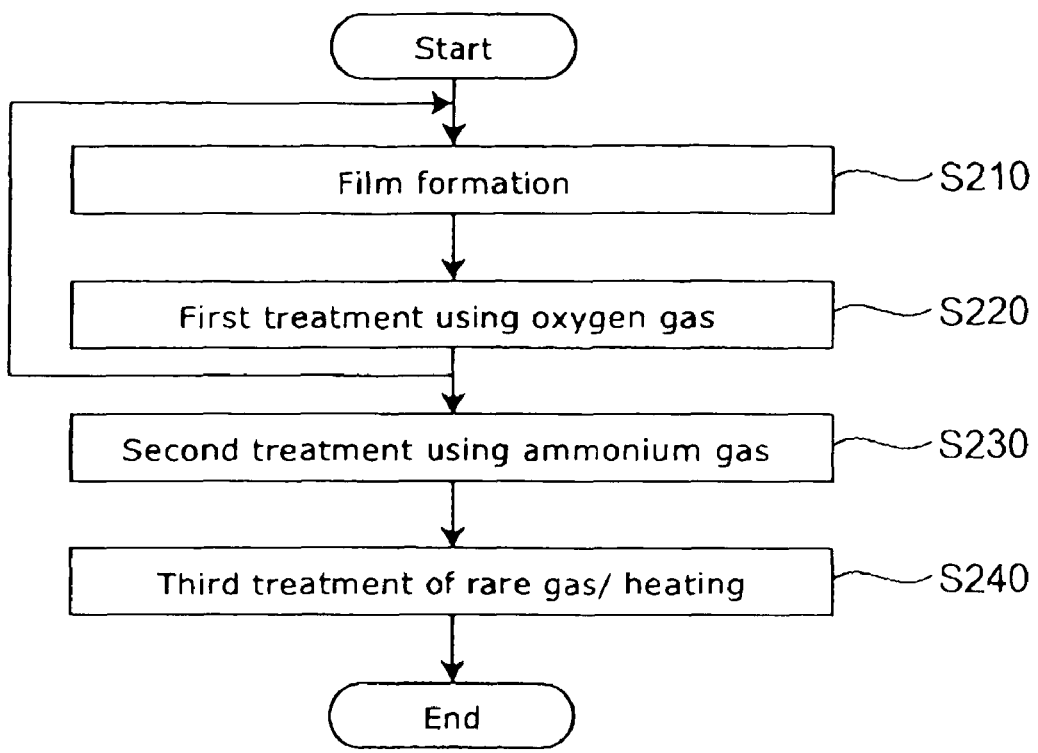
FIG. 22 is a flow chart view illustrating another method for manufacturing according to the third embodiment of this invention.

FIG. 22 is a flow chart view illustrating another method for manufacturing a magneto-resistance effect element according to the third embodiment of this invention.

As shown in FIG. 22, in another method for manufacturing a magneto-resistance effect element according to the third embodiment of this invention, Step S210 to Step S220 are repeated. That is, the spacer layer 16 having a plurality of structures is formed, and then the second treatment and the third treatment are performed.

Also in this case, the second step (Step S220) may include the PIT step (Step S120*a* illustrated in FIG. 3) and the IAO step (Step S120*b* illustrated in FIG. 3).

As described above, by repeating Steps S210 to S220, the MR variation ratio can be more improved in the same manner as explained with respect to FIG. 14. That is, in the reduction step in the second treatment, it is preferable that only the conductive portion 162 is reduced and the insulating layer 161 is not reduced, and by repeating Steps S210 to S220, the insulating layer 161 becomes dense and the resistivity with respect to the reduction effect in the second treatment is improved, and the state in which only the conductive portions are reduced can be made.

Furthermore, in the third treatment, as the Ar ion beam is stronger and as the irradiation time is longer, the effect of removing $H_2O$ can be more obtained. However, if the Ar ion beam is strengthened or the irradiation time is prolonged, the spacer layer 16 is broken because of being thin. Accordingly, it is necessary to form the spacer layer 16 (CCP-NOL layer) having a resistivity with respect to the Ar ion beam as much as possible. Under such a circumstance, it can be thought that it exerts the effects to improve the resistivity to form the spacer layer 16 (CCP-NOL layer) to be thick by superposing a plurality of layers such as two layers or three layers. From such a consideration, it is thought that it is also effective to form the spacer layer 16 (CCP-NOL layer) in which four layers or more are stacked.

Figure 23:
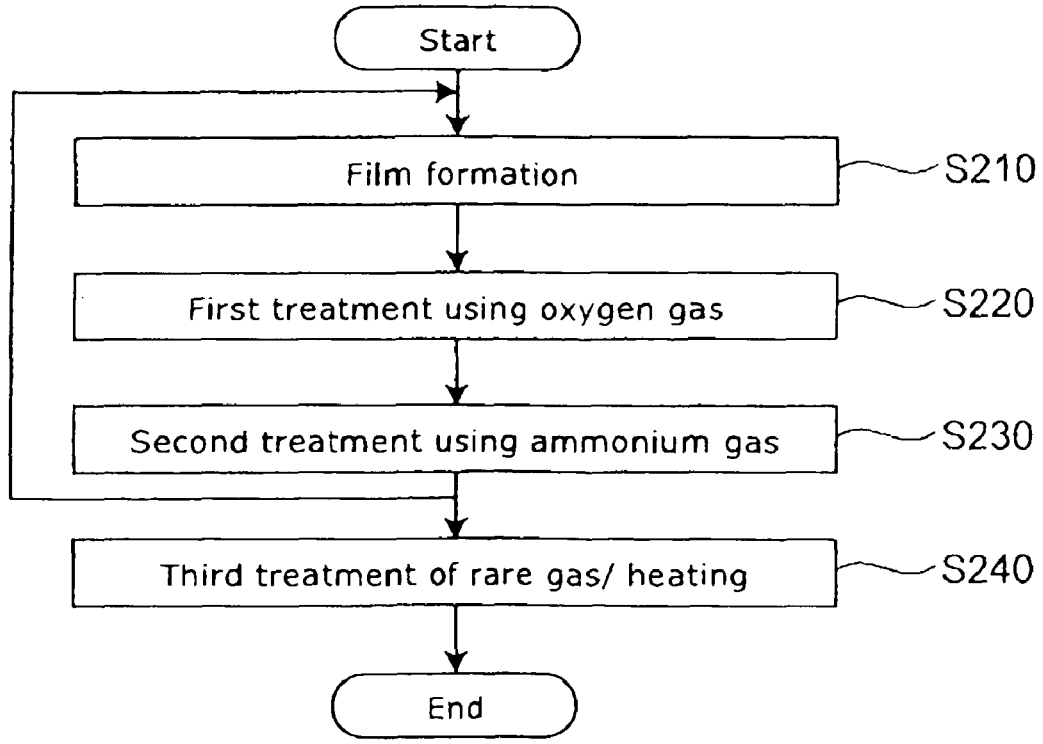
FIG. 23 is a flow chart view illustrating another method for manufacturing according to the third embodiment of this invention.

FIG. 23 is a flow chart view illustrating another method for manufacturing a magneto-resistance effect element according to the third embodiment of this invention.

As shown in FIG. 23, in another method for manufacturing a magneto-resistance effect element according to the third embodiment of this invention, the spacer layer 16 having the stacked structure in which Step S210 to Step S230 are repeated is submitted to the third treatment (Step S240).

Also in this case, the second step (Step S220) may include the PIT step (Step S120a illustrated in FIG. 3) and the IAO step (Step S120b illustrated in FIG. 3).

As described above, by repeating the oxidation treatment and the reduction treatment, the second metallic film 16b, which is easy to be oxidized, is more oxidized, and the first metallic film 16a and the conductive portion 162, which are easy to be reduced, are more reduced. That is, the difference of oxidation energies between the materials can be emphasized and utilized. Thereby, without degradation of the insulating characteristics of the insulating layer 161, the conductive portion 162 is reduced to decrease the amount of the oxygen impurities and the specific resistance of the conductive portion 162 is decreased, and thereby, the magneto-resistance effect element having the high MR variation ratio can be obtained.

Figure 24:
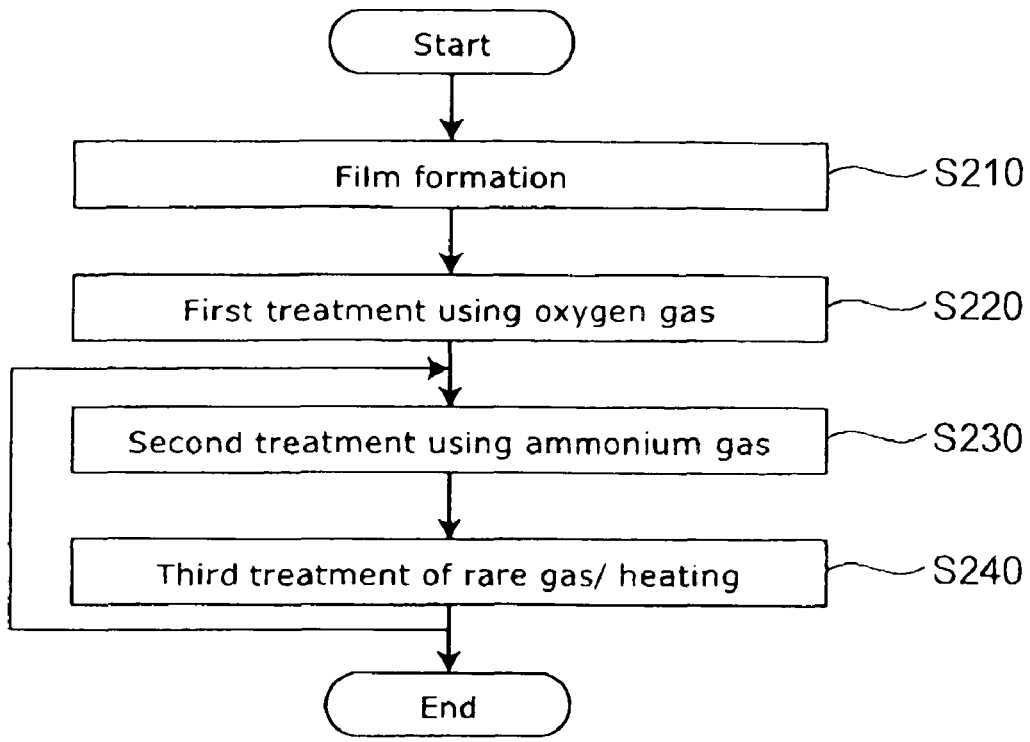
FIG. 24 is a flow chart view illustrating another method for manufacturing according to the third embodiment of this invention.

FIG. 24 is a flow chart view illustrating another method for manufacturing a magneto-resistance effect element according to the third embodiment of this invention.

As shown in FIG. 24, in another method for manufacturing a magneto-resistance effect element according to the third embodiment of this invention, Step S230 to Step S240 are repeated. This is for removing extra $H_2O$ before a large amount of the $H_2O$ is accumulated, by repeating the second step (reduction treatment) and the third treatment (subsequent $H_2O$ removal). By performing the third treatment before the large amount is accumulated, the third treatment can have a weak condition.

Specifically, when the third treatment is Ar plasma irradiation, if irradiation is repeated twice, RF power is sufficient to be half of that of the case of one-time irradiation. Or, the time may be about half. Anyway, the damage provided to the insulating layer 161 and the conductive portion 162 in the third treatment is suppressed, and the insulating layer 161 with a higher dense and the conductive portion 162 with a higher purity are formed and the MR variation ratio is improved.

Also in this case, the second step (Step S220) may include the PIT step (Step S120a illustrated FIG. 3) and the IAO step (Step S120b Illustrated FIG. 3).

Figure 25:
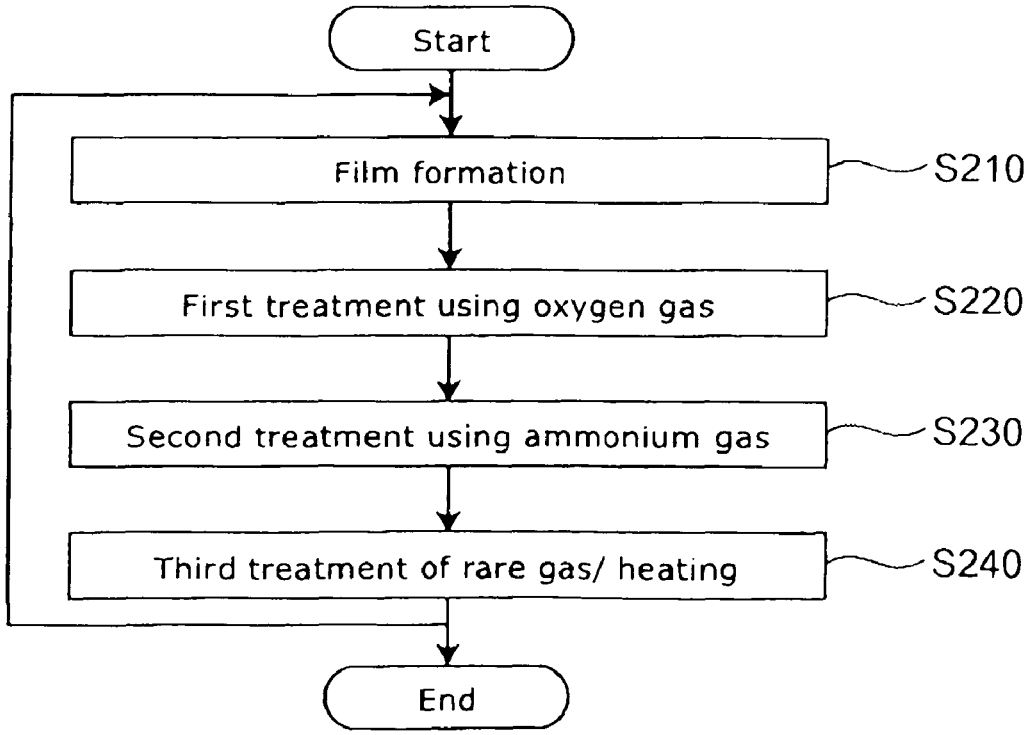
FIG. 25 is a flow chart view illustrating another method for manufacturing according to the third embodiment of this invention.

FIG. 25 is a flow chart view illustrating another method for manufacturing a magneto-resistance effect element according to the third embodiment of this invention.

As shown in FIG. 25, in another method for manufacturing a magneto-resistance effect element according to the third embodiment of this invention, Step S210 to Step S240 are repeated. That is, the spacer layer 16 having a plurality of structures is formed, and the third treatment is performed out in each of the treatments.

Also in this case, the second step (Step S220) may include the PIT step (Step S120a illustrated FIG. 3) and the IAO step (Step S120b illustrated FIG. 3).

The effects of the second treatment and the third treatment are weaker as the position is deeper in the direction of the film thickness. That is, in such a spacer layer 16 as the magneto-resistance effect element formed by repeating Step S110 to Step S120 three times, CuO reduction and $H_2O$ removal and crystallinity improvement of the conductive portion 162 that are expected can be realized in the upper portion of the spacer layer 16, but in the lower portion of the spacer layer 16, occasionally, the degree of CuO reduction is relatively low and the residual amount of $H_2O$ is relatively large and the crystallinity is also relatively degraded.

Accordingly, by repeating Step S210 to Step S240, the characteristics are improved. The rather thin insulating layer 161 and conductive portion 162 are submitted to the second treatment (Step S230) and the third treatment (Step S240), and thereby, CuO is sufficiently reduced and $H_2O$ is removed. Then, moreover, the rather thin insulating layer 161 and conductive portion 162 are formed and submitted to the second treatment (Step S230) and the third treatment (Step S240), and thereby, CuO is sufficiently reduced and $H_2O$ is removed. Thereby, the magneto-resistance effect element having high MR variation ratio can be obtained In the method for manufacturing a magneto-resistance effect element according to the embodiments of this invention, an apparatus described below can be used.

FIG. 26 is a flow chart illustrating another method for manufacturing a magneto-resistance effect element according to the third embodiment of this invention.

As shown in FIG. 26, another method for manufacturing a magneto-resistance effect element according to the third embodiment of this invention, after the first step (Step S210), the second step (Step S220), the third step (Step S230) and fourth step (Step S240), which are explained with respect to FIG. 21, further a fifth step (Step S250) is carried out.

In some cases, after the fourth step, the insulator part of the spacer layer 16 (CCP-NOL layer) may be slightly reduced and the voltage-robustness may be decreased. By performing the fifth step (Step S150), an amount of oxygen in the insulator part of the spacer layer 16 is increased again and the voltage-robustness can be recovered. The oxidation condition of the fifth step (Step S150) may be selected substantially not to oxidize the metal which forms mainly the spacer layer 16.

In the fifth step, the film submitted to the third treatment is submitted to the fourth treatment of at least using a gas including at least one of oxygen molecules, oxygen atoms, oxygen ions, oxygen plasma and oxygen radicals to the film, the film submitted to the third treatment. In the fourth treatment, the film is oxidized.

Thus, the method further includes performing a fourth treatment using a gas including at least one of oxygen molecules, oxygen atoms, oxygen ions, oxygen plasma and oxygen radicals to the film, the film submitted to the third treatment.

FIG. 27 is a schematic view illustrating a configuration of a manufacturing apparatus used for the method for manufacturing a magneto-resistance effect element according to the embodiments of this invention.

As shown in FIG. 27, in the manufacturing apparatus 50a used for the method for manufacturing a magneto-resistance effect element according to the embodiments of this invention, the transfer chamber (TC) 50 is disposed at the center of the apparatus such that the first chamber (the load lock chamber) 51, the second chamber 52, the third chamber 53, the forth chamber and the fifth chamber 55 are disposed so as to be connected with the transfer chamber 50 via the gate valves, respectively. In this manufacturing apparatus 50a, forming films and various treatments are performed. In the apparatus, the substrate on which various films are to be formed is transferred from one chamber to another chamber under the vacuum condition via the corresponding gate valve. Therefore, the surface of the substrate can be maintained clean.

In the second chamber 52, for example, the exposure to the hydrogen gas (including hydrogen ions and hydrogen plasma) or ammonia gas (including ammonia ions and ammonia plasma) and the irradiation of these gases are performed. That is, the second treatment is preformed. Moreover, the irradiation of rare gas ions and rare gas plasma may be performed. That is, the third treatment is performed. The second chamber 52 may includes a heating stage and the heating treatment in the second treatment and the third treatment can be performed.

In the third chamber 53, a pre-cleaning and the treatment with rare gas plasma are performed. In other words, the PIT treatment is performed, for example.

In the forth chamber 54, metallic films are formed.

In the fifth chamber 55, oxide layers are formed.

The forth chambers 54 may include a plurality of targets (five to ten targets) which is called as a multi-structured target. As the film forming means, a sputtering method such as a DC magnetron sputtering or an RF magnetron sputtering, an ion beam sputtering, a vacuum deposition, a CVD (Chemical Vapor Deposition) or an MBE (Molecular Beam Epitaxy) can be employed.

When a Strengthen Adhesion Treatment (SAT) is performed for the spacer layer 16, the SAT is performed in a chamber having RF plasma mechanism, ion beam mechanism or heating mechanism. More specifically, the forth chamber 54 or the second chamber 52 having a RF plasma mechanism. Since the RF plasma mechanism has a simplified mechanism, by using the forth chambers 54, both of the metallic film formation and the SAT can be performed.

Herein, it is not desired that the SAT is performed in the fifth chamber 55. In this case, the oxygen gas absorbed onto the inner wall of the oxidation chamber is released to contaminate the free layer 18 so that the free layer 18 may be deteriorated. In a chamber as the forth chamber 54, since the oxygen gas is not absorbed onto the inner wall of the chamber because the oxygen gas is not used at the film-forming process, the vacuum condition of the chamber can be easily maintained.

The pressure in the above-described vacuum chamber is in the order of $10^{-9}$ Torr, and the allowable pressure range is the order of $5 \times 10^{-8}$ Torr or below.

Figure 28:
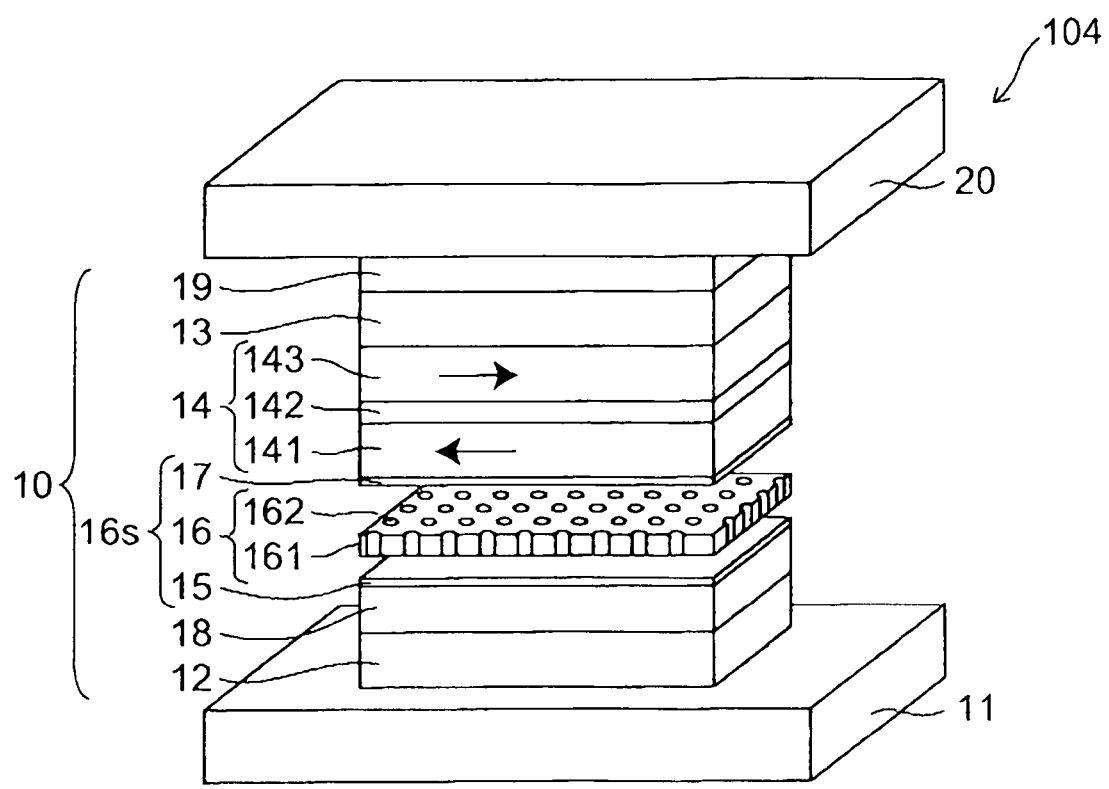
FIG. 28 is a schematic perspective view illustrating a configuration of another magneto-resistance effect element to which the method for manufacturing according to the embodiments of this invention is applied.

FIG. 28 is a schematic perspective view illustrating a configuration of another magneto-resistance effect element to which the method for manufacturing a magneto-resistance effect element according to the embodiments of this invention is applied.

As shown in FIG. 28, another magneto-resistance effect element 104 to which the method for manufacturing a magneto-resistance effect element according to the embodiments of this invention is applied, is a top-type CCP-CPP element in which the pinned layer 14 is located above the free layer 18. The method for manufacturing a magneto-resistance effect element according to the first to third embodiments can also be applied to the top-type CCP-CPP element, as well as the bottom-type CCP-CPP (such as magneto-resistance effect element 101) in which the pinned layer 14 is located below the free layer 18, and the same effect can be obtained.

Fourth Embodiment

The magneto-resistance effect element 105 (not shown) according to a fourth embodiment of this invention is any one of the magneto-resistance effect elements (CCP elements) produced by the method for manufacturing a magneto-resistance effect element of the first to third embodiments. That is, the magneto-resistance effect element 105 includes the above-described magneto-resistance effect elements 101, 101a, 102a, 103a, and 104.

In the embodiment of the present invention, in view of high density recording, the element resistance RA is set preferably to 500 m$\Omega$/µm$^2$ or below, more preferably to 300 m$\Omega$/µm$^2$ or below. In the calculation of the element resistance RA, the effective area A in current flow of the spin valve film is multiplied to the resistance R of the CPP-CPP element. Herein, the element resistance R can be directly measured, but attention should be paid to the effective area A because the effective area A depends on the element structure.

If the whole area of the spin valve film is effectively sensed by current through patterning, the whole area of the spin valve film corresponds to the effective area A. In this case, the whole area of the spin valve film is set to 0.04 µm$^2$ or below in view of the appropriate element resistance, and to 0.02 µm$^2$ or below in view of the recording density of 300 Gbpsi or over.

If the area of the bottom electrode 11 or the top electrode 20 is set smaller than the whole area of the spin valve film, the area of the bottom electrode 11 or the top electrode 20 corresponds to the effective area A. If the area of the bottom electrode 11 is different from the area of the top electrode 20, the smaller area of either of the bottom electrode 11 or the top electrode 20 corresponds to the effective area A. As described above, the smaller area is set to 0.04 µm$^2$ or below in view of the appropriate element resistance Referring to FIGS. 27 and 28 since the smallest area of the magneto-resistance effect film 10 in the magneto-resistance effect element 105 corresponds to the contacting area with the top electrode 20 as apparent from FIG. 29, the width of the smallest area can be considered as a track width Tw. Then, since the smallest area of the magneto-resistance effect films 10 in MR height direction also corresponds to the contacting area with the top electrode 20 as apparent from FIG. 30, the width of the smallest are can be considered as a height length D. In this case, the effective area A of the spin valve film can be calculated on the equation of A=Tw×D.

In the magneto-resistance effect element 105 according to the embodiments of this invention, the resistance R between the electrodes can be reduced to 100$\Omega$ or below, which corresponds to the resistance between the electrode pads in the reproducing head attached to the forefront of a head gimbal assembly (HGA, that is magnetic head assembly), for example.

In the magneto-resistance effect element 105 according to the embodiments of this invention, it is desired that the magneto-resistance effect element is structured in fcc (111) orientation when the pinned layer 14 or the free layer 18 has the fcc-structure. It is also desired that the magneto-resistance effect element is structured in bcc (100) orientation when the pinned layer 14 or the free layer 18 has the bcc-structure. It is also desired that the magneto-resistance effect element is structured in hcp (001) orientation when the pinned layer 14 or the free layer 18 has the hcp-structure.

The crystalline orientation of the magneto-resistance effect element 105 according to the embodiments of this invention, is preferably 4.0 degrees or below, more preferably 3.5 degrees or below and particularly 3.0 degree or below in view of the dispersion of orientation. The crystalline orientation can be measured from the FWHM of X-ray rocking curve obtained from the θ-2θ measurement in X-ray diffraction. The crystalline orientation can be also measured by the spot scattering angle originated from the nano-diffraction spots of the element cross section.

Depending on the kind of material of the antiferromagnetic film, since the lattice spacing of the antiferromagnetic film is different from the lattice spacing of the pinned layer 14/spacer layer 16/free layer 18, the dispersion in crystalline orientation can be obtained between the antiferromagnetic film and the pinned layer 14/spacer layer 16/free layer 18. For example, the lattice spacing of the PtMn antiferromagnetic layer is often different from the lattice spacing of the pinned layer 14/spacer layer 16/free layer 18. In this point of view, since the PtMn layer is formed thicker, the PtMn layer is suitable for the measurement in dispersion of the crystal orientation. With the pinned layer 14/spacer layer 16/free layer 18, the pinned layer 14 and the free layer 18 may have the respective different crystal structures of bcc-structure and fcc-structure. In this case, the dispersion angle in crystal orientation of the pinned layer 14 may be different from the dispersion angle in crystal orientation of the free layer 18.

FIGS. 27 and 28 are schematic cross sectional views illustrating application embodiments of the magneto-resistance effect element 105 according to the embodiments of this invention.

Figure 29:
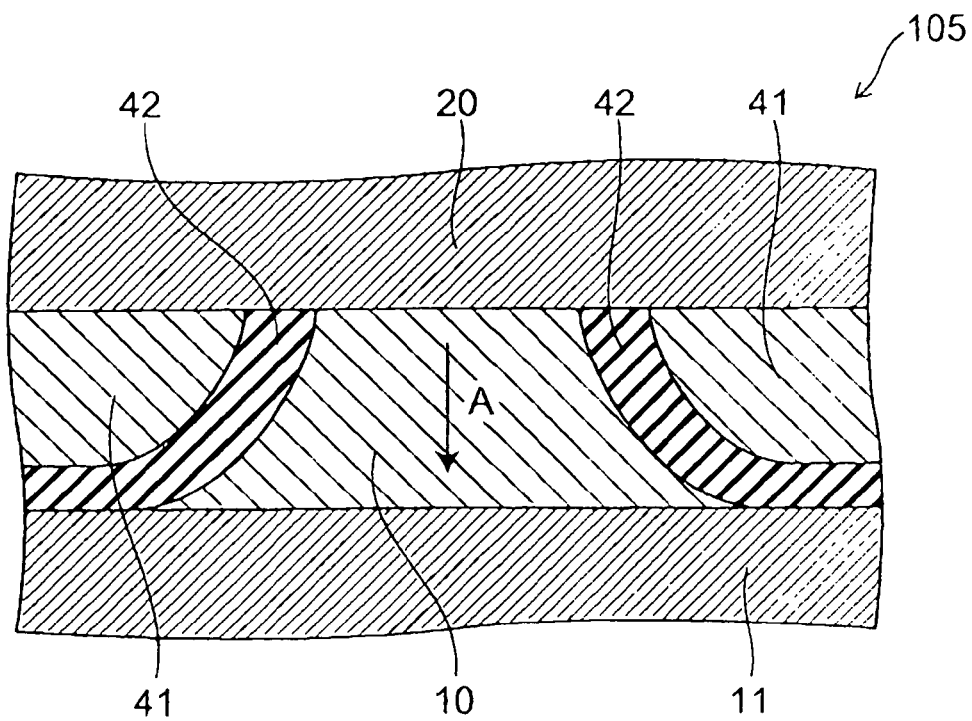
FIG. 29 is a schematic cross sectional view illustrating an application embodiment of the magneto-resistance effect element according to the embodiment of this invention.
Figure 30:
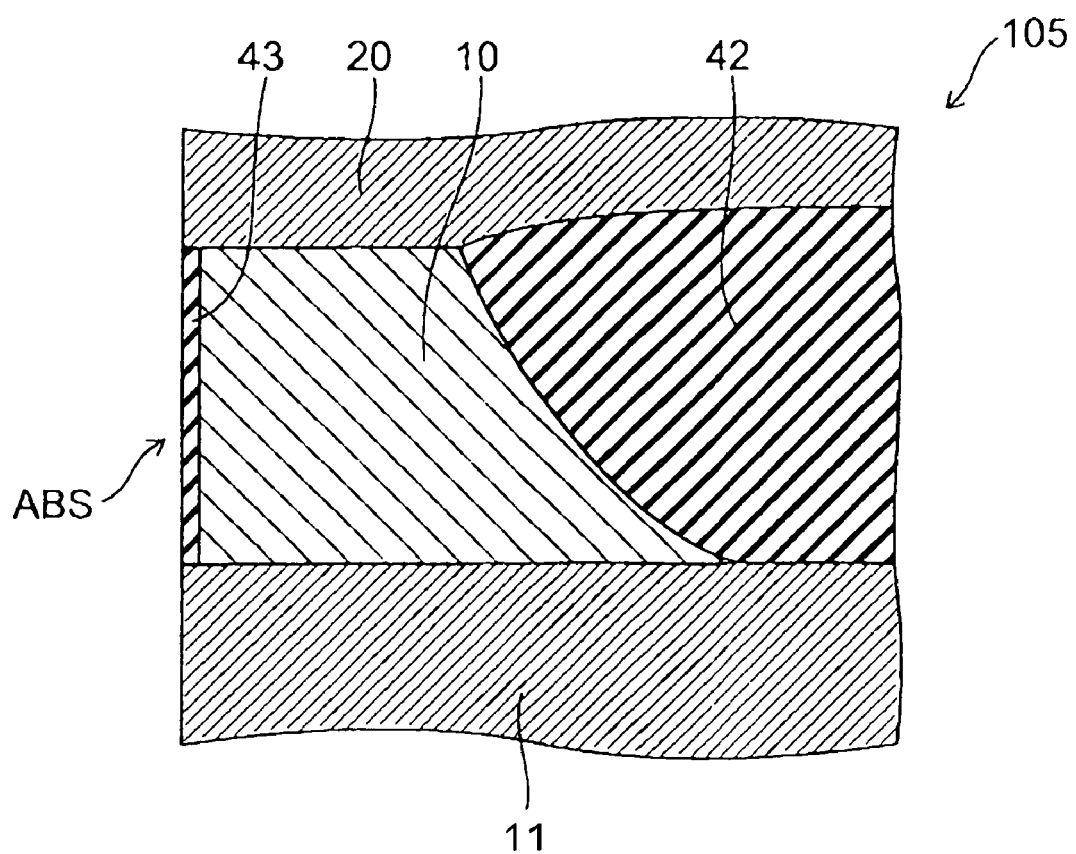
FIG. 30 is a schematic cross sectional view illustrating an application embodiment of the magneto-resistance effect element according to the embodiments of this invention.

More specifically, these figures illustrate the state where the magneto-resistance effect element 105 by using this embodiment is incorporated in a magnetic head. FIG. 29 is a cross sectional view showing the magneto-resistance effect element 105, taken on the surface almost parallel to the ABS (air bearing surface) opposite to a (not shown) magnetic recording medium. FIG. 30 is a cross sectional view showing the magneto-resistance effect element 105, taken on the surface perpendicular to the ABS.

The magnetic head shown in FIGS. 27 and 28 has a so-called hard abutted structure. The magneto-resistance effect element 105 is the CCP-CPP element as described above manufacture by any one of methods for manufacturing according to embodiments of this invention.

As shown in FIGS. 27 and 28, the bottom electrode 11 and the top electrode 20 are provided on the top surface and the bottom surface of the magneto-resistance effect film 10, respectively. The biasing magnetic applying films 41 and the insulating films 42 are formed at the both sides of the magneto-resistance effect film 10. As shown in FIG. 30, the protective layer 43 is formed on the ABS of the magneto-resistance effect film 10.

The sense current is flowed along the arrow A through the magneto-resistance effect film 10 between the bottom electrode 11 and the top electrode 20, that is, in the direction perpendicular to the film surface of the magneto-resistance effect film 10. Moreover, a given biasing magnetic field is applied to the magneto-resistance effect film 10 from the biasing magnetic field applying films 41 so as to render the domain structure of the free layer 18 of the film 10 a single domain structure through the control of the magnetic anisotropy of the free layer 18 and stabilize the magnetic domain structure of the free layer 18. In this case, the Barkhausen noise due to the shift of magnetic wall in the magneto-resistance effect film 10 can be prevented. Since the S/N ratio of the magneto-resistance effect film 10 is enhanced, the magnetic head including the magneto-resistance effect film 10 can realize the high sensitive magnetic reproduction.

Fifth Embodiment

Figure 31:
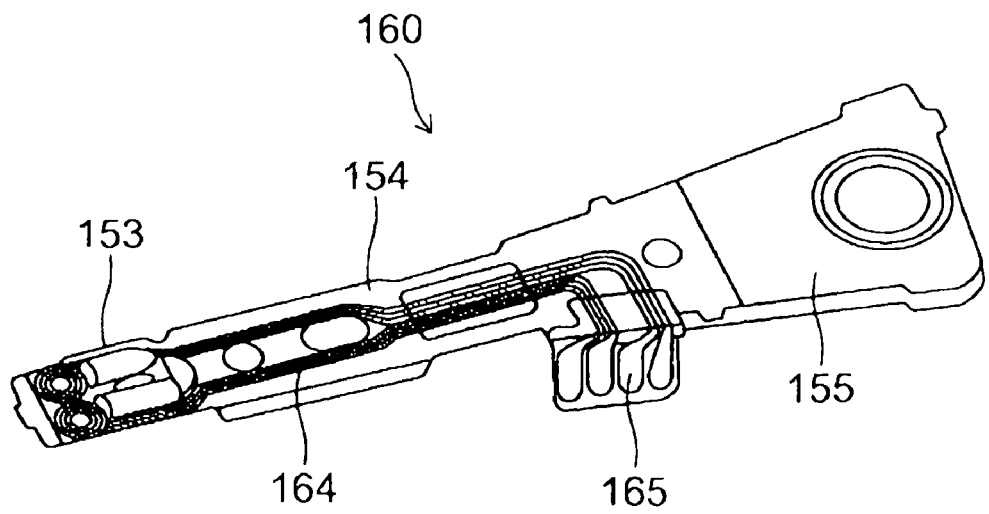
FIG. 31 is a schematic perspective view illustrating a configuration of magnetic head assembly according to the fifth embodiment of this invention.

FIG. 31 is a schematic perspective view illustrating a configuration of magnetic head assembly according to the fifth embodiment of this invention.

As shown in FIG. 31, a magnetic head assembly (head gimbal assembly) 160 according to a fifth embodiment of this invention includes a suspension 154 in which the magneto-resistance effect element according to the embodiments of this invention is mounted at one end thereof and an actuator arm 155 connected to the other end of the suspension 154. Here, the magneto-resistance effect element is at least any one of the above-described magneto-resistance effect elements 101, 101a, 102a, 103a, 104, and 105.

That is, the head gimbal assembly 160 has the actuator arm 155, and the suspension 154 is connected to one end of the actuator arm 155. To the forefront of the suspension 154, a head slider having a magnetic head including the magneto-resistance effect element according to the embodiment of this invention is attached.

The suspension 154 has lead wires 164 for writing and reading of a signal, and the lead wire 164 and each of electrodes of the magnetic head incorporated into the head slider 153 are electrically connected. In the head gimbal assembly 160, an electrode pad 165 is provided.

The magnetic resistance head assembly according to this embodiment has a magnetic head including a magneto-resistance effect element manufactured by any one of the methods for manufacturing a magneto-resistance effect element according to the first to third embodiments, and therefore, the magnetic head assembly having high MR variation ratio can be provided.

Sixth Embodiment

Figure 32:
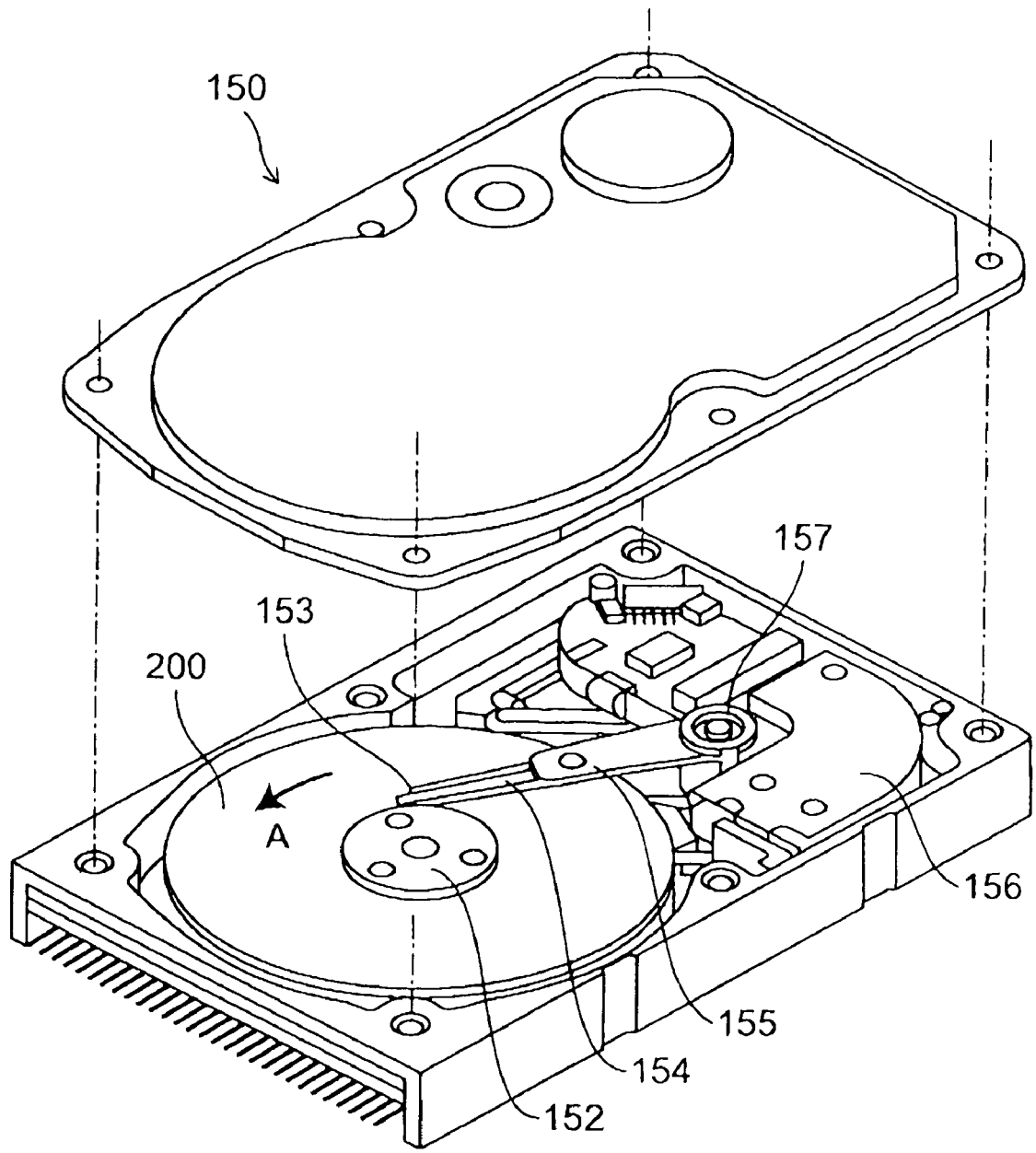
FIG. 32 is a schematic perspective view illustrating a configuration of a magnetic recording and reproducing apparatus of a sixth embodiment of this invention.

FIG. 32 is a schematic perspective view Illustrating a configuration of a magnetic recording and reproducing apparatus of a sixth embodiment of this invention.

As shown in FIG. 32, a magnetic recording and reproducing apparatus 150 according to the sixth embodiment of this invention is an apparatus having a type of using a rotary actuator. In this figure, a magnetic disk 200 is loaded in a spindle motor 152, and rotates to the direction of the arrow A by a motor, which is not shown, responding to a control signal from a drive apparatus control part, which is not shown. The magnetic recording and reproducing apparatus 150 according to this embodiment may have a plurality of magnetic disks 200.

The magnetic recording and reproducing apparatus 150 includes the above-described magnetic head assembly 160 according to this invention.

That is, the head slider 153 housed in the magnetic disc 200 and performing recording and reproducing of information is attached to the forefront of the thin-filmy suspension 154.

The suspension 154 is connected to one edge of the actuator arm 155. A voice coil motor 156 being a kind of a linear motor is provided at the other edge of the actuator arm 155. The voice coil motor 156 is composed of the driving coil (not shown) wound around the bobbin portion and a magnetic circuit with a permanent magnet and a counter yoke which are disposed opposite to one another so as to sandwich the driving coil.

When the magnetic recording disk 200 is rotated, the air bearing (ABS) of the head slider 153 is held above the main surface of the magnetic recording disk 200 with a given floating distance. Alternatively, the head slider 153 may constitute a so-called "contact running type" slider such that the slider is in contact with the magnetic recording disk 200.

The actuator arm 155 is supported by ball bearings (not shown) provided at the upper portion and the bottom portion of the spindle 157 so as to be rotated and slid freely by the voice coil motor 156.

In the magnetic recording and reproducing apparatus 150 according to this embodiment, the head gimbal assembly 160 having a magnetic head including the above-described magneto-resistance effect element manufactured by at least any one of the first to third embodiments of this invention is used, and therefore, by the high MR variation ratio, information magnetically recorded in the magnetic disk 200 with high recording density can be certainly read.

Seventh Embodiment

Next, as a magnetic recording and reproducing apparatus according to a seventh embodiment of this invention, an example of magnetic memory in which the magneto-resistance effect element according to the embodiment of this invention is mounted will be described. That is, by using the magneto-resistance effect element according to the embodiment of this invention, a magnetic memory such as magnetic random access memory (MRAM) which a memory cell is arranged in a matrix form can be realized. Hereinafter, the case in which the magneto-resistance effect element 101 explained in the first embodiment is used as the magneto-resistance effect element will be described, but at least any one of the above-described magneto-resistance effect elements 101, 101a, 102a, 103a, 104, and 105 explained as the embodiments and examples of this invention can be used.

Figure 33:
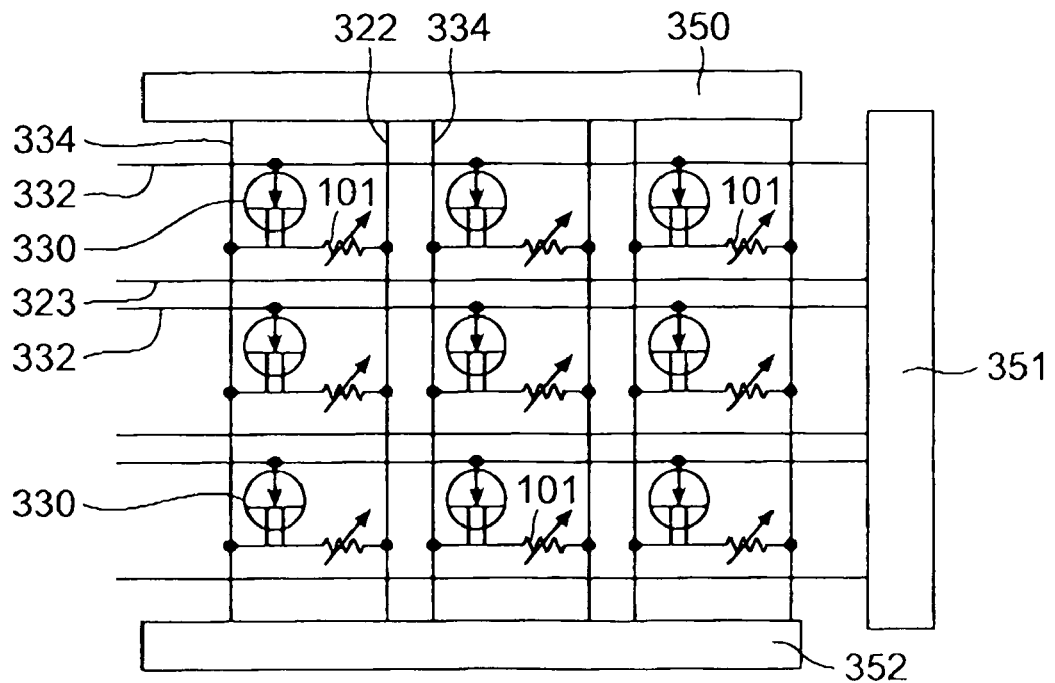
FIG. 33 is a schematic view illustrating a configuration of a magnetic recording and reproducing apparatus according to a seventh embodiment of this invention.

FIG. 33 is a schematic view illustrating a configuration of a magnetic recording and reproducing apparatus according to a seventh embodiment of this invention.

This drawing shows a circuit configuration when the memory cells are arranged in an array.

As shown in FIG. 33, in the magneto-resistance effect element according to the embodiment of this invention, in order to select one bit in the array, a column decoder 350 and a line decoder 351 are provided, where a switching transistor 330 is turned ON by a bit line 334 and a word line 332 and to be selected uniquely, so that the bit information recorded in a magnetic recording layer (free layer) in the magneto-resistance effect film 10 can be readout by being detected by a sense amplifier 352.

In order to write the bit information, a writing current is flowed in a specific write word line 323 and a bit line 322 to generate a magnetic field for writing.

Figure 34:
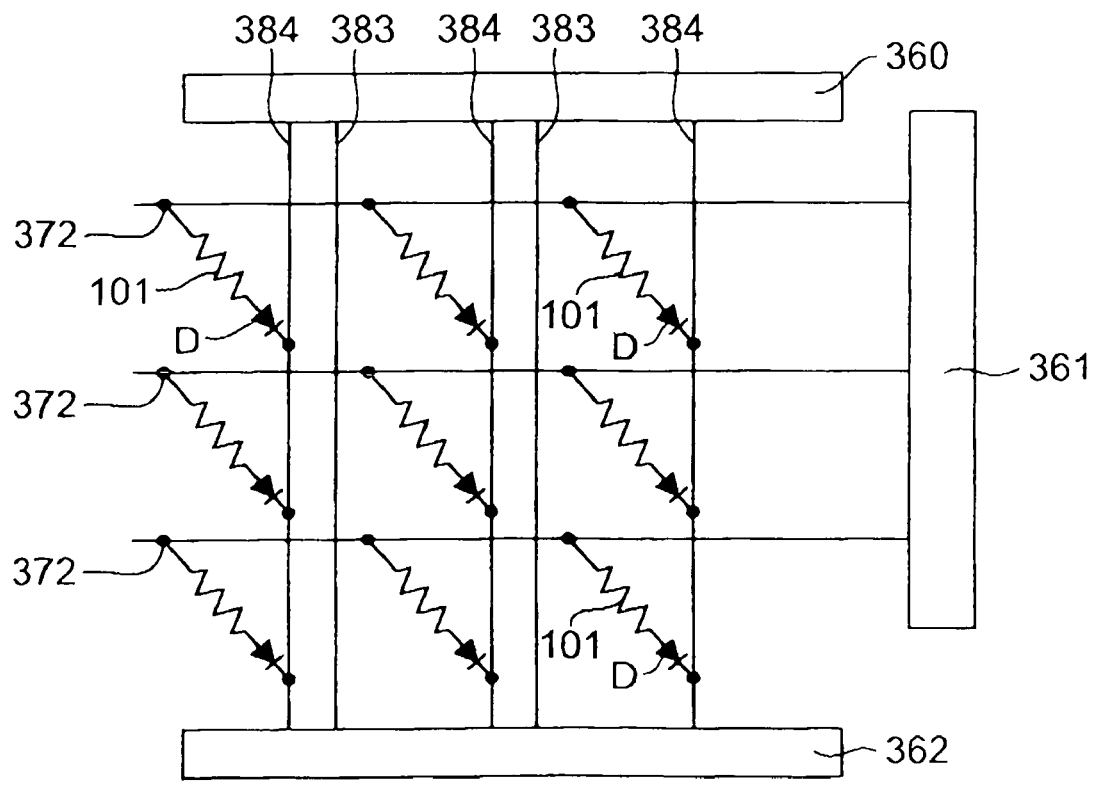
FIG. 34 is a schematic view illustrating a configuration of another magnetic recording and reproducing apparatus according to a seventh embodiment of this invention.

FIG. 34 is a schematic view illustrating a configuration of another magnetic recording and reproducing apparatus according to a seventh embodiment of this invention.

As shown in FIG. 34, in this case, a bit line 372 and a word line 384 which are arranged in matrix are selected by decoders 360, 361 and 362 respectively, so that a specific memory cell in the array is selected. Each memory cell is configured such that the magneto-resistance effect element 101 and a diode D are connected in series. Here, the diode D plays a role of preventing a sense current from detouring in the memory cell other than the selected magneto-resistance effect element 101. A writing is performed by a magnetic field generated by flowing the writing current in the specific bit line 372 and the word line 383, respectively.

Figure 35:
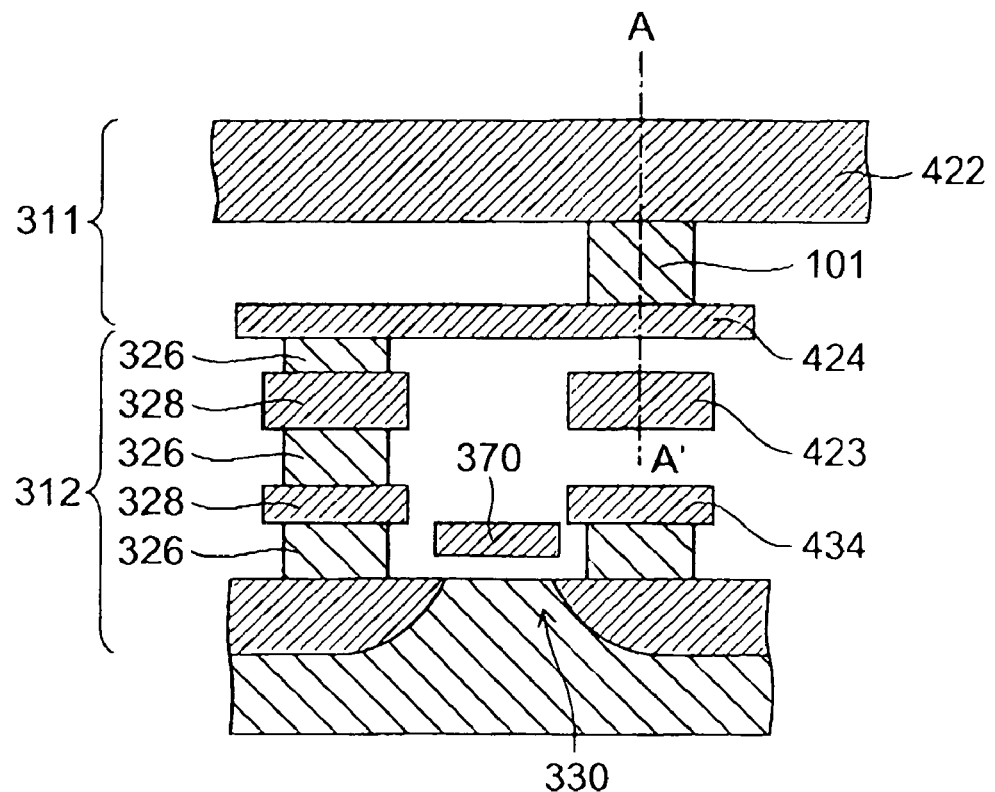
FIG. 35 is a schematic view illustrating a configuration of another magnetic recording and reproducing apparatus according to a seventh embodiment of this invention.

FIG. 35 is a schematic view illustrating a configuration of another magnetic recording and reproducing apparatus according to a seventh embodiment of this Invention.

Figure 36:
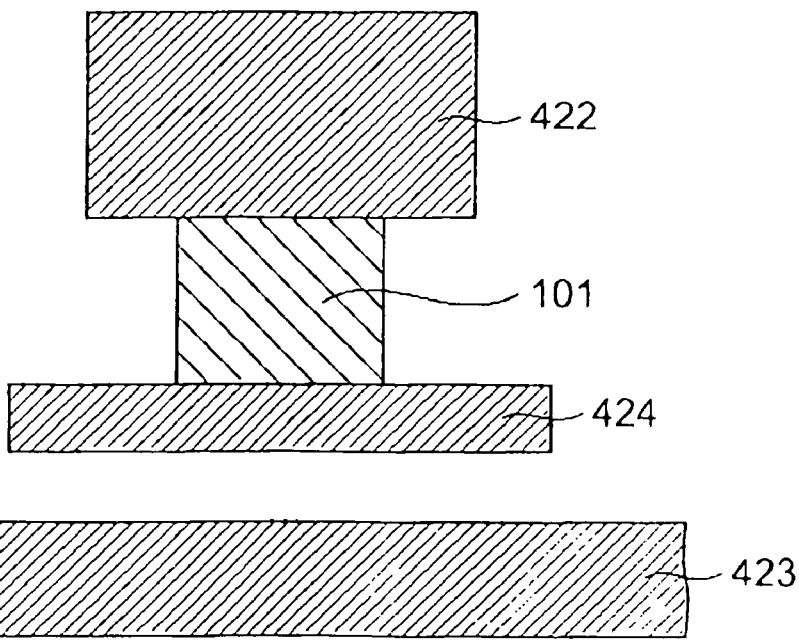
FIG. 36 is a schematic cross-sectional view taken on A-A' line shown in FIG. 35.

FIG. 36 is a schematic cross-sectional view taken on A-A' line shown in FIG. 35.

These figures illustrate a configuration of a 1-bit memory cell included in the magnetic recording and reproducing apparatus (the magnetic memory) shown in FIG. 33. This memory cell includes a memory element part 311 and an address selection transistor part 312.

The memory element part 311 includes the magneto-resistance effect element 101 and a pair of wirings 422, 424 connected to the magneto-resistance effect element 101. The magneto-resistance effect element 101 is the magneto-resistance effect element (CCP-CPP element) as described in the above embodiments.

Meanwhile, in the address selection transistor part 312, a switching transistor 330 having connection therewith via a via 326 and an embedded wiring 328 is provided. The switching transistor 330 performs switching operations in accordance with voltages applied to a gate 370 to control the opening/closing of the current path between the magneto-resistance effect element 101 and the wiring 434.

Further, below the magneto-resistance effect element 101, a wire 423 for writing is provided in the direction that is about perpendicular to the wire 422. These wires 422 and 423 can be formed by aluminum (Al), copper (Cu), tungsten (W), tantalum (Ta) or an alloy including any one thereof.

The above-described wire 422 corresponds to the bit line and the wire 423 corresponds to the word line 323.

In the memory cell having such a configuration, when writing bit information into the magneto-resistance effect element 101, a writing pulse current is flowed in the wirings 422 and 423, and a synthetic magnetic field induced by the writing current is applied to appropriately invert the magnetization of a recording layer of the magneto-resistance effect element 101.

Further, when reading out the bit information, a sense current is flowed through the wiring 422, the magneto-resistance effect element 101 including the magnetic recording layer and the wiring 424 to measure a resistance value of or a fluctuation in the resistance values of the magneto-resistance effect element 101.

The magnetic memory according to the embodiment of this invention can assure writing and reading by surely controlling the magnetic domain of the recording layer even though the cell is miniaturized in size, with the use of the magneto-resistance effect element (CCP-CPP element) with the above-described embodiment.

This invention is not limited to the above disclosure and every kind of variation and modification may be made without departing from the scope of the present invention. The concrete structure of the magneto-resistance effect element, and the shape and material of the electrodes, the magnetic field biasing films and the insulating layer can be appropriately selected among the ones well known by the person skilled in the art. In these cases, the intended magneto-resistance effect element by using the present invention can be obtained so as to exhibit the same effect/function as described above. When the magneto-resistance effect element is applied for a reproducing magnetic head, the detecting resolution of the magnetic head can be defined by applying magnetic shielding for the upper side and the lower side of the magneto-resistance effect element.

Moreover, the magneto-resistance effect element can be applied for both of a longitudinal magnetic recording type magnetic head and a vertical magnetic recording type magnetic recording type magnetic head. Also, the magneto-resistance effect element can be applied for both of a longitudinal magnetic recording/reproducing device and a vertical magnetic recording/reproducing device. The magnetic recording/reproducing device may be a so-called stationary type magnetic device where a specific recording medium is installed therein or a so-called removable type magnetic device where a recording medium can be replaced.

As described above, the embodiments of the invention have been described with reference to specific examples. However, the invention is not limited to these specific examples. For example, the specific configuration of each of components constituting the method for manufacturing a magneto-resistance effect element and the magnetic recording and reproducing apparatus are included in the scope of the invention, as long as the invention can be carried out in the same manner and the same effect can be obtained by appropriately selecting the components from the known range by those skilled in the art.

Moreover, combination of two or more components of each of the specific examples in the technically possible range is included in the scope of the invention as long as including the spirit of the invention.

In addition, all of the method for manufacturing a magneto-resistance effect element and the magnetic recording and reproducing apparatus that can be appropriately design-modified and carried out by those skilled in the art on the basis of the method for manufacturing a magneto-resistance effect element and the magnetic recording and reproducing apparatus described above as the embodiments of the invention belong to the invention as long as including the spirit of the invention.

In addition, it is understood that those skilled in the art can achieve various variations and modifications and modifications and that the variations and the modifications belong to the scope of the invention.

The invention claimed is:

1. A method for manufacturing a magneto-resistance effect element having a first magnetic layer including a ferromagnetic material, a second magnetic layer including a ferromagnetic material and a spacer layer provided between the first magnetic layer and the second magnetic layer, the spacer layer having an insulating layer and a conductive portion penetrating through the insulating layer, the method comprising:
    forming a film to be a base material of the spacer layer;
    performing a first treatment using a gas including at least one of oxygen molecules, oxygen atoms, oxygen ions, oxygen plasma and oxygen radicals on the film; and
    performing a second treatment using a gas including at least one of hydrogen molecules, hydrogen atoms, hydrogen ions, hydrogen plasma, hydrogen radicals, deuterium molecules, deuterium atoms, deuterium ions, deuterium plasma and deuterium radicals on the film submitted to the first treatment.

2. The method according to claim 1, wherein the second treatment includes a treatment of at least one of exposing the film with at least one of hydrogen gas and deuterium gas and introducing at least one of hydrogen gas and deuterium gas in an atmosphere achieved by ionizing or forming plasma of a gas including at least one selected from the group consisting of argon, xenon, helium, neon and krypton.

3. The method according to claim 1, wherein the second treatment includes a treatment of irradiating the film submitted to the first treatment with at least one of hydrogen gas and deuterium gas ionized or formed into plasma.

4. A method for manufacturing a magneto-resistance effect device having a first magnetic layer including a ferromagnetic material, a second magnetic layer including a ferromagnetic material and a spacer layer provided between the first magnetic layer and the second magnetic layer, the spacer layer having an insulating layer and a conductive portion penetrating through the insulating layer, the method comprising:
    forming a film to be a base material of the spacer layer;
    performing a first treatment using a gas including at least one of oxygen molecules, oxygen atoms, oxygen ions, oxygen plasma and oxygen radicals to the film; and
    performing a second treatment using a gas including at least one of ammonia molecules, ammonia ions, ammonia plasma and ammonia radicals to the film submitted to the first treatment.

5. The method according to claim 4, wherein the second treatment includes a treatment of introducing ammonia gas in an atmosphere achieved by ionizing or forming plasma of a gas including at least one selected from the group consisting of argon, xenon, helium, neon and krypton.

6. The method according to claim 4, wherein the second treatment includes a treatment of irradiating the film submitted to the first treatment with ammonia gas ionized or formed into plasma.

7. The method according to claim 1, wherein the second treatment is performed while heating the film submitted to the first treatment.

8. The method according to claim 1, further comprising:
    performing a third treatment including at least one of irradiating the film submitted to the second treatment with rare gas ions, irradiating the film submitted to the second treatment with rare gas plasma and heating the film submitted to the second treatment.

9. The method according to claim 8, wherein a combination of the performing the second treatment and the performing the third treatment is repeated plural times.

10. The method according to claim 8, wherein a combination of the forming the film, the performing the first treatment, the performing the second treatment and the performing the third treatment is repeated plural times.

11. The method according to claim 8, further comprising:
    performing a fourth treatment using a gas including at least one of oxygen molecules, oxygen atoms, oxygen ions, oxygen plasma and oxygen radicals to the film submitted to the third treatment.

12. The method according to claim 1, wherein a combination of the forming the film, the performing the first treatment and the performing the second treatment is repeated plural times.

13. The method according to claim 1, wherein a combination of the forming the film and the performing the first treatment is repeated plural times.

14. The method according to claim 1, wherein the forming the film includes forming a first metallic film and a second metallic film, and the performing the first treatment includes exposing the second metallic film to oxidizing gas.

15. The method according to claim 1, wherein the forming the film includes forming a first metallic film and a second metallic film, and the performing the first treatment includes providing oxygen gas to the second metallic film, the oxygen gas being introduced in an atmosphere achieved by ionizing or forming plasma of a gas including at least one selected from the group consisting of argon, xenon, helium, neon and krypton.

16. The method according to claim 1, wherein
    the forming the film includes forming a first metallic film and a second metallic film, and
    the performing first treatment includes:
    performing a pretreatment of irradiating the second metallic film with a gas ionized or formed into plasma, the gas including at least one selected from the group consisting of argon, xenon, helium, neon and krypton; and providing the oxygen gas to the second metallic film submitted to the pretreatment, the oxygen gas being introduced in an atmosphere achieved by ionizing or forming plasma of a gas including at least one selected from the group consisting of argon, xenon, helium, neon and krypton.

17. The method according to claim 16, wherein the first metallic film includes at least one selected from the group consisting of Cu, Au, Ag and Al, and the second metallic film includes at least one selected from the group consisting Al, Si, Mg, Ti, Hf, Zr, Cr, Mo, Nb and W.

18. The method according to claim 8, wherein a high frequency bias configured to generate the rare gas ions or the rare gas plasma in the third treatment has a power from 5 W to 120 W inclusive.

19. The method according to claim 8, wherein an irradiation time of the rare gas ions or the rare gas plasma in the third treatment is from 5 seconds to 5 minutes inclusive.

20. A method of manufacturing a magneto-resistance effect element for a magnetic recording and reproducing apparatus comprising:

a magnetic head assembly including a suspension, the magneto-resistance effect element being mounted on one end of the suspension, and an actuator arm connected to other end of the suspension; and a magnetic recording medium, information being recorded in the magnetic recording medium by using the magneto-resistance effect element, the magneto-resistance effect element having a first magnetic layer including a ferromagnetic material, a second magnetic layer including a ferromagnetic material and a spacer layer provided between the first magnetic layer and the second magnetic layer, the spacer layer having an insulating layer and a conductive portion penetrating through the insulating layer, the method of manufacturing the magneto-resistance effect element including:

forming a film to be a base material of the spacer layer;

performing a first treatment using a gas including at least one of oxygen molecules, oxygen atoms, oxygen ions, oxygen plasma and oxygen radicals on the film; and performing a second treatment using a gas including at least one of hydrogen molecules, hydrogen atoms, hydrogen ions, hydrogen plasma, hydrogen radicals, deuterium molecules, deuterium atoms, deuterium ions, deuterium plasma and deuterium radicals on the film submitted to the first treatment.

* * * * *